United States Patent [19]

Inoue et al.

[11] Patent Number: 5,270,736

[45] Date of Patent: Dec. 14, 1993

[54] LIGHT MODULATION METHOD

[75] Inventors: Hitoshi Inoue, Inagi; Tasuya Yamazaki, Zushi, both of Japan

[73] Assignee: Canon Kabushiki Kaisha, Tokyo, Japan

[21] Appl. No.: 584,263

[22] Filed: Sep. 18, 1990

[30] Foreign Application Priority Data

| Sep. 19, 1989 | [JP] | Japan | 1-243771 |
| Jul. 9, 1990 | [JP] | Japan | 2-182255 |
| Jul. 19, 1990 | [JP] | Japan | 2-192272 |
| Jul. 25, 1990 | [JP] | Japan | 2-198862 |
| Jul. 27, 1990 | [JP] | Japan | 2-199741 |
| Jul. 27, 1990 | [JP] | Japan | 2-199742 |
| Jul. 27, 1990 | [JP] | Japan | 2-199743 |
| Jul. 27, 1990 | [JP] | Japan | 2-199744 |

[51] Int. Cl.$^5$ ............................................. H04N 1/21
[52] U.S. Cl. ............................................. 346/108
[58] Field of Search ............ 346/1.1, 108, 76 L, 346/160; 358/296, 300

[56] References Cited

U.S. PATENT DOCUMENTS

| 4,068,197 | 1/1978 | Yamazaki | 331/94.5 S |
| 4,114,018 | 9/1978 | Von Allmen et al. | 219/121 LM |
| 4,232,678 | 11/1980 | Skovajsa | |
| 4,237,427 | 12/1980 | Holland | 331/94.5 |
| 4,412,331 | 10/1983 | Chapman | 372/29 |
| 4,583,128 | 4/1986 | Anderson, Jr. et al. | 358/302 |
| 4,625,315 | 11/1986 | Lemberger et al. | 372/38 |
| 4,728,989 | 3/1988 | Ohmori | 346/76 L |
| 4,814,791 | 3/1989 | Ohara et al. | 346/108 |
| 4,967,284 | 10/1990 | Yoshida et al. | 358/300 |

FOREIGN PATENT DOCUMENTS

| 225693 | 6/1987 | European Pat. Off. . |
| 258060 | 3/1988 | European Pat. Off. . |
| 282908 | 11/1978 | Fed. Rep. of Germany . |
| WO87/07018 | 11/1987 | World Int. Prop. O. . |

OTHER PUBLICATIONS

C. Sauteret, et al., "Passive pulse shaping by spectral narrowing of picosecond pulses", Applied Optics, vol. 20, No. 8, Apr. 15, 1981, pp. 1487∝1490.

Primary Examiner—Mark J. Reinhart
Attorney, Agent, or Firm—Fitzpatrick, Cella, Harper & Scinto

[57] ABSTRACT

In a modulation method of this invention, light modulation is performed as follows. A light output from a light source, e.g., a semiconductor laser is increased with a lapse of time, and the light source is driven until a light strength corresponding to a desired exposure amount is obtained, so that a non-rectangular light output waveform such as a sawtooth or triangular wave is consequently obtained. A system of this invention is a system such as a high-precision image recording apparatus using this modulation method.

18 Claims, 39 Drawing Sheets

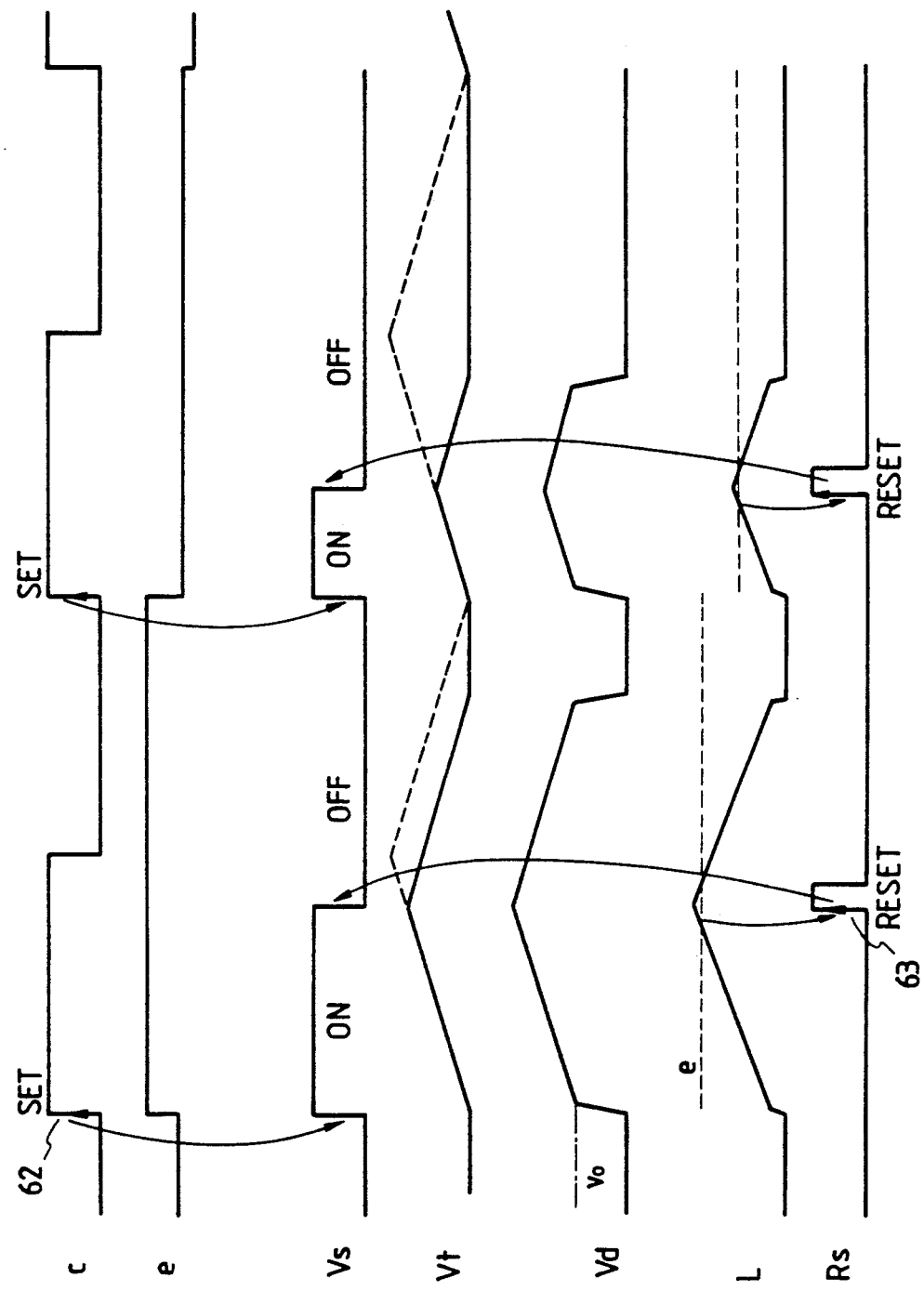

MAIN SCANNING DIRECTION

CHARACTERISTICS OF LIGHT OUTPUT / FORWARD CURRENT

LIGHT MODULATION METHOD

BACKGROUND OF THE INVENTION

1. Field of the Invention

The present invention relates to a method and apparatus for modulating and driving a semiconductor laser, or the like, and a system, e.g., a recording apparatus, using the same.

2. Related Background Art

As a means for generating a light beam, a semiconductor laser is widely used in various systems since it is inexpensive and compact, and has a feature of directly performing strength modulation by a driving current.

As a drawback, however, the semiconductor laser has negative temperature characteristics exhibiting considerable driving current-light output characteristics. FIG. 42 shows the driving current-light output characteristics of the semiconductor laser (quoted from HL8312G Data Book, HITACHI). In FIG. 42, a driving current [mA] of the semiconductor laser is plotted along the abscissa, and a light output [mW] is plotted along the ordinate. Measurements were performed at case temperatures of 0° C., 25° C., and 50° C. As can be read from the graph, negative temperature characteristics of about −0.1 mW/° C. are observed. This implies that a light output largely varies depending on a variation in external temperature. Furthermore, a temperature of a semiconductor laser chip is increased due to an emission loss itself as an emission time elapses, and hence, a decrease in light output also occurs.

A laser beam printer is known as a commercially available system using a light source such as a semiconductor laser. For example, in the medical field, a laser printer for recording a medical image obtained by MR, CT, DSA, or the like onto a photosensitive recording medium such as a silver chloride film is widely used. A laser beam which is strength-modulated in proportion to a picture element density is deflected by a light deflector to attain main scanning, and a recording medium is moved in a direction perpendicular to the main scanning direction to attain sub-scanning, thereby recording a multi-gradation halftone image on the recording medium.

Since a laser printer normally performs recording at a main scanning speed of 1 to 2 msec and a rate of several seconds per page, an external temperature is left unchanged during at least one main scanning period, and a change in light output due to a change in temperature during this period is caused by a temperature rise due to an emission loss of the semiconductor laser itself.

As a means for compensating for a light output variation caused by the change in temperature, a circuit for continuously monitoring whether or not an emission level of the semiconductor laser coincides with a predetermined level (which is constant for a unit radiation time), and feeding the monitored level to a driving current, i.e., a so-called APC (Auto Power Control) circuit is generally used. This circuit is disclosed in detail in, e.g., U.S. Pat. Nos. 4,237,427, 4,412,331, 4,583,128, 4,625,315, and the like.

FIG. 43 is a block diagram of a basic APC circuit. In FIG. 43, a setup current 901 to be proportional to an emission amount is input to the APC circuit. The APC circuit includes a voltage adder 902, a voltage-to-current (V/I) converter 904 for converting a semiconductor laser driving voltage $V_d$ 903 to an actual driving current $I_d$ 905, a semiconductor laser 906, a PIN photodiode 907 for monitoring a laser emission amount, and a current-to-voltage (I/V) converter 909 for converting a monitor current $I_m$ 908 into a monitor voltage $V_m$ 910. In order to monitor a light output of the semiconductor laser 906 by the PIN photodiode 907, the PIN photodiode 907 monitors a back emission amount of the semiconductor laser at a trailing edge portion of the laser chip, or monitors light split by a beam splitter arranged in front of the laser chip, although not shown. FIG. 43 shows a typical single-loop feedback control system. Since a difference between the setup voltage $V_s$ 901 and the monitor voltage $V_m$ corresponds to the driving voltage $V_d$ 903, the light output is always controlled to be proportional to the setup voltage $V_s$ so as not to be varied due to a change in temperature.

In the prior art, however, since the semiconductor laser is driven and oscillated using an input current having a rectangular waveform, it is very difficult to design a circuit. In order to increase an extinction ratio (dynamic range) of a light output, assuming that a system for performing strength modulation by changing a pulse width/numbers of one picture element with a constant light output (pulse width/numbers modulation), or a system as a combination of the pulse width/numbers modulation and a change in light output (amplitude modulation) is adopted, a recording speed (picture element clock frequency) per picture element of a laser beam printer is as fast as several MHz. For example, if pulse-width modulation having 8-bit (256) gradation is performed, a minimum pulse width becomes very small, i.e., several nsec. When strength control of the semiconductor laser for generating such a very small pulse width is to be performed by the APC circuit with high precision, a control speed must be much increased to several tens of GHz. It is very difficult to perform such high-speed control, and a very expensive circuit is required to realize the high-speed control.

When a normal APC circuit having a stable control speed is used, the driving speed of the semiconductor laser driving circuit as a whole must be decreased, and high-speed pulse width/numbers modulation cannot be performed.

For these reasons, when a semiconductor laser is modulated to draw a halftone image, it is difficult to obtain a good multi-gradation image, e.g., a good halftone image having 256 gradation levels or more, and if possible, an increase in cost occurs.

SUMMARY OF THE INVENTION

It is an object of the present invention to provide a modulation method and apparatus for a semiconductor laser, or the like, with which an exposure amount free from a change in temperature can be obtained, and a system using the same.

It is another object of the present invention to achieve the above object without using an APC circuit.

It is still another object of the present invention to provide a modulation method and apparatus for a semiconductor laser, or the like, with which a large extinction ratio can be obtained, and a system using the same.

It is still another object of the present invention to provide a low-cost and high-speed modulation method and apparatus for a semiconductor laser, or the like, and a system using the same.

It is still another object of the present invention to provide a recording apparatus which can obtain a high-precision image at low cost.

It is still another object of the present invention to provide a recording apparatus which can obtain a stable image regardless of a change in temperature.

It is still another object of the present invention to provide a recording apparatus which can obtain an image having a large extinction ratio.

It is still another object of the present invention to provide a recording apparatus which can obtain a halftone image having a large number of gradation levels.

It is still another object of the present invention to provide a recording apparatus which can obtain an image having a high resolution.

BRIEF DESCRIPTION OF THE DRAWINGS

FIG. 6 is a timing chart for explaining an operation of the circuit shown in FIG. 5;

DESCRIPTION OF THE PREFERRED EMBODIMENTS

1. Principle of Light Modulation Method of the Present Invention

The operation principle of a modulation method according to the present invention will be described below.

Figure 42:
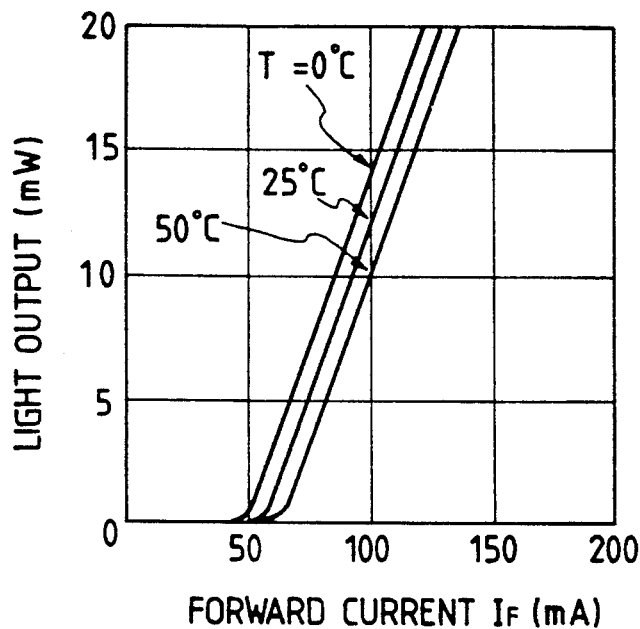
FIG. 42 is a graph showing driving current-light output characteristics of a semiconductor laser.
Figure 43:
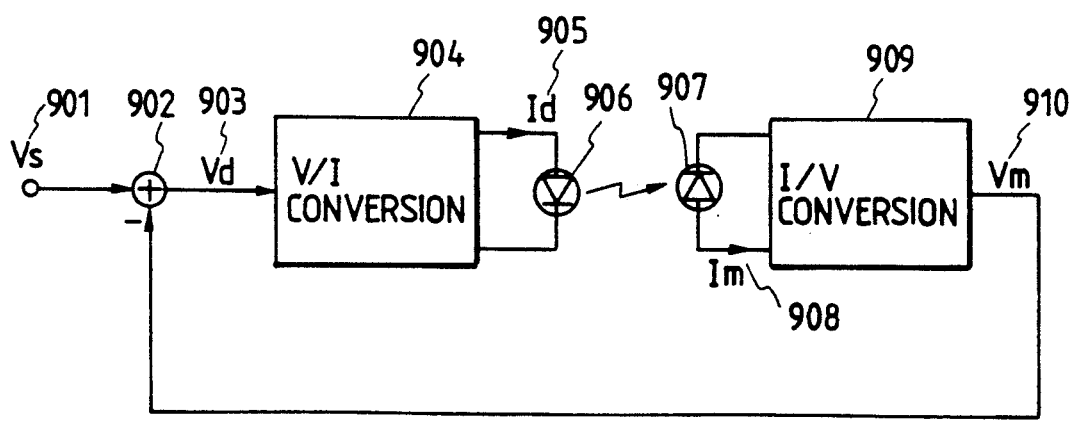
FIG. 43 is a block diagram for explaining a conventional APC circuit.

As can be understood from current-light output characteristics of a semiconductor laser shown in FIG. 42, slope efficiency $\eta$ [mW/mA] almost remains the same even if a temperature varies. More specifically, the graph is translated upon a variation in temperature. In some semiconductor lasers, the slope efficiency slightly varies. However, these semiconductor lasers can be used as long as their slope efficiency values are almost constant in a temperature environment wherein they are used.

Figure 7A:
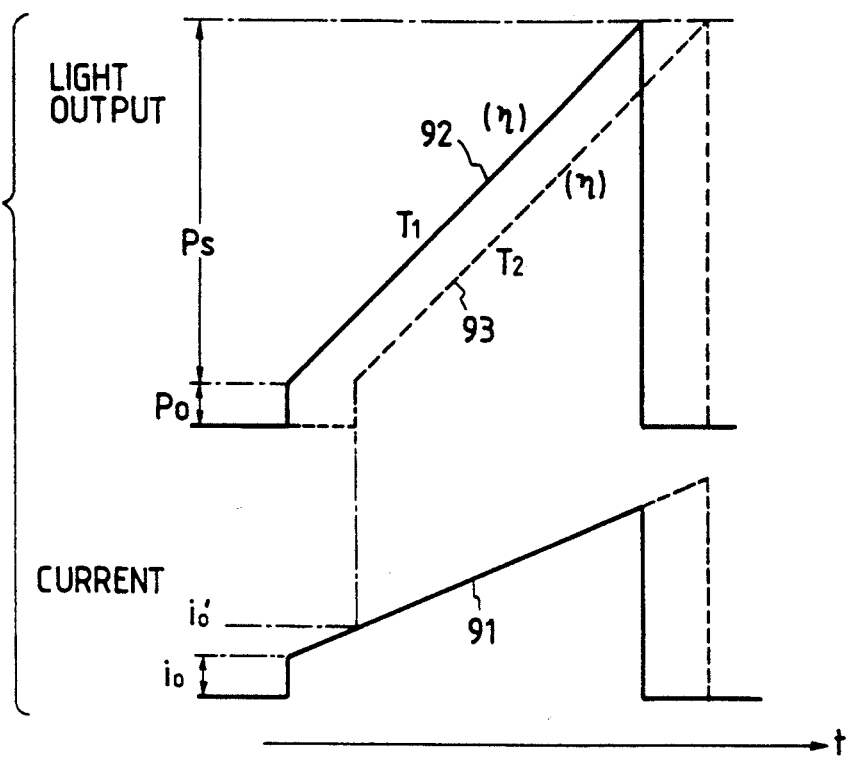
FIGS. 7A and 7B are graphs for explaining an operation principle of the embodiment of the present invention.

Assume that a minimum light output of laser oscillation of a semiconductor laser is represented by $P_0$ in FIG. 7A. It is also assumed that a light output in an LED oscillation region below $P_0$ can be ignored. If not ignored, light in an LED region with poor coherence can be eliminated by an interference filter or a polarization filter. Assume that a driving current for outputting the minimum laser oscillation light output $P_0$ at a given temperature $T_1$ is represented by $i_0$. The driving current of the semiconductor laser is linearly increased from $i_0$, and an effective value of the light output at that time is monitored by a detector. If a time is expressed as t [sec], a current i is assumed to be increased in proportion to a lapse of time as follows:

$$i = i_0 + kt \qquad (1)$$

(k is a constant)

When the light output is increased from $P_0$ by $P_s$, the driving current is cut off. In this case, the driving current need not always be completely cut off to zero, but can be decreased below at least $i_0$ to be substantially cut off. In FIG. 7A, the driving current which is linearly increased is denoted by 91, and the light output at the temperature $T_1$ is denoted by 92. An area (time integral value) of the sawtooth-wave light output 92 corresponds to an exposure amount E, and is given by:

$$E = \frac{1}{\eta k} P_s (P_0 + P_s/2) \qquad (2)$$

A case will be examined below wherein the temperature of the semiconductor laser chip is increased from $T_1$ (low temperature) up to $T_2$ (high temperature). As described above, in temperature characteristics of the semiconductor laser light output, it can be considered that the slope efficiency is not varied, and the current-light output characteristic curve is translated. In this case, the minimum laser oscillation light output $P_0$ is left unchanged, and the driving current $i_0$ for outputting $P_0$ is changed. The changed current can be approximated as a current at which the light output in the current-light output characteristics at the temperature $T_2$ is $P_0$. Assume that a driving current for outputting $P_0$ obtained when the temperature of the semiconductor laser chip reaches $T_2 (>T_1)$ is represented by $i_0' (>i_0)$. Similarly, a change in light output obtained when a current is linearly increased like in equation (1) is represented by 93 (broken line) in FIG. 7A. A laser oscillation begins from $i_0'$, and a driving current is cut off when the light output is increased by $P_s$. As shown in FIG. 7A, since the slope efficiency is left unchanged, the waveform of the sawtooth-wave light output 93 remains the same as that at the temperature $T_1$, and hence, the exposure amount E is the same as that expressed by equation (2).

A case will be examined below wherein the present invention is applied to a laser printer, and the exposure amount given by equation (2) is that for one picture element. Even when the temperature of the semiconductor laser is changed, the exposure amount is left unchanged, and an exposure position and time are slightly shifted due to a variation in temperature. More specifically, when a temperature is increased, the exposure time is delayed, and the exposure position is shifted backward. The opposite results are obtained when a temperature is decreased. When the position and time shifts due to the variation in temperature are set to fall within a range of one picture element, and are less than a resolution of human eyes, this means that a change in exposure amount due to a change in temperature can be substantially corrected.

An extinction ratio obtained when the modulation method of the present invention is used will be calculated below.

In equation (2), the setup light output $P_s$ can theoretically become zero, but cannot actually become zero due to a factor, e.g., a delay time of a control system, and a minimum value of the setup light output becomes $P_{s0} \neq 0$. If a maximum value of the setup light output is represented by $P_{s1}$, the extinction ratio is given by:

$$P_{s0}(P_0 + P_{s0}/2) : P_{s1}(P_0 + P_{s1}/2) \qquad (3)$$

For example, assuming that $P_0 = 1$ mW and the maximum light output of the semiconductor laser is 15 mW, an extinction ratio becomes 1:15 if strength modulation is simply performed. If $P_{s0} = 1$ mW and $P_{s1} = 15$ mW in relation (3), an extinction ratio obtained according to the modulation method of the present invention can be greatly increased to 1:85. More specifically, according to the modulation method of the present invention, a large extinction ratio can be obtained, and the maximum number of gradation levels of an exposure amount can be increased.

In this manner, the control system of this embodiment can be relatively simplified since pulse width control and exposure amount control can be performed by the same circuit. Since control can be attained by single ON and OFF operations, a stable control system can be easily constituted.

In order to further change the exposure amount E, $P_s$ can be changed in equation (2) to change E. Instead, an inclination k is changed while $P_s$ is constant. Alternatively, both k and $P_s$ may be changed to change E.

Figure 8:
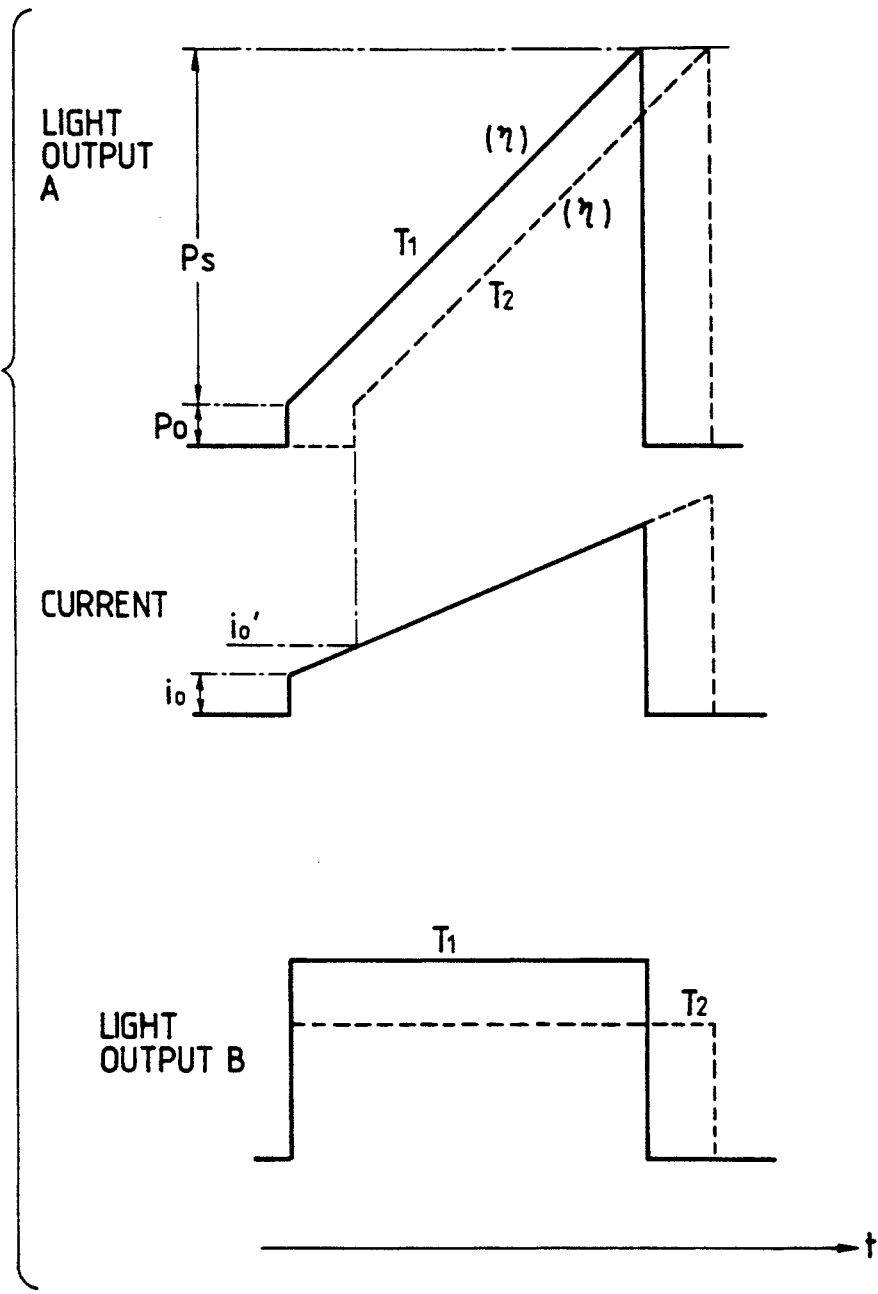
FIG. 8 is a graph for explaining an operation principle of another embodiment of the present invention.

When a multi-beam type semiconductor laser having two laser oscillation mechanisms on a single chip or in a single housing is used, one semiconductor laser is driven by a sawtooth wave, and the other semiconductor laser is pulse-width modulated with a constant current, so that temperature variation correction of an exposure amount attained by pulse-width modulation in a conventional system can be performed by constant voltage driving. FIG. 8 shows a light output in this case. In FIG. 8, a light output A represents a light output of a semiconductor laser driven in a sawtooth wave, and a light output B represents a light output of a semiconductor laser driven by a constant current. Temperatures of the two semiconductor lasers are almost equal to each other since they are arranged on a single chip. The light output B is cut off when the light output A is increased by $P_s$. When the temperature is increased from $T_1$ to $T_2$, the light output B is decreased by a temperature rise, as shown in FIG. 8. However, when the temperature reaches $T_2$, a cutoff timing is delayed accordingly, as shown in FIG. 8, and an exposure (time integral value) of the light output B remains the same at any temperature.

According to the modulation method of the present invention, light modulation is performed so that a light output of a semiconductor laser has a non-rectangular waveform including a waveform increased as a lapse of a time. The modulation is performed until a desired exposure amount is obtained, so that a desired constant exposure amount free from a temperature variation can be obtained without using an APC circuit, and a large extinction ratio can be obtained.

Figure 7B:
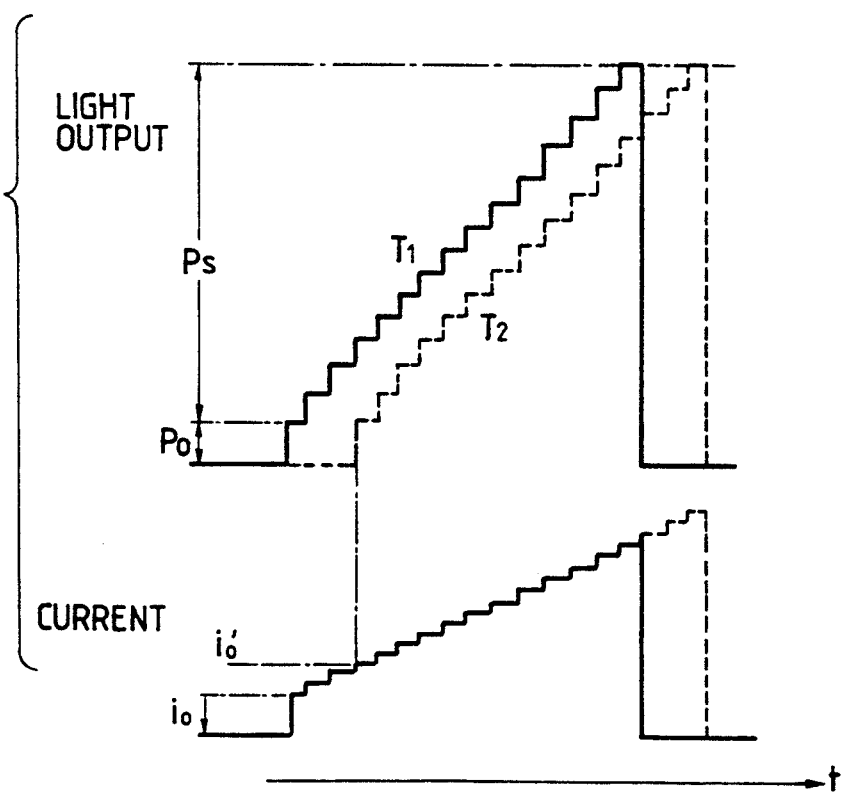

Note that the present invention is not limited to a semiconductor laser, but may be applicable to a modulation light source as long as it can be directly modulated and has similar characteristics. A light modulated and has similar characteristics. A light output from a light source need not always be linearly increased, as shown in FIG. 7A, but may be increased stepwise, as shown in FIG. 7B. The same applies to a system to be described below.

2. System Using Light Modulation Unit

The above-mentioned modulation method is not limited to a printer but may be widely applied to various systems which require light modulation. For example, the modulation method may be applied to an image recording apparatus such as a printer or a copying machine, an information recording apparatus for recording information on an information recording medium such as an optical disk or an optical card, a display apparatus, a machine tool, medical equipment such as a laser knife or an optical treatment apparatus, a measurement/inspection apparatus, an optical communication apparatus, and the like.

First Embodiment

An embodiment wherein the present invention is applied to a laser printer, widely used in, e.g., the medical field, for recording a high-definition, multi-gradation halftone image on a film, will be described in detail below with reference to the drawings. In the apparatus of this embodiment, a halftone image having as many as 4,096 gradation levels can be drawn.

Figure 1:
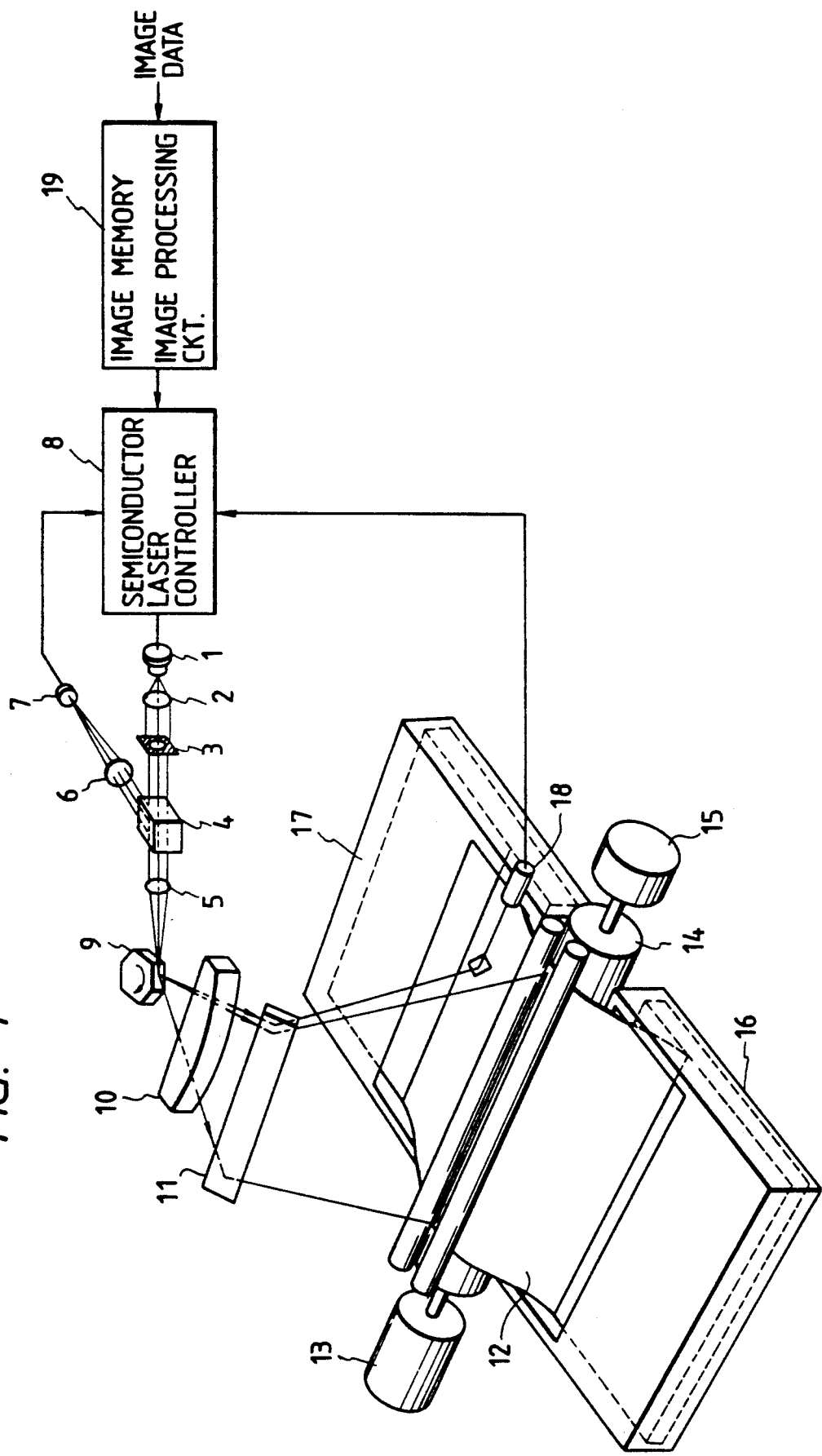
FIG. 1 is a schematic view showing the overall arrangement of a laser printer according to an embodiment of the present invention.

FIG. 1 shows the arrangement of the entire system of the laser printer. The system includes a semiconductor laser controller 8 for modulating and driving a semiconductor laser. A unit 19 includes an interface for fetching original image data from an external equipment such as MR, CT, DSA, or the like, an image memory for storing image data consisting of a large number of picture element data, and an image processing circuit for performing image processing such as image array processing, variable magnification processing, and the like. The image processing circuit performs variable magnification processing such as enlargement or reduction processing of an original image in accordance with a predetermined output format. When an image is to be enlarged, the image processing circuit performs picture element interpolation processing using a known method such as Nearest Neighbor Interpolation, Linear Interpolation, Cubic Spline Interpolation, or the like.

The system also includes a semiconductor laser 1, an optical system (e.g., a collimator lens) 2 for collimating light emitted from the semiconductor laser, an aperture stop 3, a beam splitter 4, a focusing lens 6, and a PIN photodiode 7. An output from the photodiode 7 is input to the semiconductor laser controller 8 to monitor a strength of a laser beam split by the beam splitter 4. A lens 5 and a rotary polygonal mirror 9 for performing main scanning are arranged in a straight transmission direction of the beam splitter 4. The system also includes an f-θ lens 10 for inclination correction, a reflection mirror 11 for reflecting a light beam in a direction perpendicular to a sheet-like photosensitive recording medium 12 such as a silver chloride film.

The system further includes a supply magazine 16 for storing sheet-like recording media, a receive magazine 17 for storing photosensitively recorded recording media, and a sub-scanning motor 13. A roller 14 is connected to the motor 13 to sub-scan the sheet-like recording medium 12. An encoder 15 is mounted on the rotational shaft of the roller 14 to detect a rotational state of the roller 14. As the encoder 15, for example, a laser rotary encoder is suitable. The recording medium 12 is picked up from the supply magazine 16, and is fed to the roller 14. The recording medium 12 is then subjected to exposure recording by a light beam while being sub-scanned by the roller 14 at a low speed. The recorded medium is stored in the receive magazine 17. Note that the recorded medium may be directly fed not to the receive magazine 17 but to an automatic developing machine (not shown).

A photodiode 18 is arranged to obtain a signal (BD) signal for representing the beginning of each main scanning period so as to take synchronization in units of main scanning periods. The semiconductor laser controller 8 modulates and drives the semiconductor laser 1 on the basis of a content of an image memory 19 for storing picture element data in synchronism with an output from the photodiode 18. Since a drawing start timing of each scanning line is obtained on the basis of the BD signal, the BD signal must be obtained at an accurate timing as much as possible so as to draw a high-quality image. Thus, when a scanning light beam passes through the photodiode 18 to detect a signal, the semiconductor laser 1 is continuously oscillated to have a constant output. In order to prevent diffused reflection at, e.g., a corner portion of the rotary polygonal mirror, the light output of the semiconductor laser 1 is forcibly stopped in a blanking period other than a period wherein light is incident on the photodiode 18.

Figure 2:
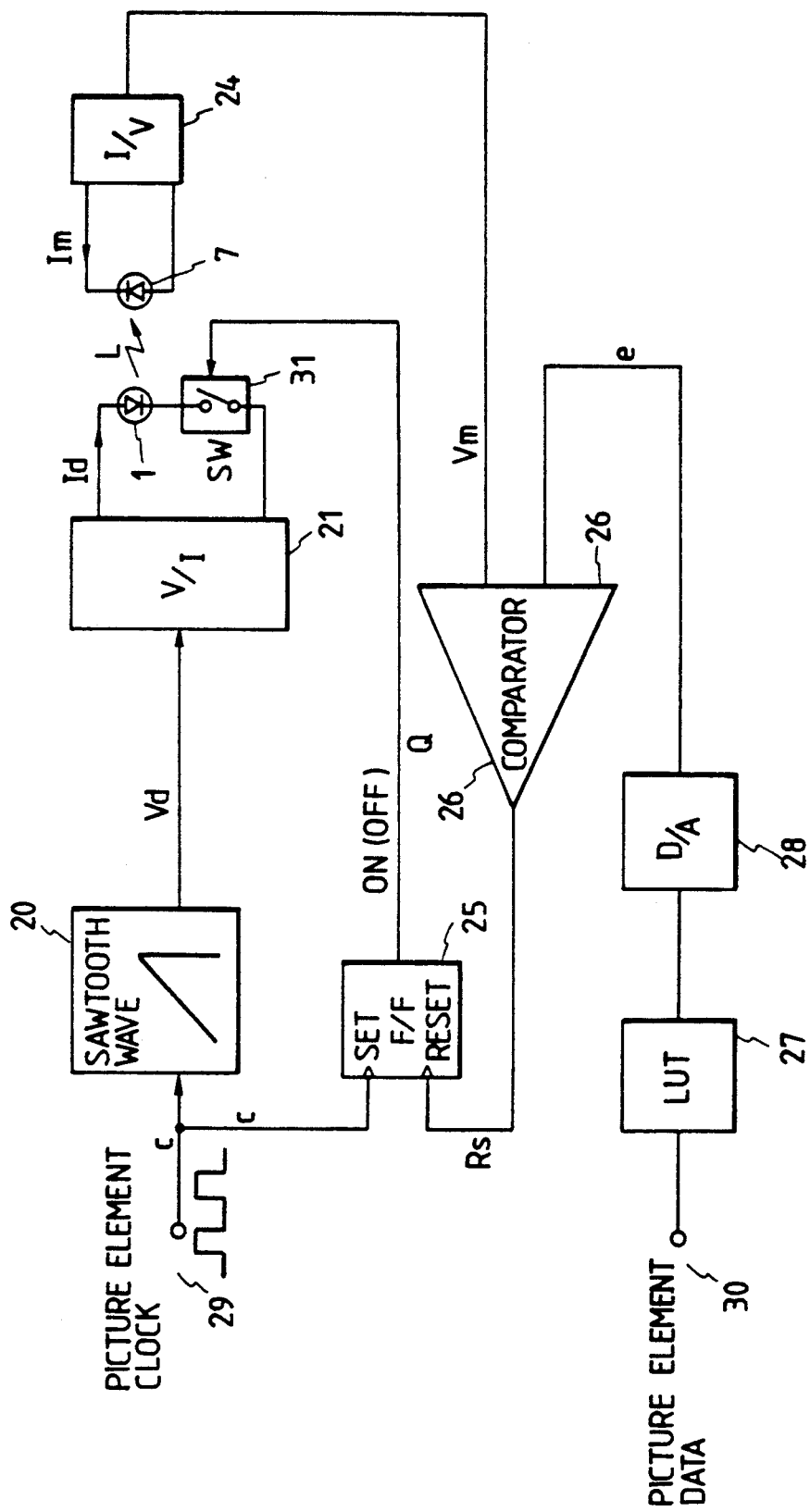
FIG. 2 is a block diagram showing the first embodiment.

FIG. 2 is a detailed block diagram of a unit illustrated as the semiconductor laser controller 8 in FIG. 1, and a description will be made below with reference to FIG. 2.

In FIG. 2, a setup value 30 for controlling a light output is 12-bit (4,096 gradation levels) digital data which is set according to a density of recording picture elements. The circuit shown in FIG. 2 includes a lookup table 27, serving as a means for correcting an exposure amount to be proportional to a square of the setup value, for converting picture element data, a digital-to-analog (D/A) converter 28 for converting corrected picture element data into an analog value, a comparator 26 for comparing the detected light output and picture element data, a flip-flop 25 which is set/reset in response to a leading edge of an input, i.e., which is set by a picture element clock, and is reset by an output from the comparator 26, a sawtooth wave generator 20 for outputting a sawtooth wave synchronized with a picture element clock, a voltage-to-current (V/I) converter 21 for converting the sawtooth wave into a driving current for the semiconductor laser 1, a switch 31 which is turned on/off by an output Q from the flip-flop 25, and a current-to-voltage (I/V) converter 24 for converting a current detected by the PIN photodiode 7 into a voltage.

Figure 3:
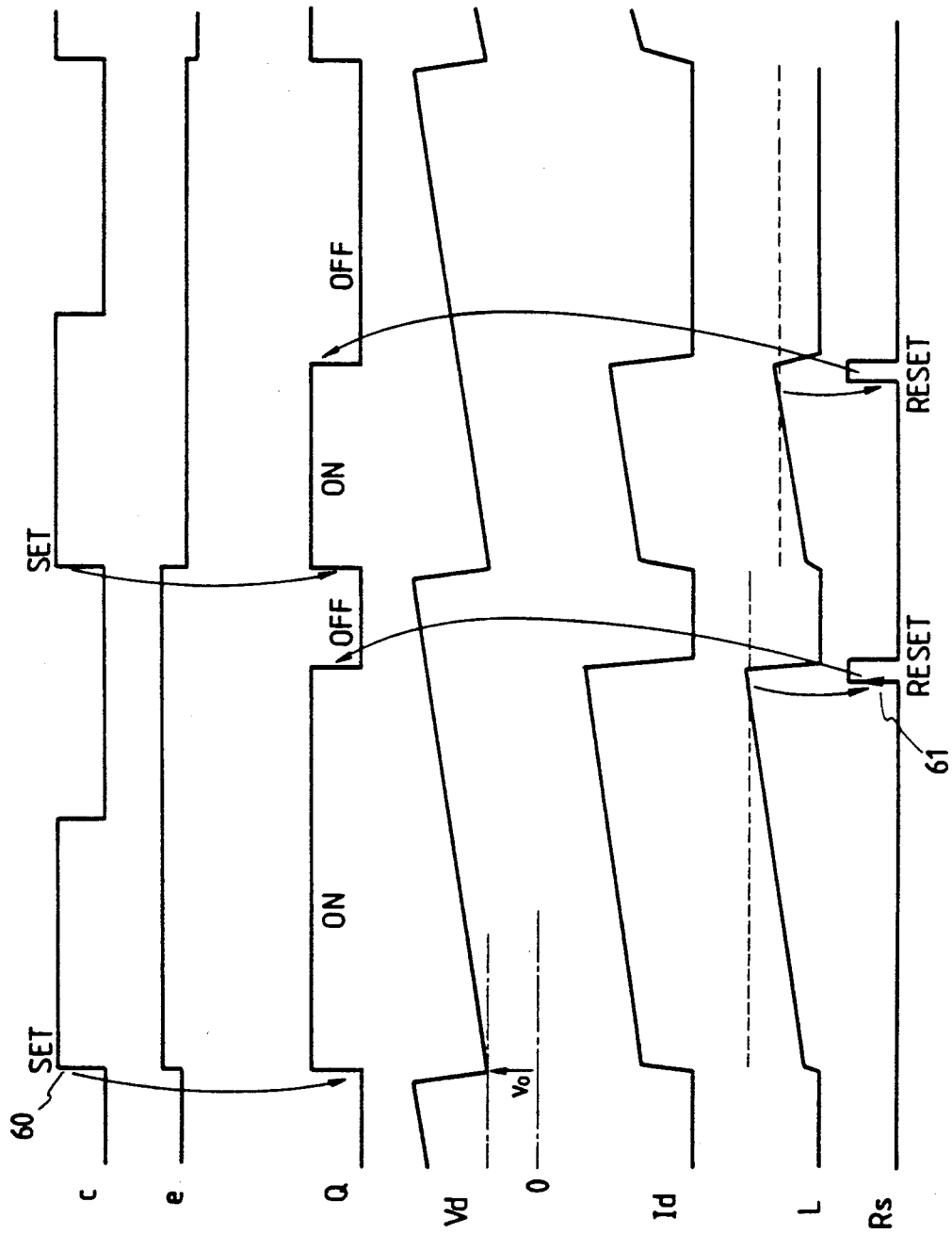
FIG. 3 is a timing chart for explaining an operation of the circuit shown in FIG. 2.

The operation of the above-mentioned arrangement will be described below with reference to the timing chart shown in FIG. 3. In FIG. 3, C represents a picture element clock. e represents an analog value obtained by converting 4,096-level picture element data input in synchronism with the picture element clock by the D/A converter 28. Q represents an output from the flip-flop 25. The output Q ON/OFF-controls the switch 31. $V_d$ represents an output from the sawtooth wave generator 20, i.e., an input to the V/I converter 21, and $v_0$ represents an offset corresponding to a minimum current for causing the semiconductor laser to perform laser oscillation. $I_d$ represents a driving current of the semiconductor laser. When the output Q is enabled, a current according to $V_d$ flows, and when the output Q is disabled, no current flows. L represents a light output from the semiconductor laser. $R_s$ represents an output from the comparator 26. When the output e from the D/A converter 28 is larger than an output from the I/V converter 24 as a detection value of the light output, the output $R_s$ goes to high level; otherwise, it goes to low level. The output Q from the flip-flop 25 is reset in response to the leading edge of the output $R_s$.

In FIG. 3, the output Q from the flip-flop 25 goes to high level in response to a leading edge 60, and the switch 31 is turned on. When the switch 31 is turned on, the semiconductor laser begins to perform laser oscillation. When the light output L exceeds the output from the A/D converter, the output $R_s$ goes to high level, and the flip-flop is reset at its leading edge 61. Thus, the flip-flop cuts off the light output, so that the light output forms a sawtooth waveform. With this operation, as described above, an exposure amount of the light output does not depend on a change in temperature, and depends on only the output e from the D/A converter.

Figure 4:
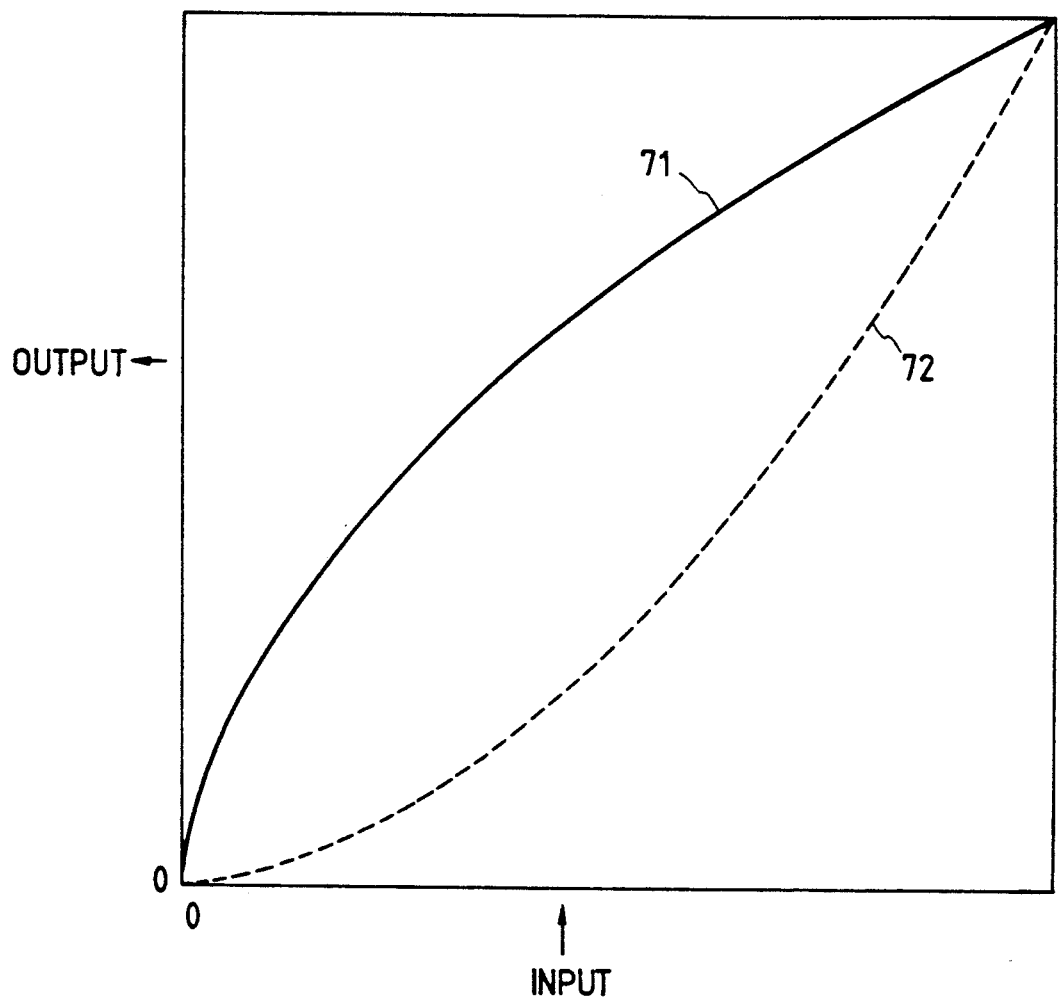
FIG. 4 is a graph for explaining a look-up table.

An exposure amount is given by equation (2) in which $P_s$ is replaced with e, i.e., is represented by a quadratic expression associated with e. Therefore, the look-up table 27 for causing the exposure amount to be proportional to the picture element data 30 is obtained based on equation (2). FIG. 4 shows conversion characteristics of the look-up table. In FIG. 4, a curve 72 represents a waveform of an exposure amount (equation (2)), and a curve 71 represents the look-up table.

Second Embodiment

Figure 5:
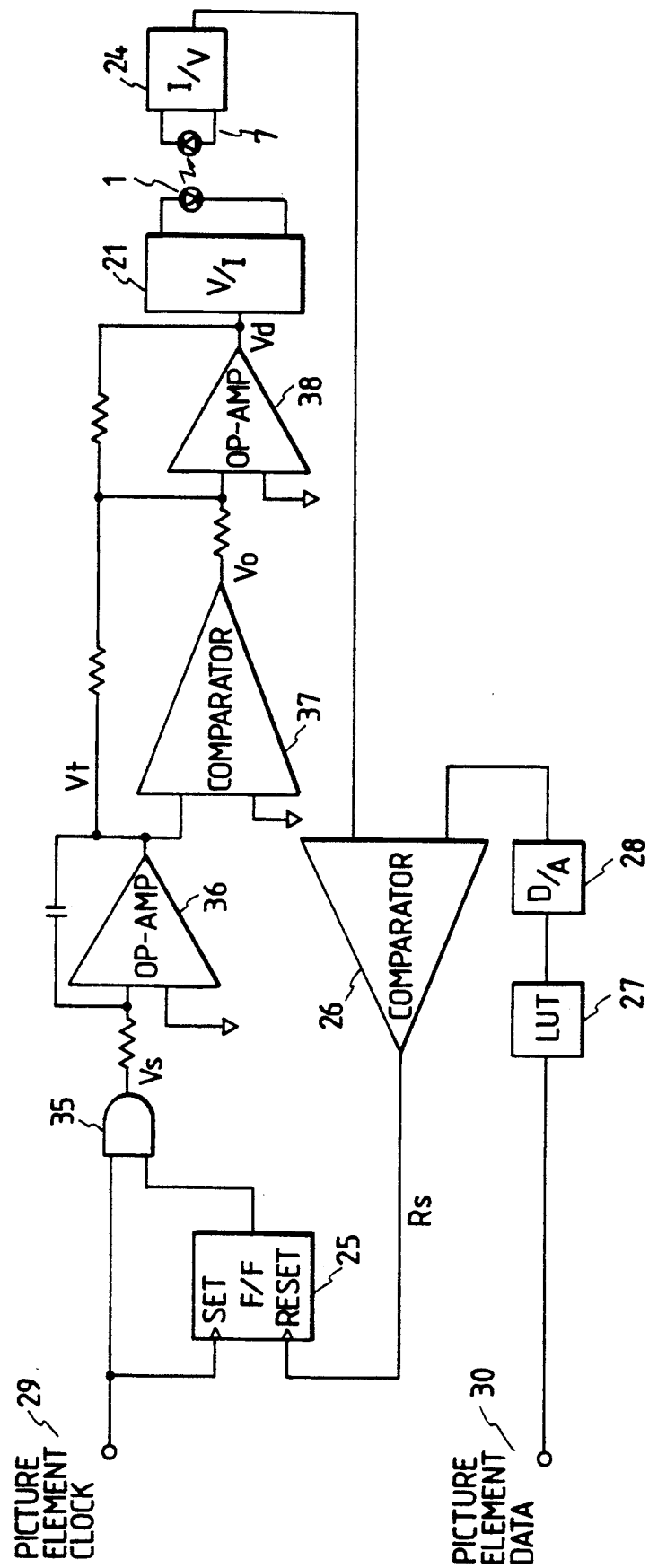
FIG. 5 is a block diagram showing the second embodiment.

FIG. 5 is a block diagram of the second embodiment according to the present invention. The same reference numerals in FIG. 5 denote the same or similar parts as in FIG. 2. The characteristic feature of this embodiment is that a triangular waveform having the same rise and fall speeds (inclinations) is used as a driving current for a laser. Note that the rise and fall speeds need not always be the same.

The circuit shown in FIG. 5 includes a comparator 26 for comparing a detected light output and picture element data, a flip-flop 25 which is set/reset in response to a leading edge of an input, i.e., which is set by a picture element clock, and is reset by an output from the comparator 26, an AND gate 35 used to control a duty of a rectangular wave output $V_s$. The circuit also includes an integrator 36 for waveshaping a rectangular wave into a triangular wave $V_t$, a comparator 37 for outputting a voltage $v_0$ for flowing a minimum current for causing a semiconductor laser to perform laser oscillation, an adder 38 for adding the triangular wave $V_t$ and $v_0$ to output a driving voltage $V_d$, a V/I converter 21 for converting the driving voltage $V_d$ into a driving current for the semiconductor laser 1, and an I/V converter 24 for converting a current detected by the PIN photodiode 7 into a voltage.

The operation of the above-mentioned arrangement will be described below with reference to the timing chart of FIG. 6. In FIG. 6, C represents a picture element clock, and e represents an analog value obtained by converting picture element data input in synchronism with the picture element clock by the D/A converter 28.

$V_s$ represents an output from the AND gate 35. The output $V_s$ is a rectangular wave which is synchronous with the picture element clock, and whose duty is controlled by an output from the flip-flop 25. $V_t$ represents a triangular wave output from the integrator 36. $V_d$ represents an input voltage to the V/I converter 21. If $V_t > 0$, the voltage $V_d$ is obtained by adding $v_0$ to $V_t$, and if $V_t = 0$, it is obtained by adding 0 to $V_t$. By adding the output from the comparator 37, the semiconductor laser 1 performs laser oscillation from the beginning of the leading edge of the triangular wave. L represents a light output from the semiconductor laser. $R_s$ represents an output from the comparator 26. When the output e from the D/A converter 28 exceeds the output from the I/V converter 24 as a detection value of the light output, the output $R_s$ goes to high level; otherwise, it goes to low level. The output Q from the flip-flop 25 is reset in response to a leading edge 63 of $R_s$.

In FIG. 6, the output Q from the flip-flop 25 goes to high level in response to a leading edge 62, thus generating the triangular wave $V_t$. When the triangular wave is generated, the comparator 37 adds the voltage $v_0$ to the triangular wave to generate $V_d$. Since a driving current proportional to $V_d$ flows, the light output L is generated by the semiconductor laser, as shown in FIG. 6. When the output L is detected and exceeds the output e of the D/A converter 28, the output from the comparator 26 goes to high level, and the flip-flop 25 is reset in response to the leading edge of the output from the comparator 26. Thus, the integrator 36 begins to discharge, and the triangular wave $V_t$ begins to fall. The fall speed is the same as the rise speed, and the light output also has a symmetrical waveform to that upon rising. An exposure amount defined by this light output has no temperature dependency like in the first embodiment described above. The look-up table is the same as that in the first embodiment.

Third Embodiment

Figure 9:
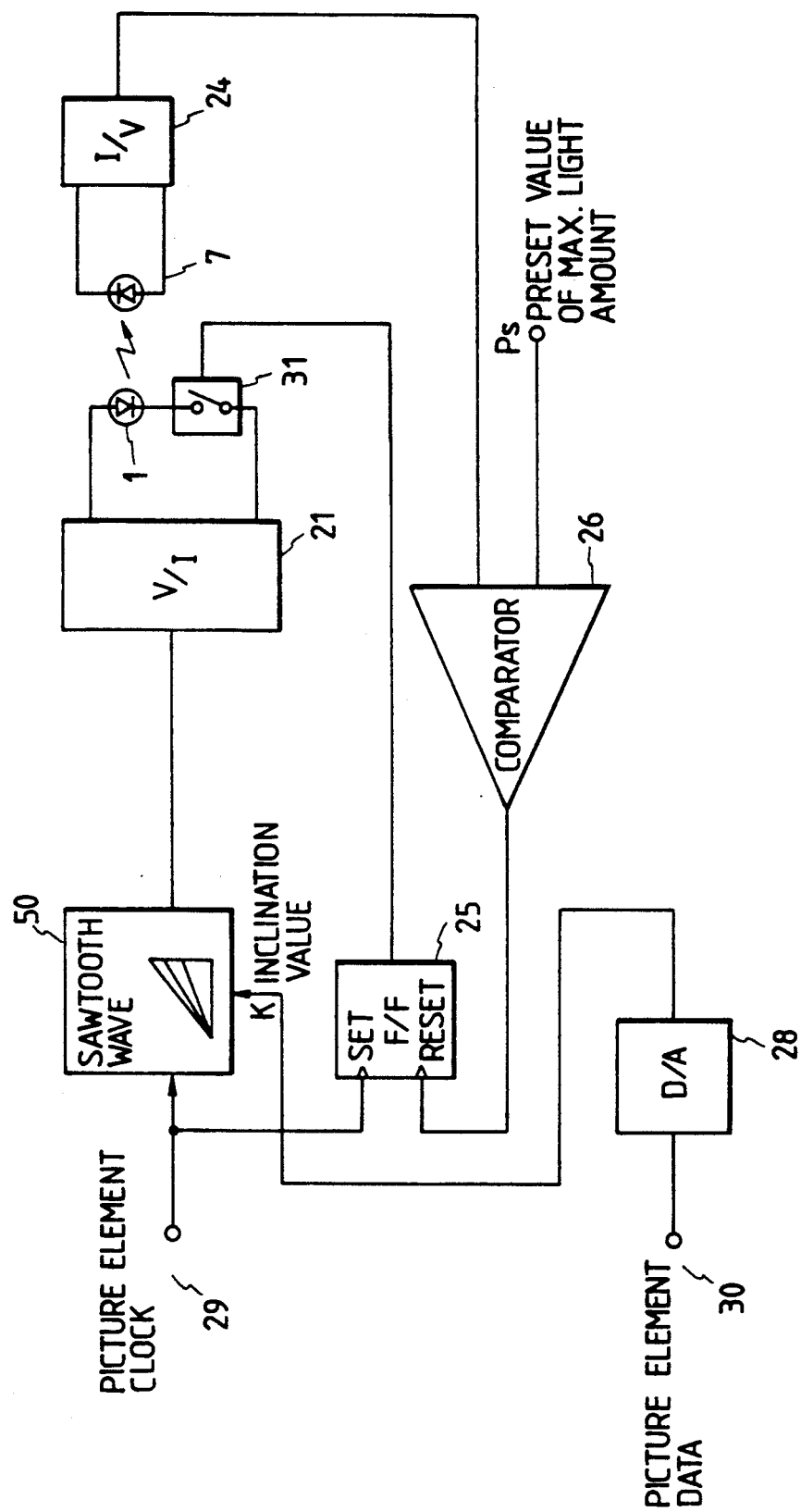
FIGS. 9 and 10 are block diagrams showing the third embodiment.

FIG. 9 is a block diagram of the third embodiment according to the present invention. Since FIG. 9 is substantially the same as FIG. 1 as the block diagram of the first embodiment, only a difference will be explained below.

In a sawtooth wave generator 50, an inclination of a sawtooth wave to be generated can be set by an external electrical input. The inclination is obtained by converting picture element data into an analog value by a D/A converter 28. A comparator 26 compares a light output detected by a photodiode 23 with a predetermined constant value $P_s$. With this arrangement, when the light output exceeds the constant value $P_s$, the driving current can be cut off. An exposure amount E at that time (integral value of the light output) is given by equation (2) described above. For the sake of descriptive convenience, equation (2) is described again.

$$E = \frac{1}{\eta k} P_s (P_0 + P_s/2) \qquad (2)$$

where $\eta$ is the slope coefficient of a semiconductor laser, k is the inclination of the driving current, and $P_0$ is the minimum light output of the semiconductor laser.

In the first embodiment, k in equation (2) is set to be constant, and $P_s$ is changed to control the exposure amount E. In this embodiment, however, $P_s$ is set to be constant, and k is changed in correspondence with picture element data, thereby controlling the exposure amount E.

Figure 10:
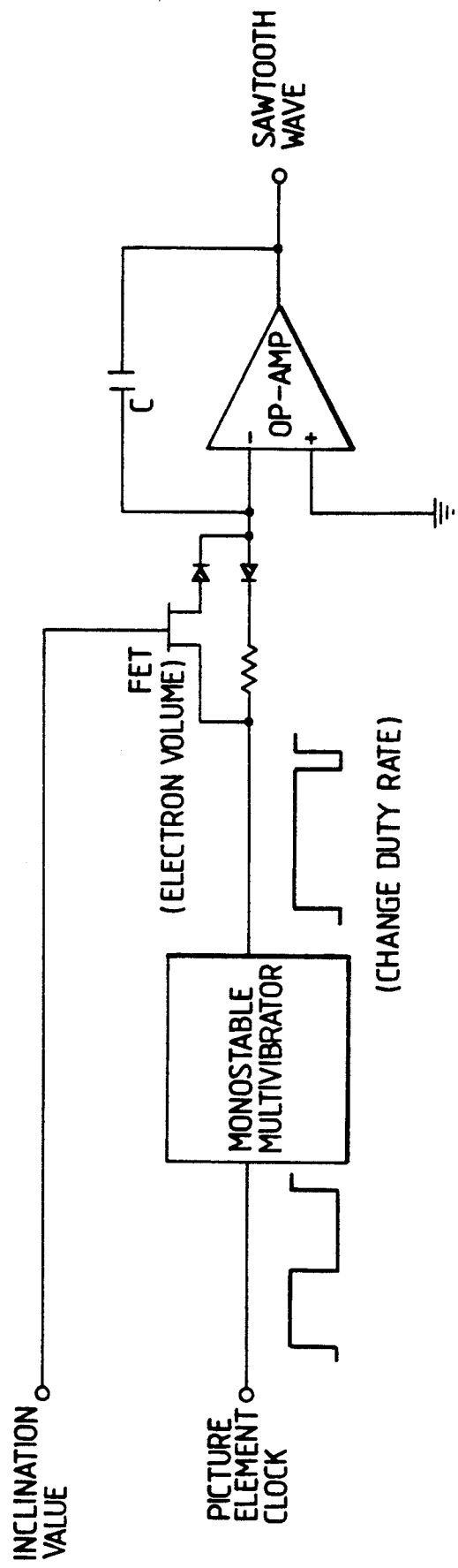

A means for changing the inclination of the sawtooth wave by an electrical input can be realized by a circuit arrangement shown in, e.g., FIG. 10. In FIG. 10, a picture element clock is input to a monostable multivibrator to fix a duty ratio, and is then input to a triangular wave generator using an operational amplifier. A resistor used in the triangular wave generator is varied by an electron volume to change the inclination of the sawtooth wave.

Since this embodiment employs a method of linearly increasing the light output, and cutting it off at a given value, a change in exposure amount due to a change in temperature can be eliminated like in the first embodiment.

Note that the driving current for the semiconductor laser is not limited to the sawtooth wave but may be a triangular wave described in the third embodiment.

Fourth Embodiment

Figure 11:
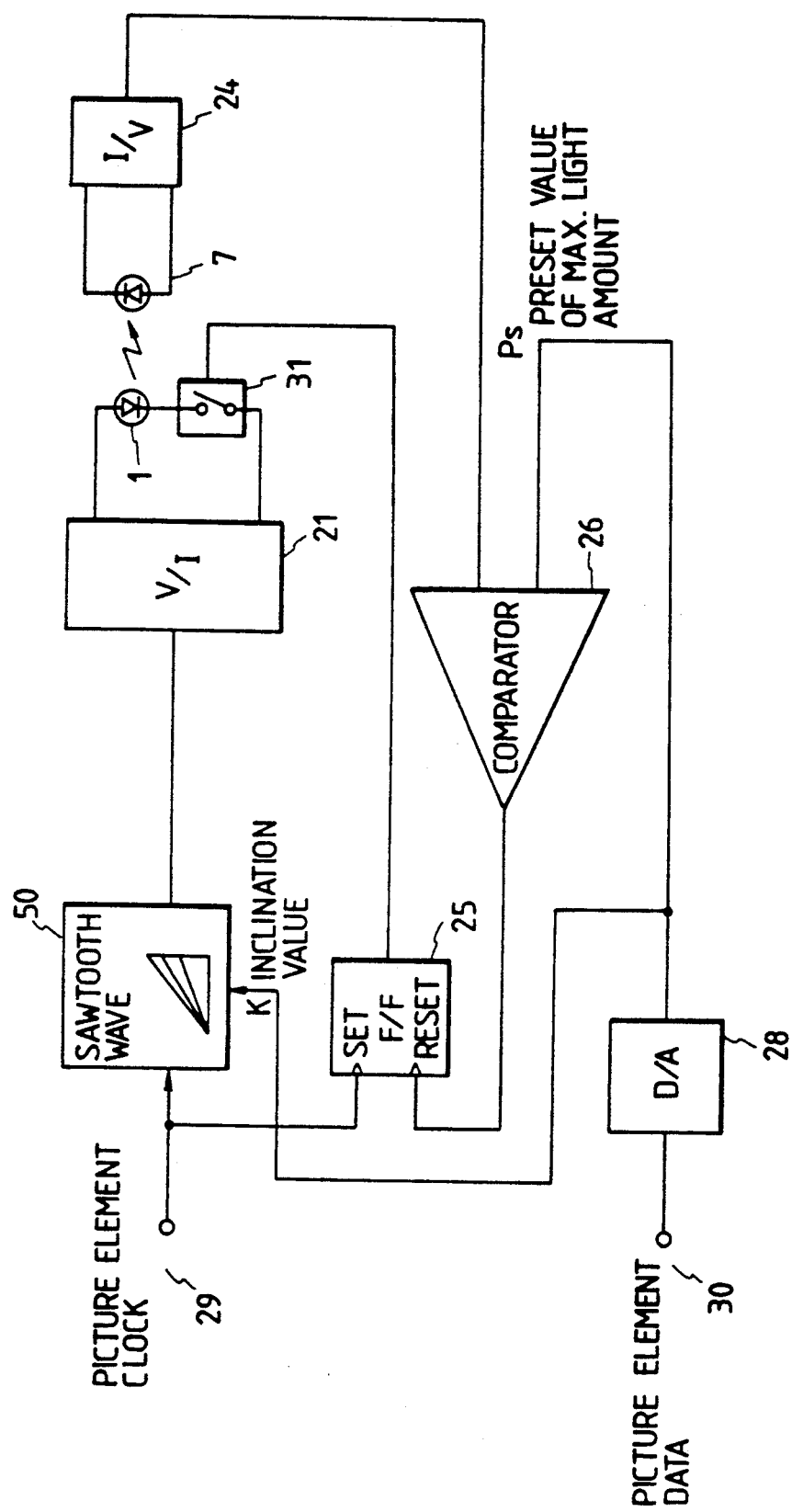
FIG. 11 is a block diagram showing the fourth embodiment.

FIG. 11 is a block diagram of the fourth embodiment. The arrangement of this embodiment is similar to that shown in FIG. 9. The characteristic feature of this embodiment is that the input of a comparator 26 is also connected to picture element data. In this embodiment, the light amount setup value $P_s$ is changed in proportion to the inclination k, and a constant pulse width (for one picture element) is obtained regardless of a value of picture element data. This means that the inclination k of the driving current and the light amount setup value $P_s$ in equation (2) are changed at the same time to control the exposure amount E.

The embodiments so far exemplify a kind of pulse-width modulation, and a pulse width, i.e., an exposure time is changed according to a value of picture element data. When this technique is applied to an image recording apparatus, a pulse width is undesirably changed according to a value of picture element data within one picture element, and an exposure region within one picture element is deviated. Furthermore, a degree of deviation is also varied according to picture element data.

In contrast to this, according to this embodiment, since the inclination k and the light amount setup value $P_s$ are simultaneously changed in association with each other, the pulse width, i.e., the exposure time can always be kept almost constant. That is, since almost the entire region within one picture element is exposed, the deviation and variation of the exposure region as drawbacks of pulse-width modulation can be eliminated, thus obtaining high image quality.

In this embodiment, the driving current is not limited to the sawtooth wave. That is, a triangular wave may be used to have a waveform symmetrical about the center of one picture element. When such a triangular wave is used, the center of density of each picture element can be aligned at the center in each picture element, and a density distribution within one picture element can be uniformed. As a result, a good halftone image with higher accuracy can be obtained.

In all the above-mentioned embodiments, modulation is performed once within one picture element. However, similar modulation may be repeated several times within one picture element. This operation can be realized by multiplying an integer constant with a frequency of a sawtooth or triangular wave in the arrangement of each embodiment. Thus, a density distribution within one picture element can be segmented and equalized, thus obtaining an image with better image quality.

Fifth Embodiment

According to the exposure techniques in the methods of the embodiments so far, since an exposure amount is defined by an area of a triangle, it is always multiplied with a coefficient of ½, and a high exposure amount is difficult to obtain. In order to increase the exposure amount, a maximum light output may be increased. However, a light output at a maximum rating of a semiconductor laser is unique to the semiconductor laser, and the laser cannot be operated beyond the rating.

In order to solve this problem, according to this embodiment, when an exposure amount is modulated with a sawtooth waveform, the light output from the semiconductor laser is restricted not to exceed a predetermined value. When the light output reaches the predetermined value, conventional pulse-width modulation is performed based on the predetermined value, thus increasing the exposure amount.

Figure 14:
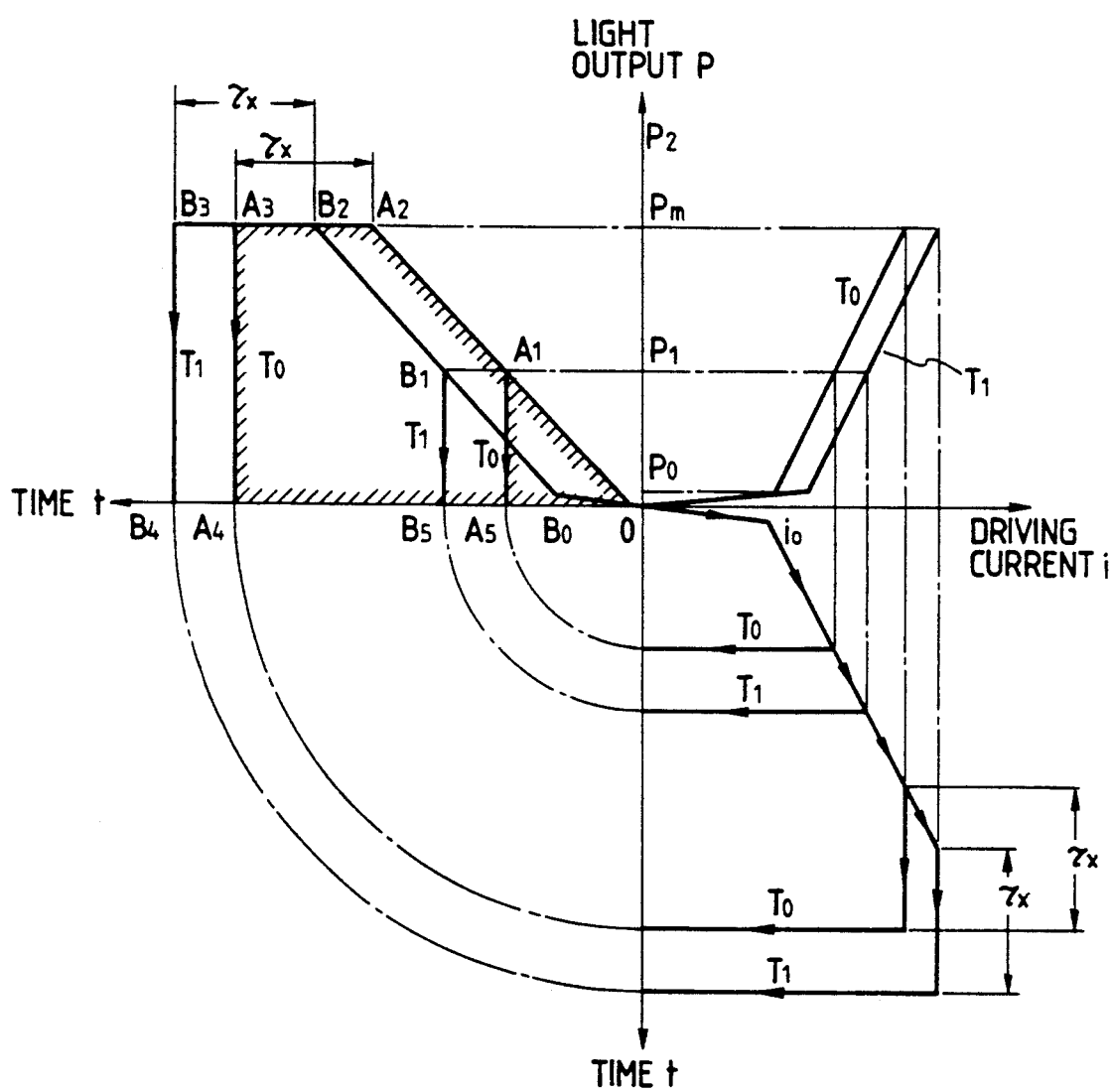
FIG. 14 is a graph for explaining the principle of the fifth embodiment.

FIG. 14 is a four-quadrant graph for explaining the operation principle of this embodiment. Quadrant I shows driving current-light output characteristics of the semiconductor laser, and exemplifies a case wherein case temperatures are $T_0$ and $T_1$ ($T_0 < T_1$). In this case, the temperature $T_0$ is assumed to be an estimated minimum temperature when an equipment is used. This assumption is the same as that in the previous embodiments. A minimum laser oscillation light output is represented by $P_0$ under an assumption that the light output must be used below $P_m$. Quadrant IV shows a change over time in driving current to be supplied to the semiconductor laser having the characteristics in Quadrant I. A driving current is plotted along the abscissa, and time is plotted along the ordinate. In Quadrant IV, a driving current i is immediately raised up to near a minimum oscillation current $i_0$ at the temperature $T_0$ at time $t=0$, and thereafter, is linearly increased relatively slowly. The light output is monitored, and if the light output reaches $P_m$, the current is set to be a predetermined value, so that the light output is set to be the predetermined value $P_m$.

Quadrant II obtains a change over time in light output obtained when the driving current in Quadrant IV is supplied to the semiconductor laser having the characteristics in Quadrant I as a combination of Quadrants I and IV.

Assuming that slope efficiency of a laser oscillation portion of the semiconductor laser is represented by $\eta$ [mW/mA] and an of a linear rise portion of the driving current i is represented by K [mA/sec], an exposure amount $E_1$ until the light output reaches $P_1$ ($\leq P_m$) in Quadrant II is given by an area of a triangle (O $A_1$ $A_5$) in FIG. 14, and is also expressed by the following equation in consideration of the minimum laser light output $P_0$:

$$E_1 = \frac{1}{2\eta K} (P_1^2 - P_0^2) \quad (4)$$

($P_0 \leq P_1 \leq P_m$)

When the emission amount setup value is $P_2$ ($> P_m$), modulation is performed with a pulse width $\eta_x$ proportional to ($P_2 - P_m$) after the emission amount reaches $P_m$. If a proportional constant at that time is represented by C, an exposure amount $E_2$ is given by:

$$E_2 = \frac{1}{2\eta K} (P_m^2 - P_0^2) + C(P_2 - P_m) \quad (5)$$

($P_2 > P_m$)

Since equations (4) and (5) are joined by the setup value $P_m$, C is calculated to equalize differential coefficients at that time. From equation (4), $$\left| \frac{dE_1}{dP_1} \right|_{p1=pm} = \frac{P_m}{\eta K} \quad (6)$$

Therefore, if $C = P_m/\eta K$, equations (4) and (5) can be relatively smoothly joined by the setup value $P_m$. Therefore, an exposure amount E is given by the following equations as a function of the setup value P:

$$\begin{cases} E = \frac{1}{2\eta K} (P^2 - P_0^2) & (P_0 \leq P \leq P_m) \\ E = \frac{1}{2\eta K} (2PP_m - (P_0^2 + P_m^2)) & (P > P_m) \end{cases} \quad (7)$$

As shown in FIG. 14, when the temperature is changed from $T_0$ to $T_1$, an exposure pattern is merely translated. Therefore, an exposure amount itself is left unchanged. More specifically, when the setup value satisfies $P_1 < P_m$, the exposure amount is defined by a triangle (O $A_1$ $A_5$) at the temperature $T_0$, and is defined by a triangle ($B_0$ $B_1$ $B_5$) at the temperature $T_1$. If an LED oscillation region is ignored, the areas of these two triangles are almost equal to each other. When the setup value satisfies $P_2 > P_m$, the exposure amount is defined by an area of a rectangle (O $A_2$ $A_3$ $A_4$) at the temperature $T_0$, and is defined by an area of a rectangle ($B_0$ $B_2$ $B_3$ $B_4$) at the temperature $T_1$. The areas of the two rectangles are almost equal to each other, and it can be understood that a constant exposure amount can be obtained regardless of a variation in characteristics of the semiconductor laser due to a variation in temperature.

Thus, a variation in characteristics of the semiconductor laser due to a variation in temperature, as a feature of modulation with sawtooth wave, is automatically compensated, and at the same time, a function of obtaining a high extinction ratio can be assured, so that a maximum exposure amount can be increased, and a still higher extinction ratio can be obtained.

Figure 12:
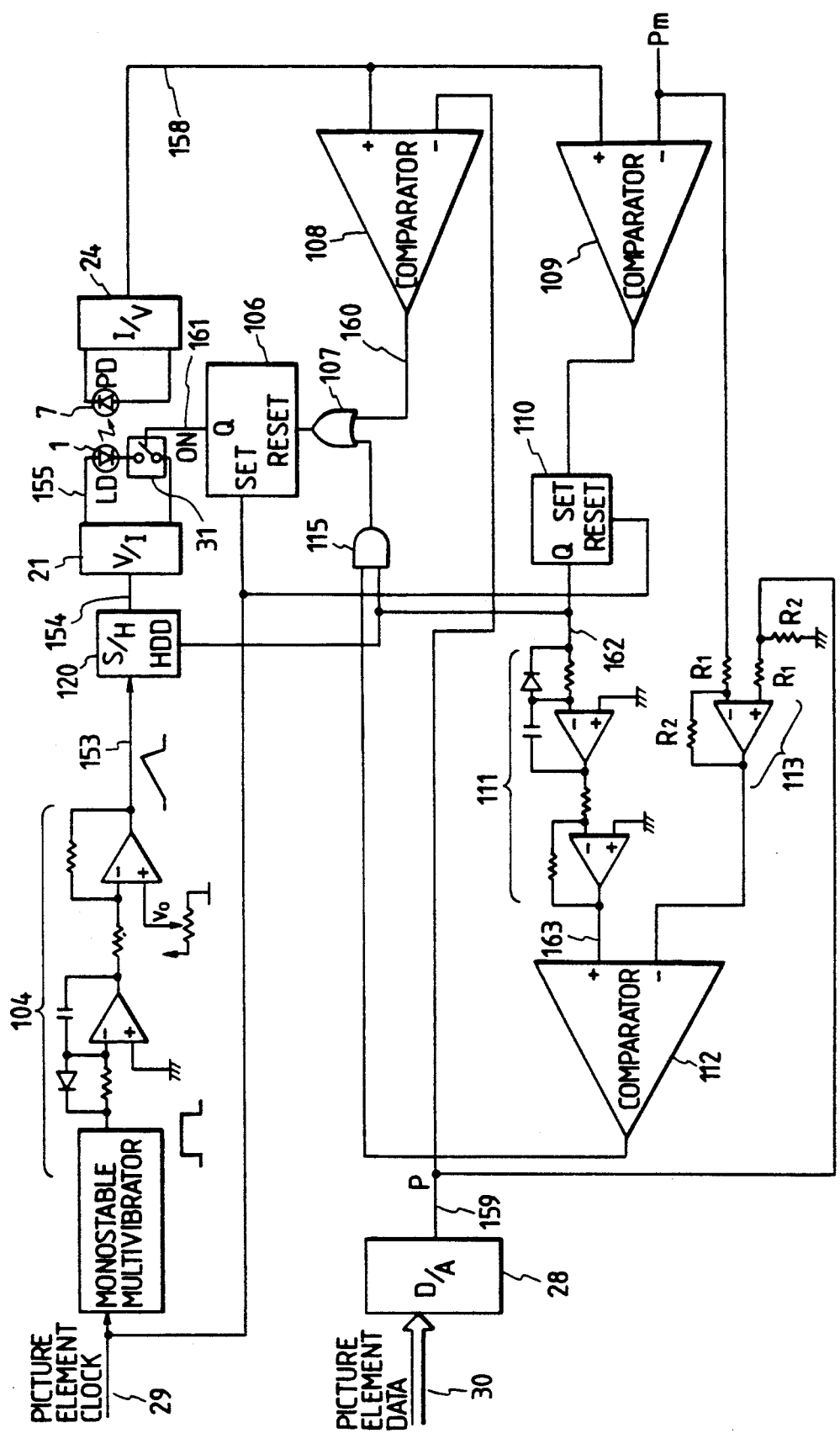
FIG. 12 is a block diagram showing the fifth embodiment.

FIG. 12 is a block diagram showing a detailed arrangement of this embodiment. A circuit block denoted by 104 constitutes to a sawtooth wave generator, which is triggered in response to the leading edge of a picture element clock to generate a sawtooth wave to a node 153. A sample & hold (S/H) circuit 120 receives a voltage at the node 153. When a Hold input of the S/H circuit 120 is at low logic level, the S/H circuit 120 directly outputs the voltage at the node 153 to an output 154, and the S/H circuit 120 holds, during a high-level period, the output voltage obtained when the Hold input goes to high level. A V/I converter 21 converts the output 154 from the S/H circuit 120 as an input voltage into a driving current of the semiconductor laser. An analog switch 31 is enabled while an ON (control) input is at high level, and is disabled when it goes to low level. A reset-set flip-flop 106 is triggered in response to the leading edge of a SET input, and its Q output goes to high level. The flip-flop 106 is triggered in response to the leading edge of a RESET input, and its Q output goes to low level. The Q output is connected to the ON control input of the switch. This signal is denoted by 156. A light output current 157 from a photodiode 7 is converted into a voltage value by an I/V converter indicated by a block 24, thus outputting a light voltage 158. A D/A converter 28 converts picture element data into an analog value, and its analog output P is denoted by 159. A comparator 108 compares analog voltages. When a voltage at a "+" input is higher than that at a "−" input, the comparator 108 outputs high level; otherwise, it outputs low level. The "+" input is connected to the light output 158, and the "−" input is connected to the D/A output P 159. A comparator 109 is similar to the comparator 108. A "+" input of the comparator 109 is connected to the light voltage, and its "−" input is connected to a constant voltage $P_m$ corresponding to the maximum light output. A reset-set flip-flop 110 is similar to the flip-flop 106. A SET input of the flip-flop 110 is connected to the output of the comparator 109, and its RESET input is connected to the picture element clock. An integrator is indicated by a circuit block 111. The integrator 111 receives the output from the flip-flop 110, and generates an integral output of a positive voltage. The output of the flip-flop 110 is also connected to the Hold input of the S/H circuit 120. A differential amplifier serving as a subtracter is indicated by a circuit block 113. One input of the subtracter 113 is connected to the constant voltage $P_m$, and the other input is connected to the D/A output P (159). The output voltage of the subtracter 113 is given by $(P-P_m)R_2/R_1$. A voltage comparator 112 is similar to the comparator 108 or 109. A "+" input of the comparator 112 is connected to the output 163 of the integrator 111, and its "−" input is connected to the output of the subtracter 113. One input of a 2-input AND gate 115 is connected to the output of the comparator 112, and the other input is connected to the output of the flip-flop 110. One input of a 2-input OR gate 107 is connected to the output of the comparator 108, and the other input is connected to the output of the AND gate 115. The output of the OR gate 107 is connected to the RESET input of the flip-flop 106.

Figure 13:
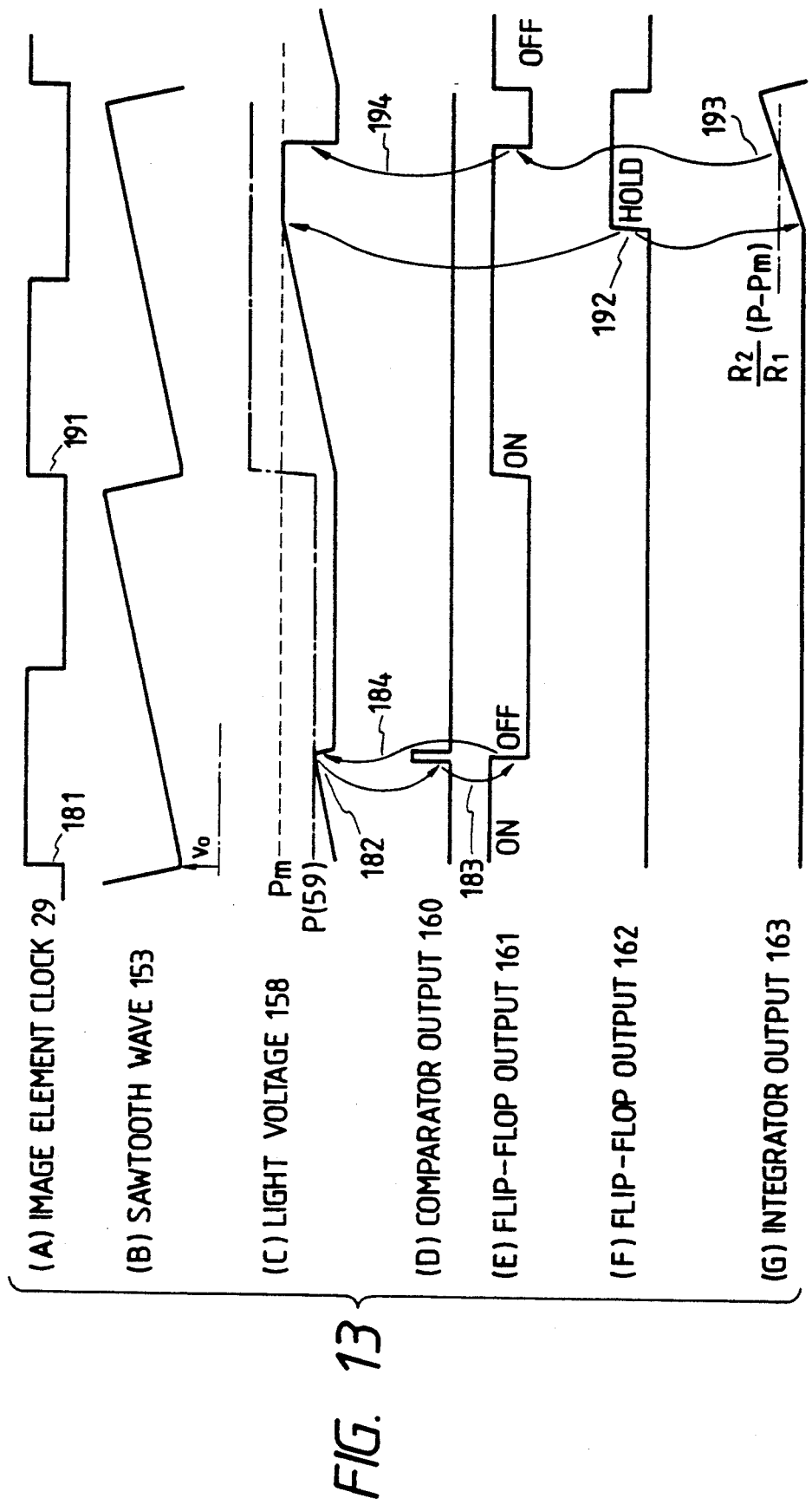
FIG. 13 is a timing chart for explaining an operation of the circuit shown in FIG. 12.

An operation will be described below with reference to the timing chart of FIG. 13. In FIG. 13, (A) represents a waveform of a picture element clock 29, (B) represents the sawtooth wave 153, (C) represents the light voltage 158, (D) represents the output 160 from the comparator 108, (E) represents the output 161 from the flip-flop 106, (F) represents the output 162 from the flip-flop 110, and (G) represents the output 163 from the integrator 111. In FIG. 13, the sawtooth wave 153 begins to be increased at a timing of a leading edge 181 of the picture element clock (A). An offset voltage $v_0$ is superimposed on the sawtooth wave 153 in advance, and is set to be a voltage corresponding to a current value smaller than a minimum current value $i_{th}$ for performing laser oscillation at a minimum temperature within a temperature range normally used by a semiconductor laser 1 (normally set to near $i_{th}$). At the same time, the flip-flop 106 is set, and the switch 31 is enabled. The semiconductor laser 1 begins to emit light, and the light voltage 158 obtained by converting light received by the photodiode 7 into a voltage value appears, as shown in (C) of FIG. 13. The output P (159) of the D/A converter 28 is illustrated by an alternate long and short dashed line in (C) of FIG. 13. In addition, the constant voltage $P_m$ is also illustrated by a broken line.

Assume that the D/A output P at a timing 181 in FIG. 13 satisfies $P < P_m$. In (C) of FIG. 13, when the light voltage is increased upon an increase in light output and reaches the value P, the output 160 from the comparator 108 shown in (D) goes to high level. At this time, the flip-flop 110 is kept reset, and one input of the AND gate 115 is kept at low level. Therefore, the output of the AND gate 115 is kept at low level, and the output 160 of the comparator 108 is directly supplied to the RESET input of the flip-flop 106. As a result, the output 161 of the flip-flop 106 shown in (E) is reset to low level, as indicated by a timing 183 in FIG. 13, the switch 31 is disabled, and a driving current to the semiconductor laser 1 is cut off. Thus, a light voltage, i.e., a light output is cut off, as indicated by a timing 184 in FIG. 13. The above operations are the same as those in modulation with a sawtooth wave in the previous embodiments. These operations will be referred to as a "first operation".

As a "second operation", a case will be described below wherein the D/A output P satisfies $P>P_m$ at a leading edge 191 of the picture element clock 29 shown in (A) in FIG. 13. When the light voltage (C) is gradually increased and reaches $P_m$, the output from the comparator 109 goes to high level, and the output 161 of the flip-flop 110 is set to high level, as indicated by a timing 192 in (F) of FIG. 13. When the flip-flop output 161 goes to high level, the output of the S/H circuit 120 is set in a hold state, and thereafter, a driving current is kept in a constant state. At the same time, the integrator 111 begins to integrate the flip-flop output 162, thus obtaining a sawtooth waveform in (G) of FIG. 13. Since the subtracter 113 outputs a result of $(P-P_m)R_2/R_1$, the output from the comparator 112 goes to high level when the integrator output 163 reaches $(P-P_m)R_2/R_1$. This signal is supplied to the RESET input of the flip-flop 106 through the AND gate 115 and the OR gate 107, and resets the output of the flip-flop 106 to low level, thus cutting off the driving current.

The exposure amounts obtained in the first and second operations described above correspond to upper and lower equations in equations (7), respectively. In particular, in the second operation, since the lower equation in equations (7) is set to be smoothly joined to a change in exposure amount in the first operation when the setup value P is $P_m$, a time constant of a CR in the integrator 111 or a circuit constant of the subtracter 113 is adjusted in the actual circuit arrangement to establish the lower equation in equations (7).

Sixth Embodiment

An initial value ($i_0$) of a sawtooth driving current is set below a current value for initiating laser oscillation at a minimum use temperature of equipment to be used. However, a temperature to be normally used is considerably higher than the minimum use temperature. For example, the minimum use temperature is about 0° C., but a temperature normally used is a room temperature of about 25° C. In this case, a considerable time-lag is required until laser oscillation is started. This results in a decrease in use efficiency of a laser output, and an increase in error of an exposure amount.

Figure 20:
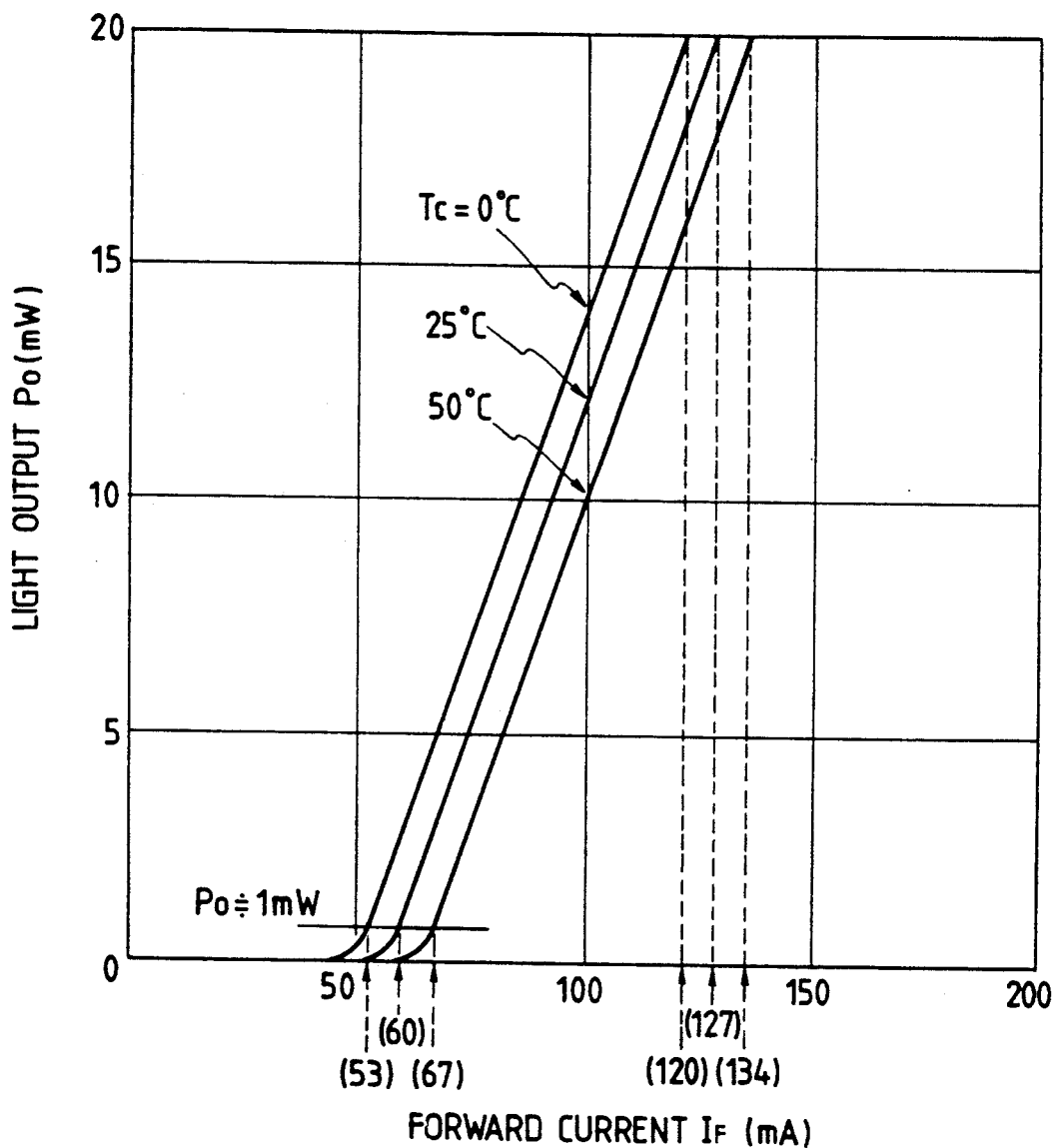
FIG. 20 is a graph showing characteristics of a semiconductor laser.

For example, a semiconductor laser having characteristics shown in FIG. 20 is used in the above-mentioned modulation method with a sawtooth wave. In FIG. 20, characteristics are illustrated in correspondence with case temperatures $T_c$ of 0° C., 25° C., and 50° C. As can be understood from FIG. 20, these characteristic curves are almost translated, and slope efficiency [mW/mA] is almost left unchanged. When minimum currents for initiating laser oscillation are read from FIG. 20, they are 53 mA at 0° C., 60 mA at 25° C., and 67 mA at 50° C. When current values for yielding a maximum rated output of 20 mW are read from FIG. 20, they are 120 mA at 0° C., 127 mA at 25° C., and 134 mA at 50° C. If a temperature range of equipment to be used is assumed to be 0° C. to 50° C., an amplitude of the driving current in the above-mentioned modulation method must cover the range of 0° C. to 50° C., and can be determined to fall within a range of about 50 mA to 140 mA in consideration of a margin.

Figure 21:
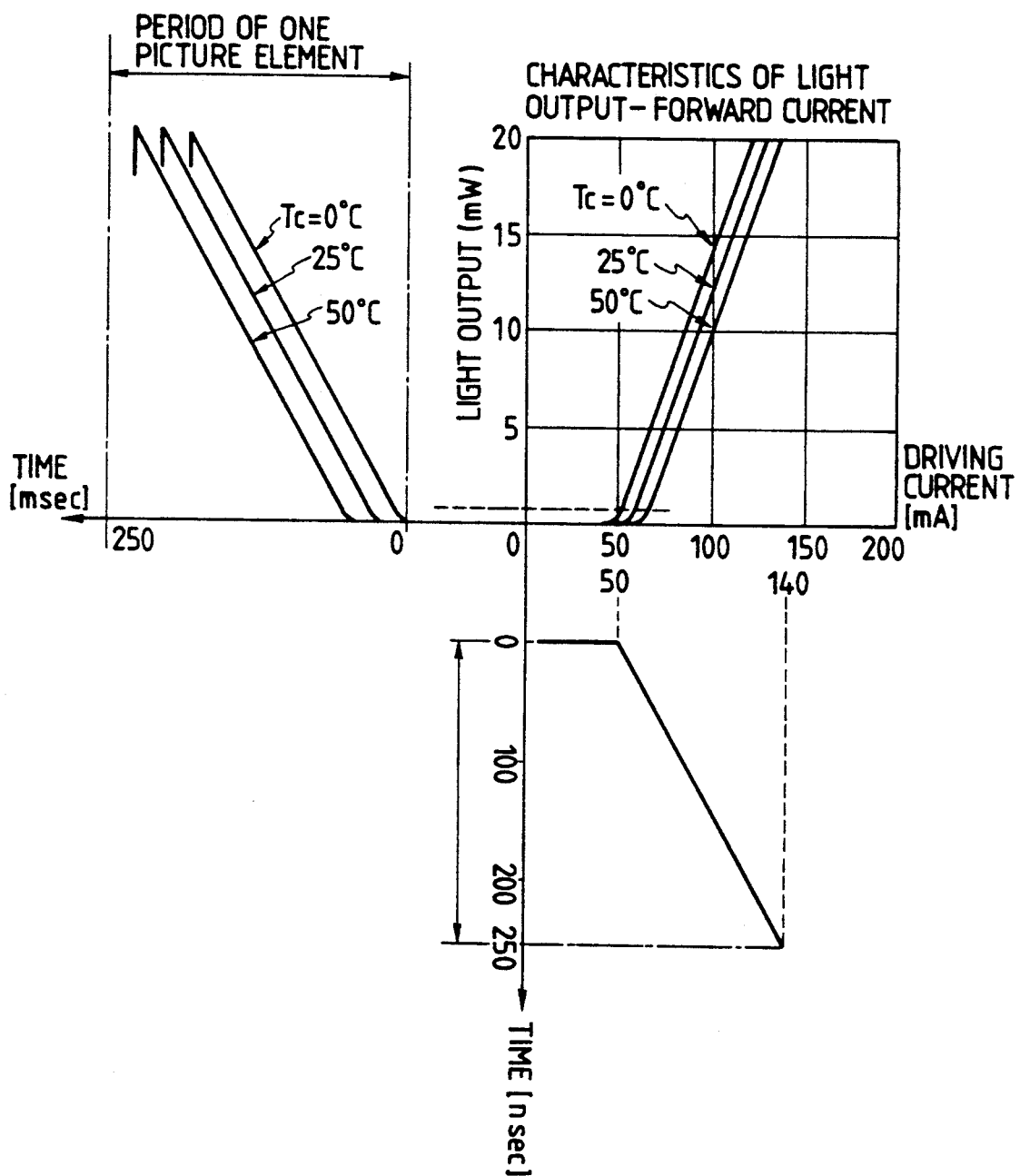
FIG. 21 is a graph for explaining a driving operation of the semiconductor laser.

FIG. 21 illustrates the above state in a four-quadrant graph. Quadrant I in FIG. 21 shows driving current-light output characteristics of the semiconductor laser shown in FIG. 20. Quadrant IV shows current characteristics as a function of time plotted along the ordinate. In Quadrant IV, a recording period for one picture element of the laser beam printer is set to be 250 nsec, and linear transitions of 50 mA to 140 mA determined previously are made within a range of 0 to 250 nsec. Quadrant II is a graph illustrating a change over time in light output obtained by synthesizing Quadrants I and IV to have $T_c=0°$ C., 25° C., and 50° C. As can be understood from Quadrant II, since a margin of a temperature variation is taken into consideration, an exposure operation is made during a period about 75% of one picture element period even if a maximum exposure amount (light output peak = 20 mW) is recorded. A time lag when $T_c=25°$ C. is about 20 nsec. During this period, no laser oscillation is performed, but LED light emission is performed. Light emitted from an LED has a small light amount and poor coherency, and does not so influence exposure. However, when a highly precise image is to be drawn, an error caused by this time lag period may often pose a problem.

Thus, according to this embodiment, a minimum driving current of a semiconductor laser before laser oscillation is started is measured before drawing, and when a picture element is actually exposed, a sawtooth driving current is generated using the measured minimum driving current as an initial value, thus eliminating a time lag and improving use efficiency of the picture element period.

FIG. 2 is a four-quadrant graph for explaining the principle of this embodiment. Quadrant I shows driving current-light output characteristics of a semiconductor laser at a use temperature. Quadrant IV expresses a variation in current over time. A current is gradually increased from 0 like a graph 291. Quadrant II shows a change in light output over time. A graph 291, represents a light output corresponding to the driving current 291. The light output 291' is monitored, and a driving current $I_0$ for yielding a light output $P_0$ corresponding to the beginning of laser oscillation is read.

Figure 22:
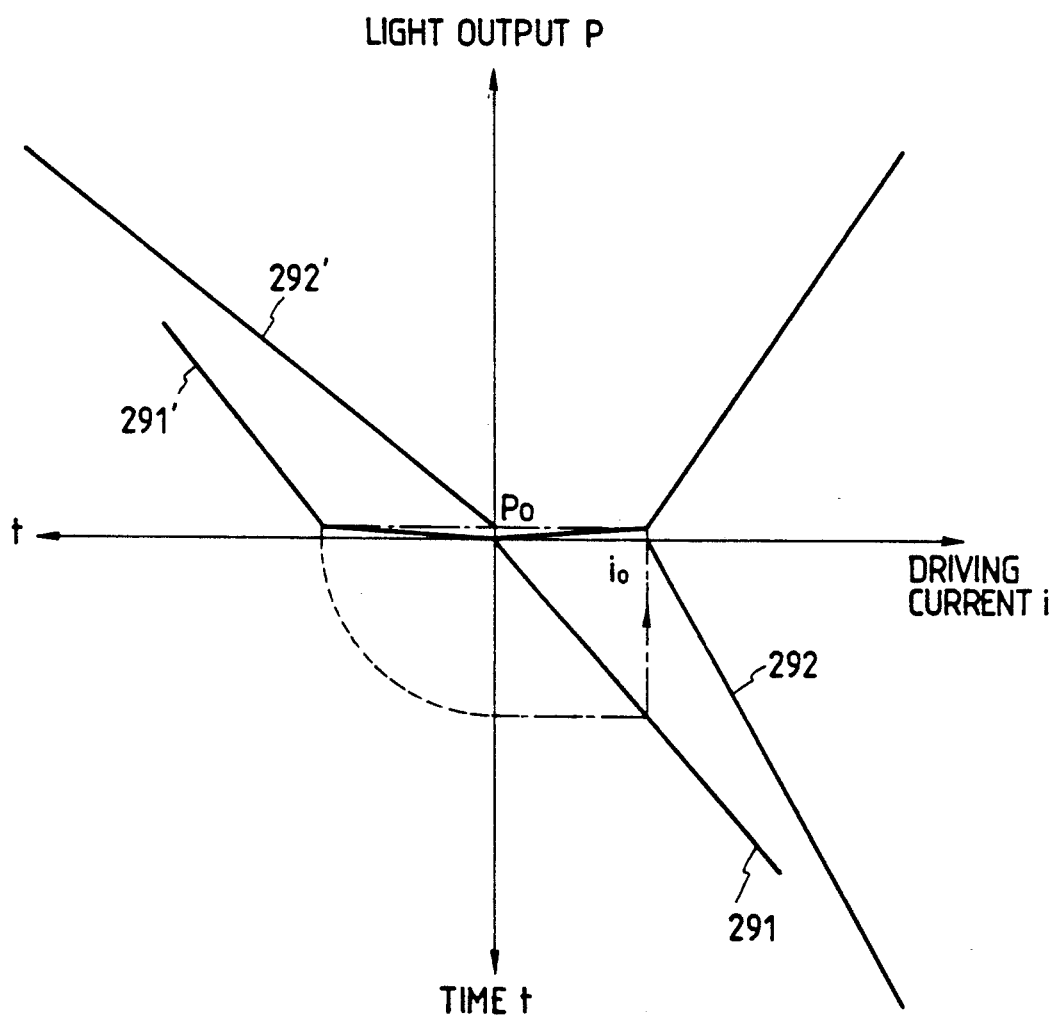
FIG. 22 is a graph for explaining the principle of the sixth embodiment.

When a picture element is actually drawn, the driving operation represented by a graph 292 in FIG. 22 is performed on the basis of $i_0$ measured in advance, so that a light output free from a time-lag can be obtained like in a graph 292'. Thus, a picture element period can be efficiently utilized, and an LED light emission can be minimized.

When an image is to be drawn by a laser beam printer, the above-mentioned test emission like in the graph 291 is periodically performed, e.g., in units of lines or picture elements, and the image is drawn while correcting and updating $i_0$.

Note that $i_0$ should have a small margin to cope with a temperature variation during drawing, and is preferably set to be a smaller value. In this case, however, since the temperature variation does not correspond to all the possible changes in temperature unlike in the prior art, a margin of several % need only be set.

Figure 15:
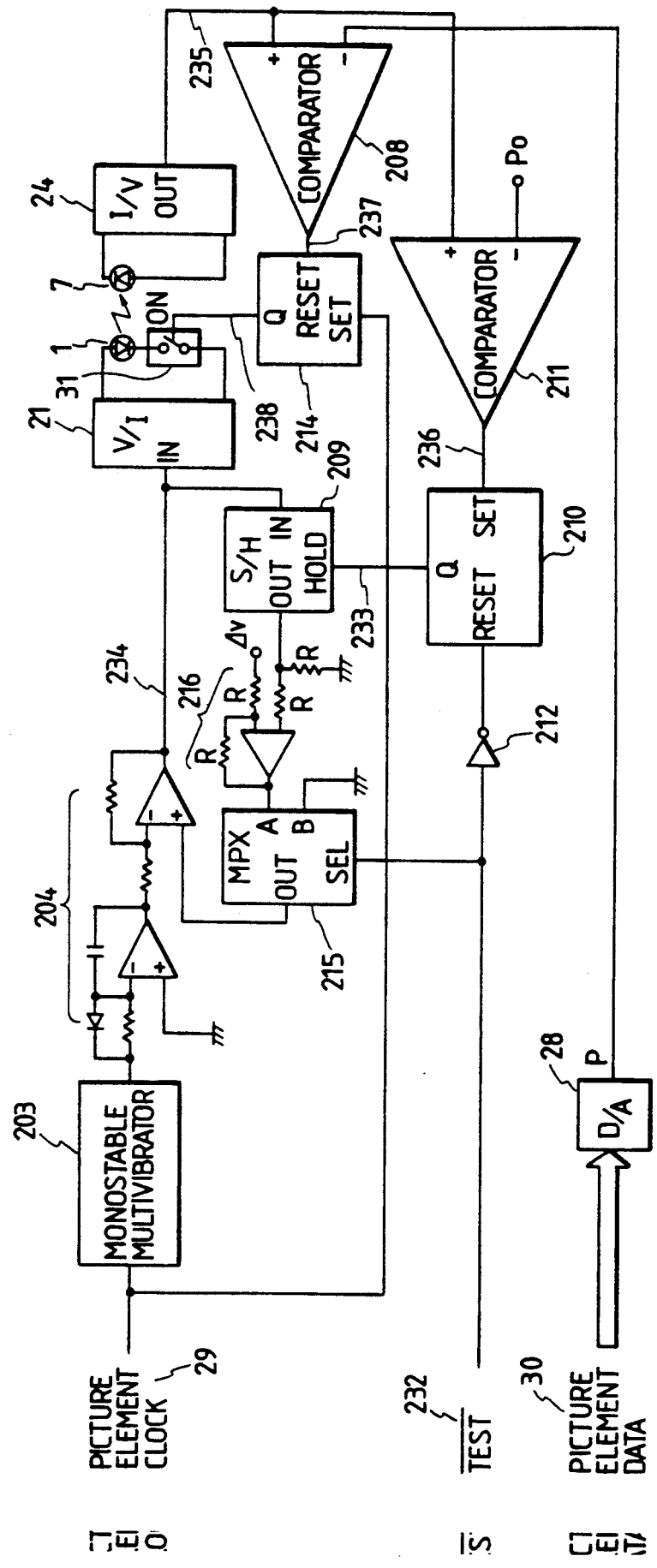
FIG. 15 is a block diagram showing the sixth embodiment.

FIG. 15 shows a detailed arrangement of this embodiment. In FIG. 15, a monostable multivibrator 203 receives a picture element clock, and outputs a pulse which is at high level during a period slightly shorter than one picture element period. An integrator 204 serves as a sawtooth wave generator, and performs integration during a high-level period of the output from the monostable multivibrator 203, thus outputting a sawtooth wave. A V/I converter 21 receives the sawtooth wave, and converts it into a current value. An analog switch 31 is enabled during a high-level period of an ON control signal, and is disabled when the ON control signal goes to low level, thus cutting off a driving current. An I/V converter 23 converts a light current of a photodiode 7 into a voltage value, and its output will be referred to as a light voltage. A voltage comparator 208 outputs high logic level when a voltage at its "+" input is higher than that at its "−" input; otherwise, it outputs low level. The "+" input of the comparator 208 is connected to the output of the I/V converter 24, and its "−" terminal is connected to the output of the D/A converter 28. A flip-flop 214 is triggered in response to the leading edge of its SET input, and its Q output goes to high level. The flip-flop 214 is triggered in response to the leading edge of its RESET input, and its Q output goes to low level. An output from the comparator 208 is input to the RESET input of the flip-flop 214, and the picture element clock is input to its SET input. The Q output of the flip-flop 214 is connected to the ON control input of the switch 31. A "+" input of a voltage comparator 211 similar to the comparator 208 is connected to the light output voltage of the V/I converter 24, and its "−" input is connected to a preset constant voltage $P_0$. The SET input of a flip-flop 210 similar to the flip-flop 214 is connected to the output of the comparator 211. An S/H circuit 209 has a function of holding an input analog voltage at an instance when its HOLD input terminal goes to high level at its output during a high-level period. When the HOLD input terminal is at low level, the S/H circuit 209 directly outputs an input value to the output terminal. A subtracter 216 subtracts a predetermined value $\Delta v$ from the output voltage of the S/H circuit, and outputs a difference voltage. An analog multiplexer 215 outputs a voltage value at its A input when its SEL input is at logic high level, and outputs a voltage value at its B input when it is at low level. The A input of the multiplexer 215 is connected to the output of the subtracter 216, and its B input is connected to a voltage value of ground level (0 V). The output of the multiplexer 215 is connected to the offset input of the integrator 204 as the sawtooth wave generator. The SEL input of the multiplexer 215 is connected to a TEST signal 232. The TEST signal is input from external equipment. The TEST signal is set at (logic) high level in a normal operation mode, and is set at (logic) low level in a test mode. A logic inverter 212 receives the TEST signal 232, and its inverted or reversed output is connected to the RESET input of the flip-flop 210.

Figure 16:
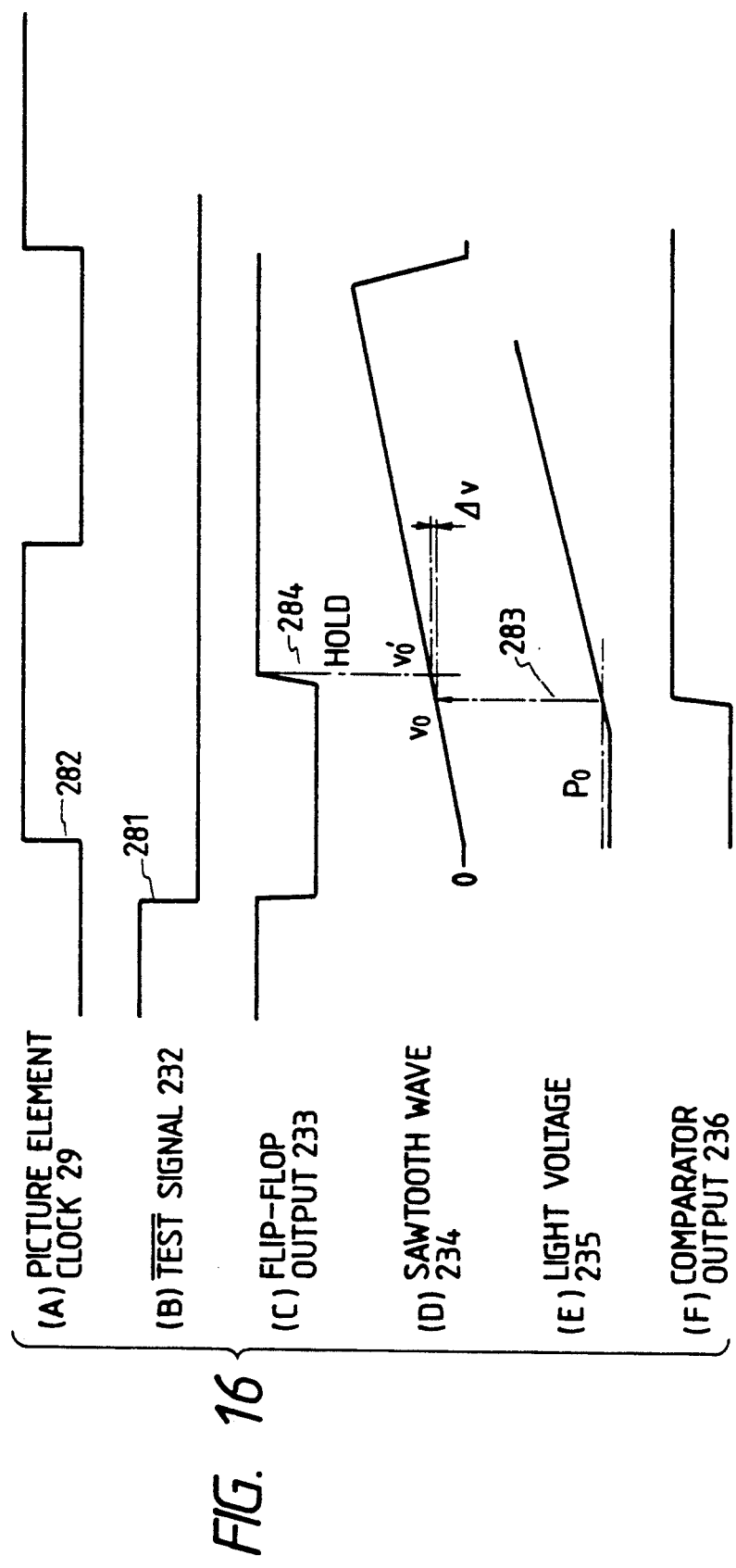
FIGS. 16 and 17 are timing charts for explaining an operation of the circuit shown in FIG. 15.

An operation in the test mode will be described below with reference to the timing chart of FIG. 16. In FIG. 16, (A) represents a picture element clock 29, (B) represents the TEST signal 232, (C) represents a Q output 233 from the flip-flop 210, (D) represents an output 234 from the sawtooth wave generator 204, (E) represents a light voltage output 235 from the I/V converter 24, (F) represents an output 236 from the comparator 211. In FIG. 16, the TEST signal goes to low level at a timing 281 to indicate a test operation, and at the same time, the flip-flop 210 is reset to output low level. In this state, since the SEL input of the multiplexer 215 is at low level, the multiplexer 215 outputs ground level at the B input, and the S/H circuit 209 is released from the hold state. The monostable multivibrator 203 is operated at a timing 282 in (A) of FIG. 16, and generates the sawtooth wave 234 from ground level (0 V), as shown in FIG. 16. A driving current flows through the semiconductor laser 1 according to the sawtooth wave 234 to begin to emit light. This light output is detected by the photodiode 7, and is monitored by the comparator 211 as a light voltage. The constant voltage $P_0$ connected to the "−" input of the comparator 211 is set in advance in correspondence with the minimum laser oscillation light output of the semiconductor laser 1. Therefore, when the light voltage 235 reaches $P_0$ at a timing 283 in FIG. 16, the semiconductor laser 1 begins to perform laser oscillation. At that time, the output 236 of the comparator 211 goes to high level, as shown in (F) of FIG. 16. Therefore, the flip-flop output 233 is set at high level at a timing 284 in (C), and the S/H circuit 209 is set in the hold state. At this time, $v_0'$ in (D) of FIG. 16 is held by the output of the S/H circuit. Since $v_0'$ is a voltage at a timing delayed from $v_0$ at which laser oscillation actually begins by a transmission delay time of the I/V converter 24, the comparator 211, the flip-flop 210, and the S/H circuit 209, a difference $\Delta v$ between $v_0'$ and $v_0$ estimated from this transmission delay time and a current rise speed is subtracted from $v_0'$, and the difference is input to the A input of the multiplexer 215. Note that $\Delta v$ includes a small margin. The test operation is completed in this manner, and $v_0$ becomes an offset voltage of the sawtooth wave in the normal operation mode.

Figure 17:
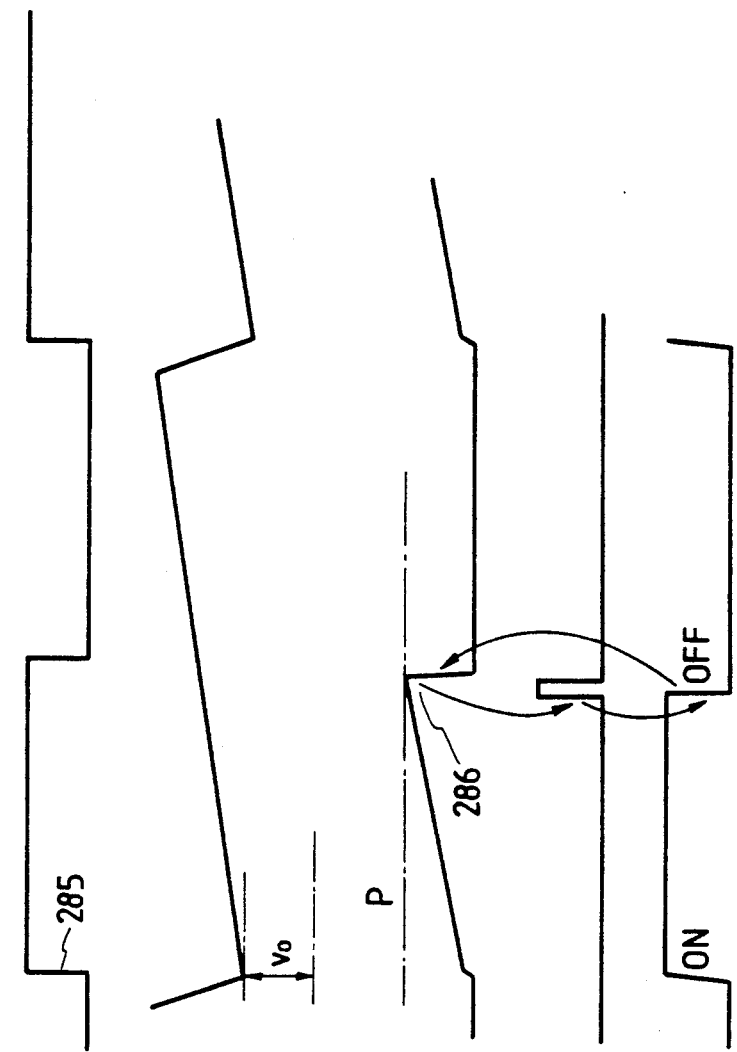

An operation in the normal operation mode will be described below with reference to the timing chart of FIG. 17. In FIG. 17, (A) represents the picture element clock 29, (B) represents the sawtooth wave 234, (C) represents the light voltage 235, (D) represents an output 237 from the comparator 208, and (E) represents a Q output 238 from the flip-flop 214. Since the TEST signal is at high level during the normal operation, the multiplexer 215 outputs $v_0$ described above, and $v_0$ is used as an offset of the sawtooth wave. When the sawtooth wave begins to rise, as shown in (B), at a timing 285 in (A) of FIG. 17, the flip-flop 214 is set at high level, as shown in (E), and a driving current flows through the semiconductor laser 1. Since the offset $v_0$ almost corresponds to the laser oscillation start current value, laser oscillation is started with almost no time delay as in (C) of FIG. 16. The value P obtained by converting picture element data into an analog value by the D/A converter 28 is also illustrated in (C) of FIG. 17. When the light voltage 235 reaches P at a timing 286 in FIG. 17, the comparator output 237 goes to high level, and the flip-flop output 238 is reset to low level, thus cutting off the driving current. As a result, the light voltage is cut off. With the above operation, an exposure amount corresponding to the picture element data P is obtained, and a picture element with gradation can be drawn. The temperature of the semiconductor laser tends to be increased due to self heat generation during the operation. Even when the temperature is increased during the operation, the light voltage shown in (C) of FIG. 17 is merely shifted to the right while maintaining its waveform. Therefore, an exposure amount within one picture element can be kept constant regardless of a variation in temperature. When $v_0$ is set to have a lower margin, a decrease in temperature can also be coped with. In any case, a time delay until laser emission can be minimized in correspondence with the present temperature.

The above-mentioned test operation can be performed periodically during recording, e.g., before an image for one page is drawn by the laser beam printer or can be performed every line or in units of several lines during a period in which the laser beam does not reach a photosensitive body.

In this embodiment, the test period is provided to find an oscillation start timing of the semiconductor laser. As a modification, drawing may be performed while adaptively finding an oscillation start timing of the semiconductor laser in units of picture elements during a normal operation without providing the test period.

Figure 18:
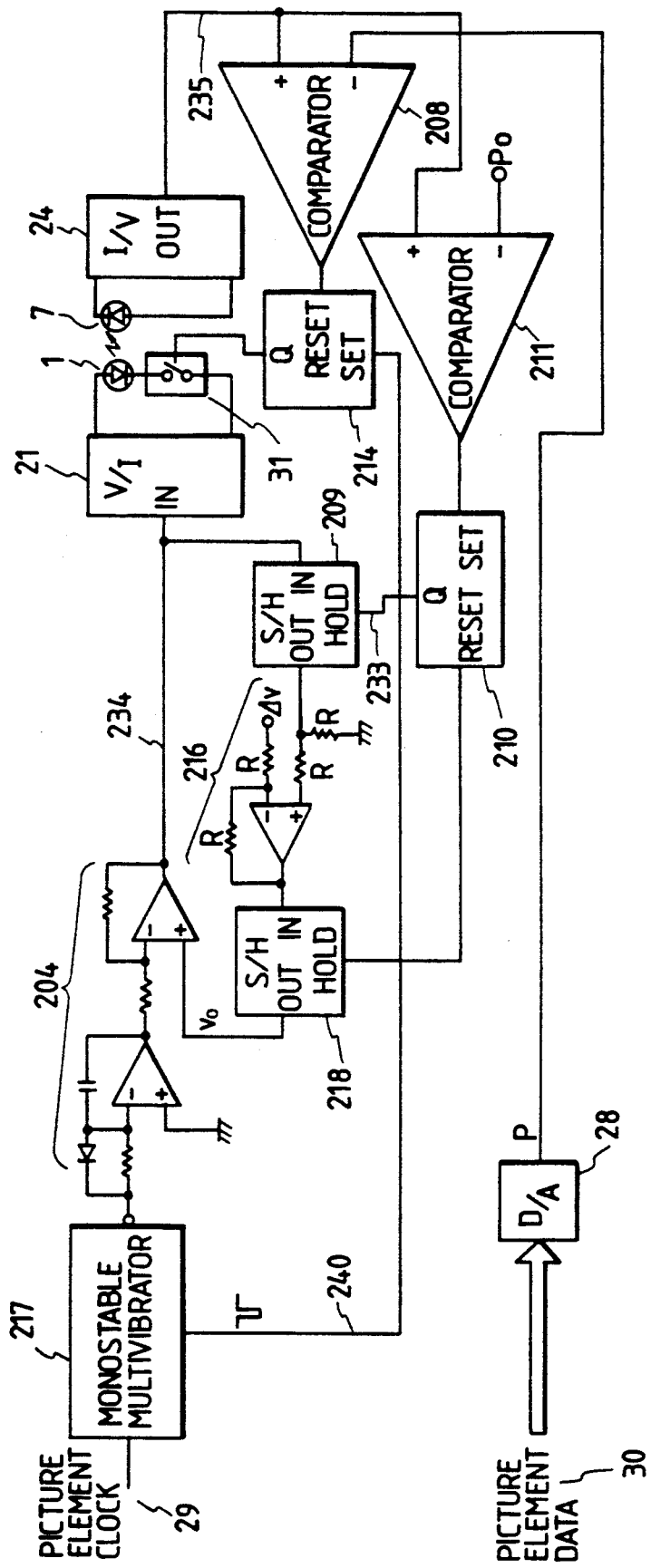
FIG. 18 is a block diagram showing a modification of the sixth embodiment.

FIG. 18 is a block diagram showing the modification. Since this circuit is similar to that shown in FIG. 15, only a difference will be explained below. A monostable multivibrator 217 is triggered in response to the leading edge of the picture element clock 29, and outputs a negative short pulse. An S/H circuit 218 receives the output from the subtracter 216, and outputs it as an offset of the sawtooth wave generator 204. A HOLD control terminal of the S/H circuit 218 is connected to the output from the monostable multivibrator 217. The S/H circuit 218 holds an output voltage during a high-level period of the HOLD control terminal. The output of the monostable multivibrator 217 is also connected to the RESET terminal of the flip-flop 210, and the SET terminal of the flip-flop 214.

Figure 19:
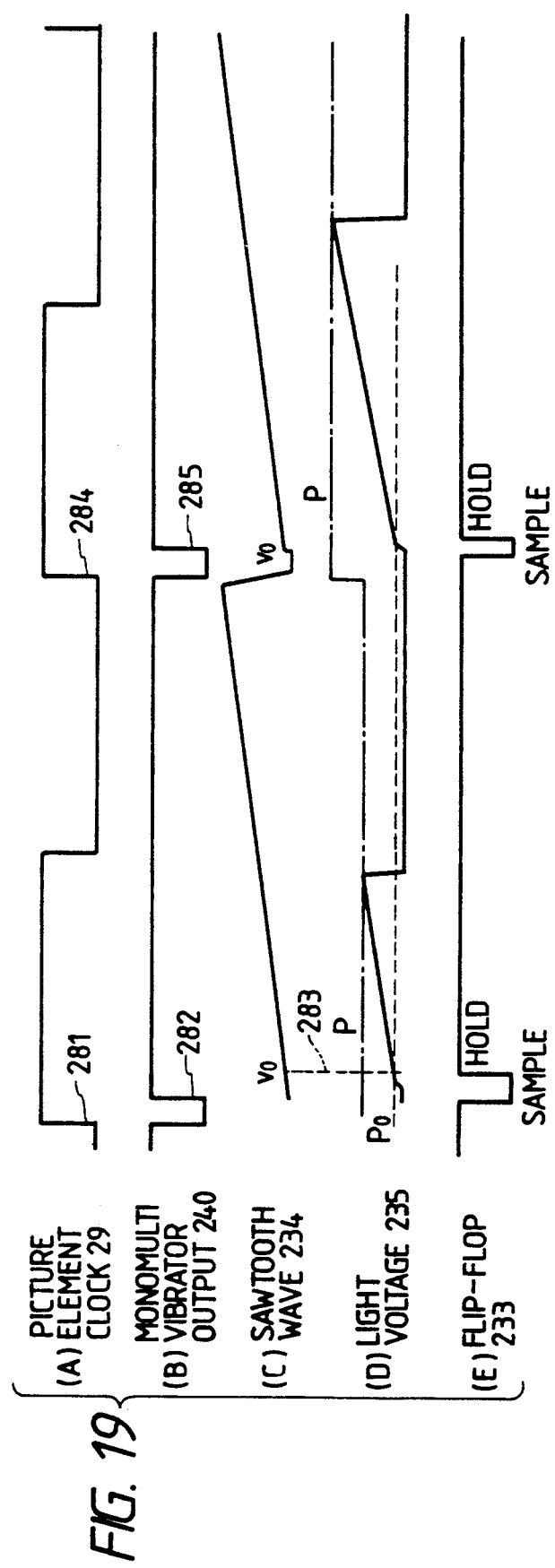
FIG. 19 is a timing chart for explaining an operation of the circuit shown in FIG. 18.

The operation will be described below with reference to the timing chart of FIG. 19. In FIG. 19, (A) represents the picture element clock 29, (B) represents an output 240 from the monostable multivibrator 217, (C) represents the sawtooth wave 234, (D) represents the light voltage 235, and (E) represents the output 233 from the flip-flop 210. When the picture element (A) goes to high level at a timing 281 in FIG. 19, the monostable multivibrator 240 outputs a negative pulse, as shown in (B) in FIG. 19. When the monostable multivibrator output (B) goes to high level at a timing 282, the sawtooth wave begins to be increased, as shown in (C). The flip-flop 210 is reset to low level at a timing 282, as shown in (E) of FIG. 19, and the S/H circuit 209 is set in a sample state. The minimum laser oscillation output $P_0$ and the output P of the D/A converter 233 are also illustrated with the light voltage (D), as in the above embodiment. When the light voltage 235 reaches $P_0$ at a timing 283 in (D) of FIG. 19, the output from the comparator 211 goes to high level, and the output 233 of the flip-flop 210 is set to high level, as shown in (E) of FIG. 19. Thus, the S/H circuit 209 is set in a hold state. A value obtained by subtracting an error due to a delay time of elements and a margin from the held voltage by the subtracter 216 like in the above embodiment corresponds to the voltage $v_0$ for initiating laser oscillation, and is held at the output of the subtracter 216. Thereafter, a mechanism for cutting off a light output when the light voltage 235 reaches the D/A output P is the same as that in the above embodiment, and a detailed description thereof will be omitted.

When the monostable multivibrator 240 outputs a negative pulse at a timing 284 corresponding to the leading edge of the picture element clock, the held subtracter output $v_0$ appears at the output of the S/H circuit 218 as an offset of the sawtooth wave generator 204. At the same time, the integrator 204 is immediately discharged to wait for the next sawtooth wave generation timing. When the monostable multivibrator output (B) in FIG. 19 goes to high level at a timing 285, the S/H circuit 218 is set in a hold state, and the offset of the integrator 204 is held. At the same time, the sawtooth wave 234 begins to be increased. The following operations are the same as those in the above embodiment.

Seventh Embodiment

In this embodiment, only a timing when a light output reaches, e.g., $P_0$ in FIG. 7(a), and modulation control is made during only a period corresponding to an exposure amount, thus performing substantially the same exposure as in the above embodiments. As a result, linearly in the entire light output range of a light detection circuit can be omitted to allow stable modulation.

Figure 26:
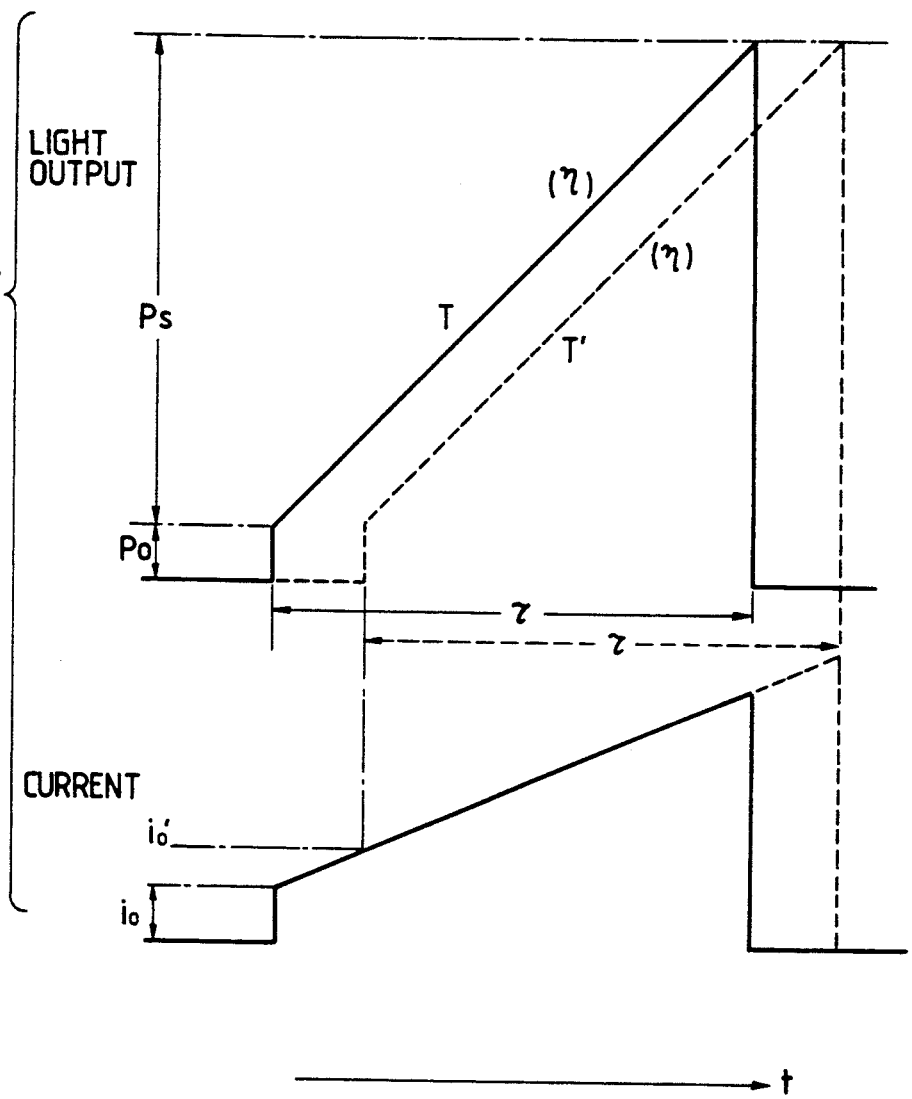
FIG. 26 is a graph for explaining the principle of the seventh embodiment.

FIG. 26 is a graph for explaining light output states obtained when temperatures are T and T' (T<T') and a driving current waveform of a semiconductor laser. In FIG. 26, a time $\tau$ from when a light output reaches $P_0$ until it reaches a light output $P_0 + P_s$ to be cut off must be left unchanged since an inclination $\eta$ of a light output almost remains the same temperatures T and T'. Therefore, when control is made to change the value $\tau$ in accordance with a desired exposure amount, substantially the same modulation as in the above methods can be performed.

Figure 23:
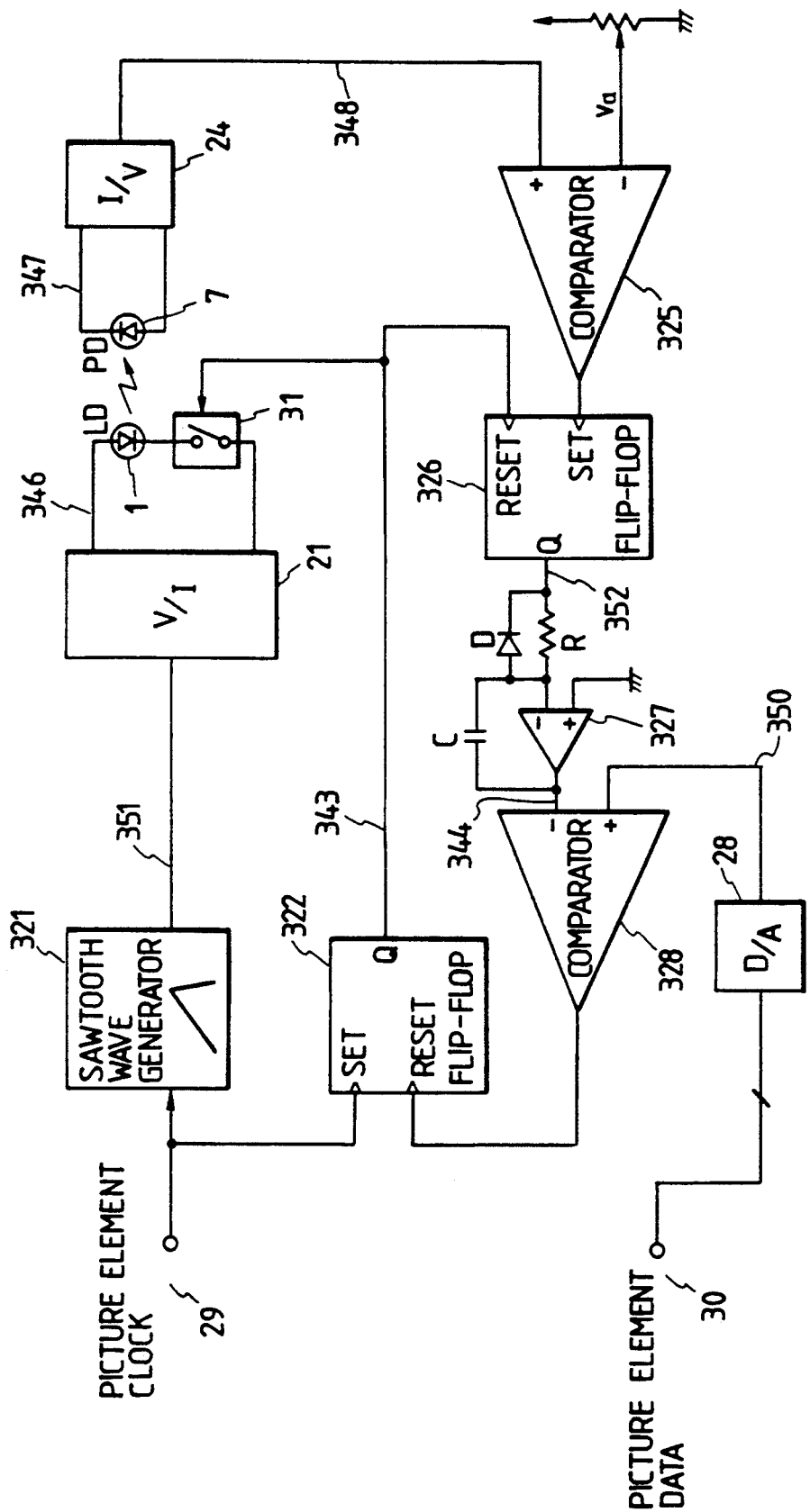
FIG. 23 is a block diagram showing the seventh embodiment.

The detailed arrangement of this embodiment will be described below. In FIG. 23, a sawtooth wave generator for generating a sawtooth wave voltage in synchronism with the leading edge of a picture element clock 29 is indicated by a block 321. A sawtooth wave voltage to be generated is denoted by 351. A flip-flop is indicated by a block 322, and its Q output goes to high level in response to the leading edge of its SET input. The Q output of the flip-flop 322 goes to low level in response to the leading edge of its RESET input. The output from this flip-flop is denoted by 343. A V/I converter 21 receives the sawtooth wave voltage 351 as its input. An output current if of the V/I converter 21 is denoted by 346. As a switch input of an analog switch 31, the flip-flop output 343 is connected. A light current $i_m$ detected by a photodiode 7 is denoted by 347. A voltage comparator 325 outputs high level when a voltage at its "+" input is higher than that at its "−" input; otherwise, it outputs low level. The "+" input of the comparator 325 is connected to a voltage value 348, and its "−" input is connected to a constant voltage $v_a$. A flip-flop is indicated by a block 326. A Q output from the flip-flop 326 goes to high level in response to the leading edge of its SET input, and goes to low level in response to the leading edge of its RESET input. The SET input of the flip-flop 326 is connected to the output of the comparator 325, and its RESET input is connected to the output 343 of the flip-flop 322. An output of the flip-flop 326 is denoted by 352. A network indicated by 327 represents an integrator, and performs integration by a charging operation according to a time constant of a CR during a high-level period of its input 352. An integral output in a negative potential direction is obtained at an output 344 of the integrator 327. When the input 352 of the integrator 327 goes to low level, the integrator 327 is immediately discharged upon an operation of a diode D, and its output 344 is set at zero potential. A voltage comparator 328 outputs high level when a voltage at its "+" input is higher than that at its "−" input; otherwise, it outputs low level. The "+" input of the voltage comparator 328 is connected to the integrator output 344, and its output is connected to the RESET input of the flip-flop 322. A D/A converter 28 converts picture element data 30 into a negative potential analog voltage 350. The analog voltage 350 is connected to the "+" input of the voltage comparator 328.

Figure 24:
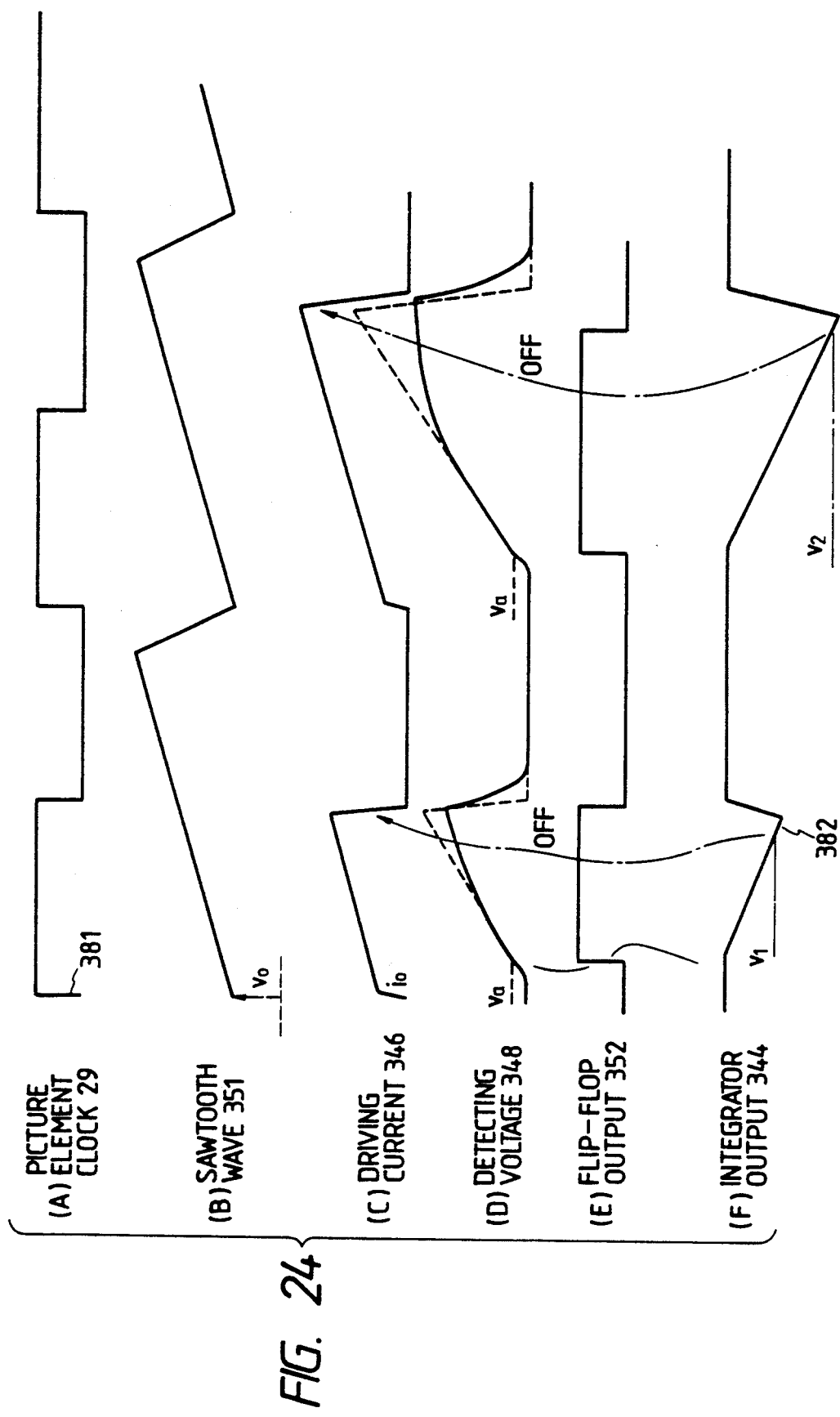
FIG. 24 is a timing chart for explaining an operation of the circuit shown in FIG. 23.

The operation of the above arrangement will be described below with reference to the timing chart of FIG. 24. In FIG. 24, (A) represents a picture element clock 29, (B) represents the sawtooth wave 351, (C) represents the driving current 346, (D) represents the detected voltage 348, (E) represents the flip-flop output 352, and (F) represents the integrator output 344. In FIG. 24, the picture element clock 29 goes to high level at a timing 381, and picture element data is obtained in synchronism with it. An analog conversion value of the picture element data is represented by $v_1$. The sawtooth wave 351 is generated at a timing 381, and at the same time, the flip-flop 322 is set, thus turning on the switch 31. The sawtooth wave 351 has an offset $v_0$, and its value corresponds to an offset value $i_0$ of the driving current. Upon an increase in driving current 346 in (C), the light output of the semiconductor laser 1 is also increased. A potential at which the detection voltage begins to be immediately increased in the waveform (D) of the detection voltage is represented by $v_a$, and $v_a$ in FIG. 23 is set to be this value. More specifically, when the detection voltage reaches $v_a$, this timing corresponds to the beginning of laser oscillation. The detection voltage 348 in (D) does not always faithfully represent the light output except for a level near $v_a$, and has a dull waveform as shown in (D) due to a stray capacitance of the photodiode 7 and response nonlinearity of the I/V converter 24. A broken waveform in (D) corresponds to an actual light output estimated from a driving current of the semiconductor laser. When the detection voltage 348 in (D) exceeds $v_a$, the output from the comparator 325 goes to high level, and the output 352 of the flip-flop 326 goes to high level, as shown in (E) of FIG. 24. The integrator output 344 in (F) is obtained by integrating (E), as shown in FIG. 24. More specifically, the integrator output (F) imitates an actual light output indicated by a broken line in (D). When the integrator output 344 in (F) is decreased below the picture element data value $v_1$, the output from the comparator 328 goes to high level, the flip-flop 322 is reset, and its output 343 goes to low level, thus turning off the switch 31. As a result, a current is cut off. At the same time, the flip-flop 326 is reset. Although the above operation is equivalent to an operation for cutting off a light output when the light output reaches a setup value while monitoring the light output, it does not monitor an accurate light output in practice.

As described above, as long as the slope efficiency η of the semiconductor laser ca be regarded as a permanent value under at least a use environment, an exposure amount for one picture element can remain the same in correspondence with $v_1$ even if a temperature variation occurs.

The light output of the semiconductor laser reaches a photosensitive member of the laser beam printer, as shown in FIG. 1, and the above-mentioned operation is repeated to form an image on the photosensitive member.

Figure 25:
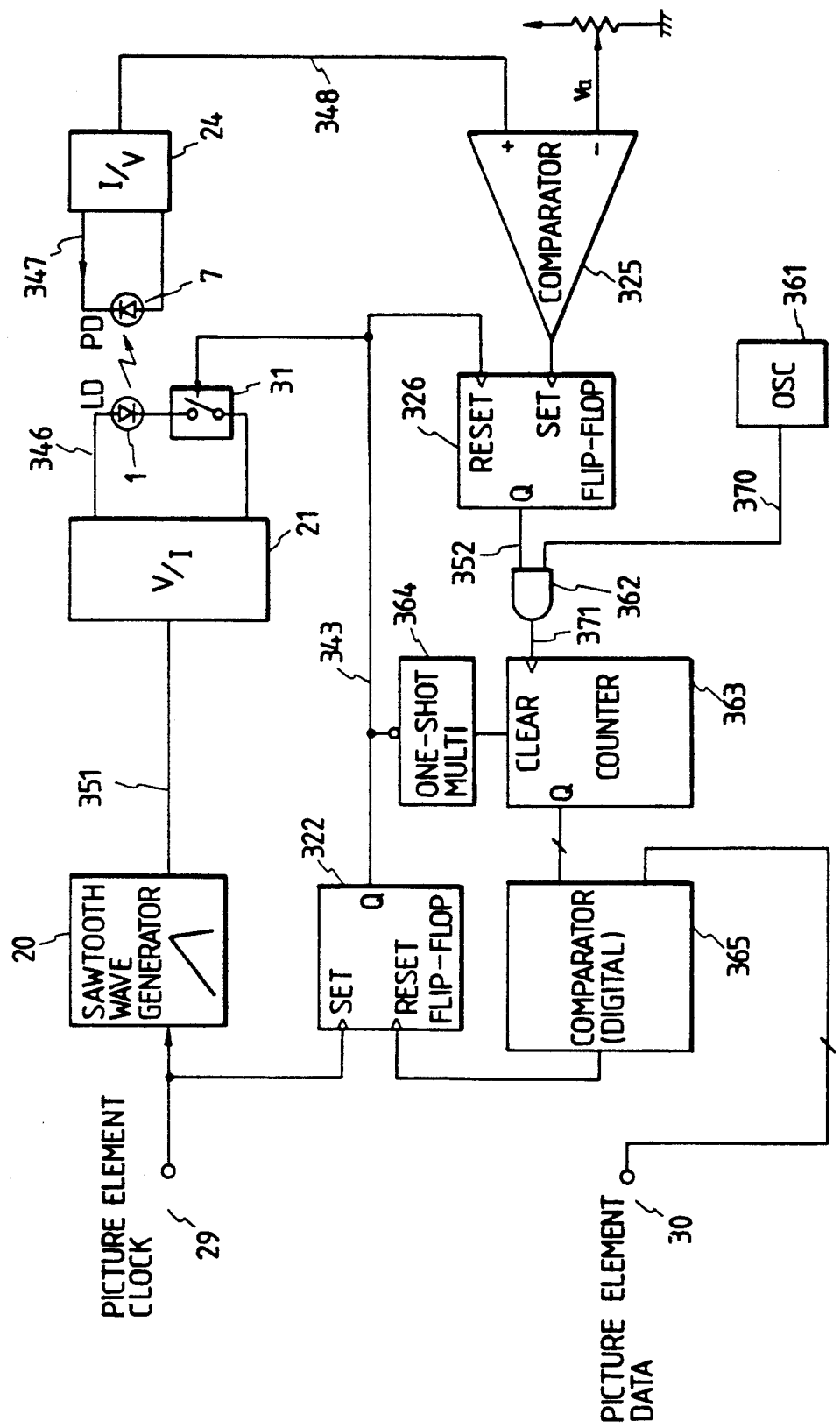
FIG. 25 is a block diagram showing a modification of the seventh embodiment.

FIG. 25 is a block diagram of a modification of this embodiment. In this modification, a lapse of time from the beginning of laser oscillation is digitally measured, thereby omitting the D/A converter in the first embodiment. Thus, since an analog circuit portion can be eliminated, a stable operation can be assured against external noise. Since the arrangement in FIG. 25 is substantially the same as that in FIG. 23, only a difference will be described below. In FIG. 25, an oscillator 361 generates a clock 370 for measuring a lapse of time from the beginning of laser oscillation. If a maximum value of picture element data is represented by n, the frequency of the clock 370 of this oscillator must be at least e times that of the picture element clock. An AND gate 362 receives the clock 370 at its one input, and the output 352 from the flip-flop 326 at the other input. The output from the AND gate 362 is denoted by 371. A counter 363 counts a clock 371 passing through the AND gate 362. A digital value comparator 365 receives the output from the counter 363 at its one input, and picture element data at the other input. When the two inputs are equal to each other, the comparator 365 outputs high level, and its output is connected to the RESET input of the flip-flop 322. A one-shot multivibrator 364 is triggered in response to the trailing edge of the output 343 of the flip-flop 322, and its output is connected to a CLEAR input for clearing the output of the counter 363 to zero, thereby clearing the counter.

Only a portion for measuring a lapse of time will be described below. When the semiconductor laser 1 performs laser oscillation and the detection voltage 348 exceeds $v_a$, the flip-flop 362 is set, the output 352 goes to high level, and the AND gate 362 is enabled. The counter 363 is cleared to zero since the one-shot multivibrator 364 is enabled in response to the trailing edge of the immediately preceding signal 343. The AND gate 362 is then enabled, and the counter 363 starts counting clocks when they appear at the output 371. When the count value is equal to the picture element data 30, the output from the comparator 365 goes to high level to reset the flip-flop 322, thus cutting off a current. At the same time, the flip-flop 326 is reset to prepare for an operation for the next picture element, and the output of the counter 363 is cleared to zero by the one-shot multivibrator 364.

Eighth Embodiment

A modulation method of expressing a picture element density includes various methods, e.g., strength modulation, pulse-width modulation, and modulation like in the above-mentioned embodiments. As another method, a so-called pulse numbers modulation method is conventionally known. In this method, a plurality of short rectangular pulses having the same light strength are generated in a picture element, and the density is varied by the number of pulses. However, in the pulse numbers modulation, it is very difficult in terms of speeds to control an exposure amount (integral value of a light output) of each pulse using an APC circuit. In this embodiment, each pulse used in pulse numbers modulation is shaped into a sawtooth wave or a triangular wave like in the above embodiments, and an exposure amount of each light pulse is kept constant regardless of a temperature, thus obtaining an accurate picture element density.

Figure 27:
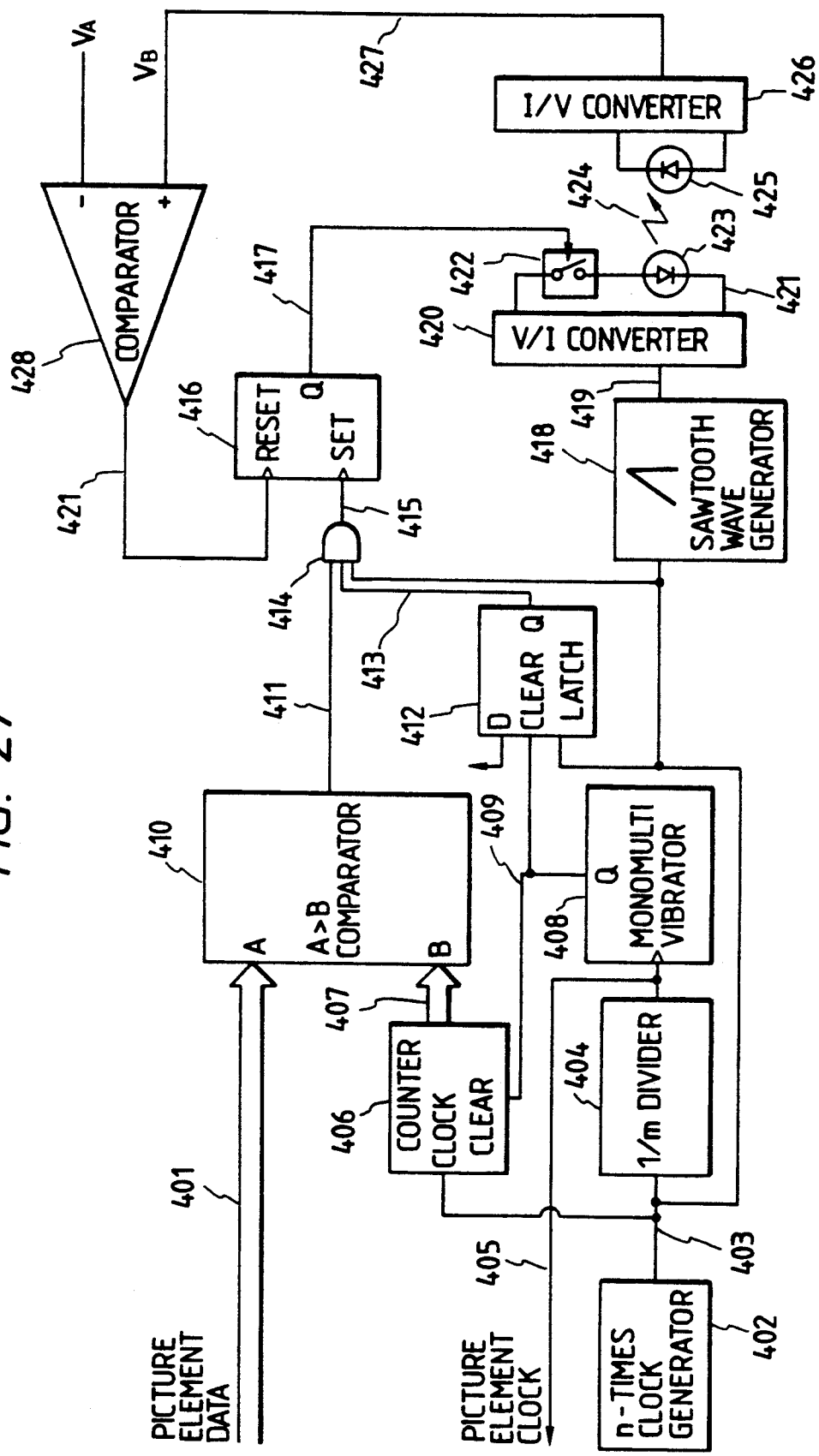
FIG. 27 is a block diagram showing the eighth embodiment.

A detailed arrangement of this embodiment will be described in detail below. FIG. 27 is a block diagram of a pulse numbers modulator for a semiconductor laser, to which the present invention is applied. Picture element data 401 is input from an external device, and is a digital value. A clock generator 402 generates a clock 403 having a frequency e times that of a picture element clock to equally divide a picture element into sections (n is an integer). A divider 404 converts the clock 403 having the n-times frequency into a clock having a 1/n frequency. The divider 404 can be realized by, e.g., a counter, and its output is used as a picture element clock 405. One picture element data is obtained in synchronism with the leading edge of the picture element clock 405. A counter 406 counts a n-times clock, and its count output is denoted by 407. A monostable multivibrator (monomultivibrator) 408 generates a clear signal 409, and outputs the clear signal 409 in synchronism with the leading edge of the picture element clock 405. A digital comparator 410 compares the picture element data 401 and the counter output 407. If the picture element data 401 is represented by A and the counter output is represented by B, when A > B, the comparator 410 outputs high level; otherwise, it outputs low level. The output from the digital comparator 410 is denoted by 411. A data latch 412 with a clear input signal latches high level in response to the leading edge of the n-times clock 403, and outputs high level to its Q output 413. The Q output 413 is cleared to low level in response to the clear signal 409. A 3-input AND gate 414 is connected to the digital comparator output 411 at the first input, the output 413 from the data latch 412 at the second input, and the n-times clock 403 at the third input, and its output is denoted by 415. A Q output of a bistable multivibrator 416 goes to high level in response to the leading edge of its Set input, and goes to low level in response to the leading edge of its Reset input. This Q output is denoted by 417. A sawtooth wave generator 418 outputs a sawtooth wave 419 in synchronism with the n-times clock 403. A V/I converter 420 generates a current 421 proportional to the sawtooth wave 419. An analog switch 422 receives the signal 417 as a switch open/close control pulse. When the input is at high level, the switch 422 is turned on; otherwise, it is turned off. A semiconductor laser 423 performs laser oscillation using the current 421 as a driving current, and generates a light output 424. A photodiode 425 receives the light output 424 from the semiconductor laser 423. An I/V converter 426 converts a light current output from the photodiode 425 into a voltage value, and outputs a voltage output 427. A voltage comparator 428 compares the voltage output 427 with a constant voltage $V_A$. Assume that the voltage output 427 is represented by $V_B$. When $V_B > V_A$, an output 429 of the comparator goes to high level; otherwise, it goes to low level. This output 429 is used as a Reset signal for the set-reset flip-flop 416.

Figure 28:
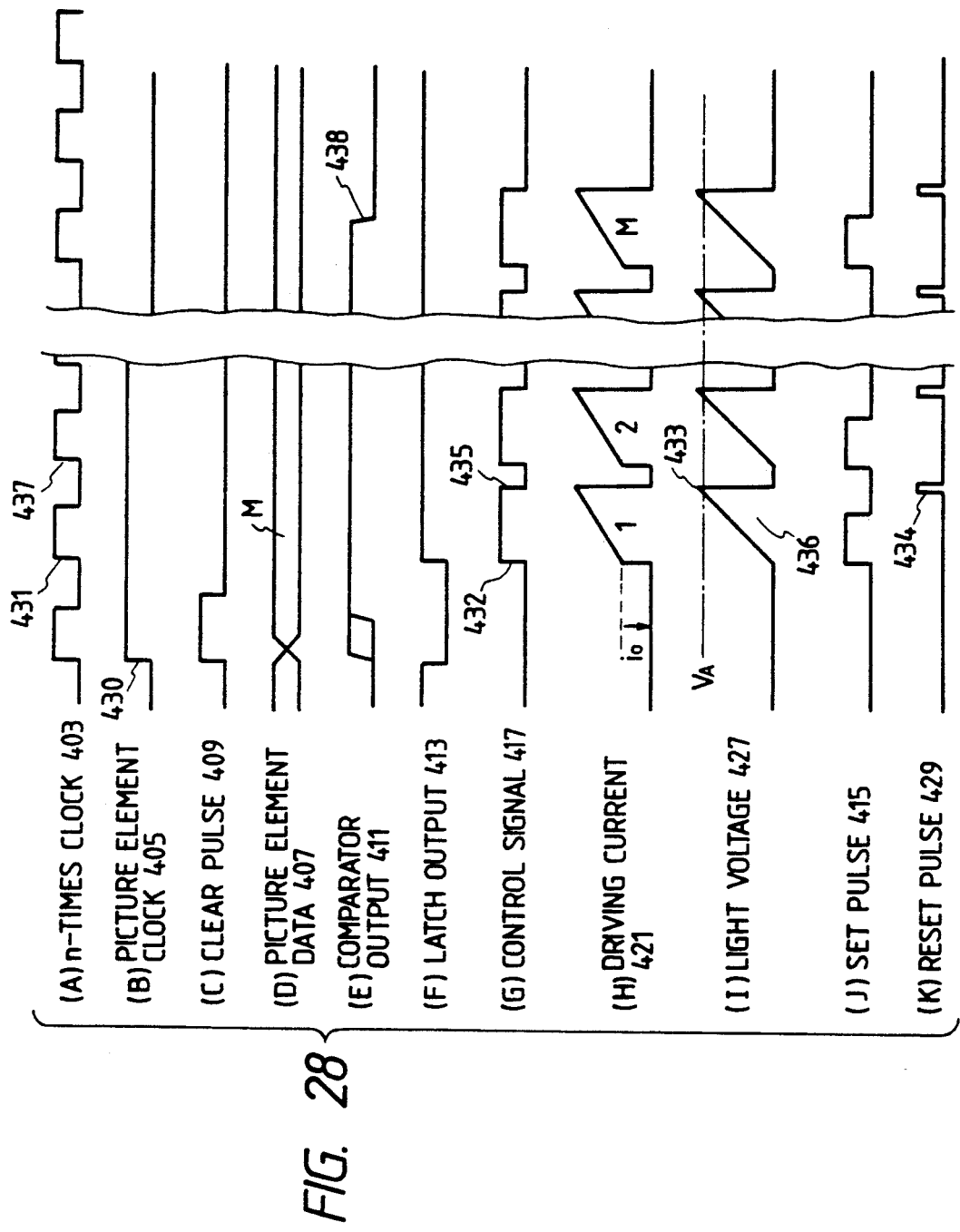
FIG. 28 is a timing chart for explaining an operation of the circuit shown in FIG. 27.

This operation will be described below with reference to the timing chart of FIG. 28. In FIG. 28, (A) represents the n-times clock 403, (B) represents the picture element clock 405, (C) represents the clear pulse 409, (D) represents the picture element data 407, (E) represents the output 411 from the digital comparator, (F) represents the output 413 from the latch 412, (G) represents the analog switch control signal 417 as the output from the set-reset flip-flop, (H) represents the driving current 421 input to the semiconductor laser, (I) represents the light voltage 414 obtained by converting the light current from the photodiode into a voltage value, (J) represents the Set pulse 415 input to the reset-set flip-flop, and (K) represents the Reset pulse 429. Assume that the picture element clock (B) is obtained by 1/n frequency-dividing the clock (A), and rises at a timing 430. At this timing, the clear pulse (C) is generated, as shown in FIG. 28, the counter is reset, and at the same time, the latch output (F) is cleared to low level. At the timing 430, the picture element data (D) is input. The picture element data value is represented by M. The comparator output (E) is obtained by comparing the picture element data with an initial value 0 of the enabled counter. If M>0, the comparator output goes to high level; if M=0, it goes to low level.

At a timing corresponding to a leading edge 431 of the n-times clock, the latch output (F) goes to high level. Thus, the AND gate 414 is enabled, and outputs the n-times pulse as the Set pulse, as shown in (J). In response to the leading edge of the Set pulse, the control signal (G) goes to high level at a timing 432. The analog switch 422 is turned on accordingly, and a current proportional to a sawtooth wave shown in (H) flows through the semiconductor laser. In (H), the sawtooth wave current flows from an initial current $i_0$ to accelerate laser oscillation. The initial current $i_0$ is set to be lower than a current for initiating laser oscillation by adjusting an offset of the sawtooth wave voltage 419. The waveform (I) is obtained by converting the light current of the photodiode 425 into a voltage, and is compared with $V_A$ by the comparator 428. The output from the comparator 428 goes to high level, as denoted by 434, at a timing 433. The set-reset flip-flop 416 is reset at the leading edge of the comparator output, the control signal (G) goes to low level at a timing 435, and the driving current (H) is cut off. With this operation, the sawtooth wave light output 436 is obtained. As described above, an integral value of the light output, i.e., an exposure amount is almost left unchanged regardless of a temperature variation. The same operation is similarly repeated from a timing 437. Finally, at a timing 438, the output value of the counter 406 reaches M, and the comparator output (E) goes to low level. Thus, the Set pulse for the bistable multivibrator 416 is stopped, and the light output is interrupted. At this time, M sawtooth light outputs have been output. Therefore, an exposure amount of one picture element becomes M times an integral value of one sawtooth light output. M can be varied within a range of $0 \leq M \leq n-1$, and one picture element can be halftone-modulated.

In the above description, the driving current is cut off using the analog switch, thereby controlling a light amount. As a modification, a control voltage waveform may be controlled to control a light amount. When the control voltage waveform itself is controlled, a light output waveform is not limited to a sawtooth waveform, but various light output waveforms such as a triangular wave can be obtained. In this modification, a triangular wave having equal rise and fall inclinations of a driving current will be exemplified below.

Figure 29:
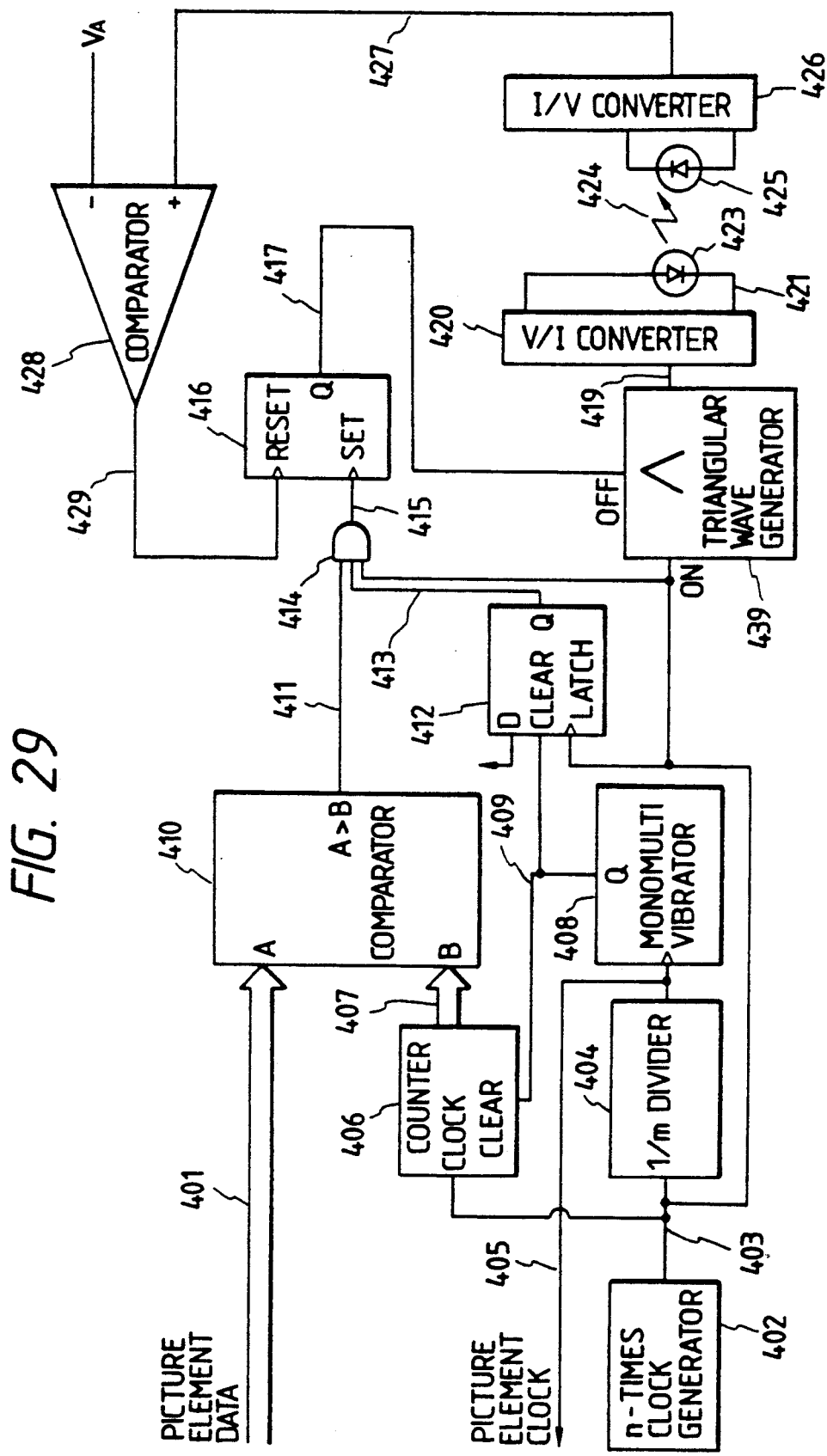
FIG. 29 is a block diagram showing a modification of the eighth embodiment.

FIG. 29 is a block diagram of this modification. FIG. 29 shows substantially the same arrangement as that in FIG. 27 described above, and the operation is also substantially the same. Therefore, a description of the same portion will be omitted. A difference is that a triangular wave generator 439 is used and the analog switch is omitted from FIG. 29. The triangular wave generator 439 has two input terminals (ON and OFF), and one triangular wave generation output terminal. When both the ON and OFF inputs are high level, the triangular wave generator outputs a linearly increasing voltage, and when one of the two inputs goes to low level, the generator outputs a linearly decreasing voltage. In FIG. 29, an n-times clock having a duty ratio of 50% is connected to the ON input, and an output from the reset-set flip-flop is connected to the OFF input.

Figure 30:
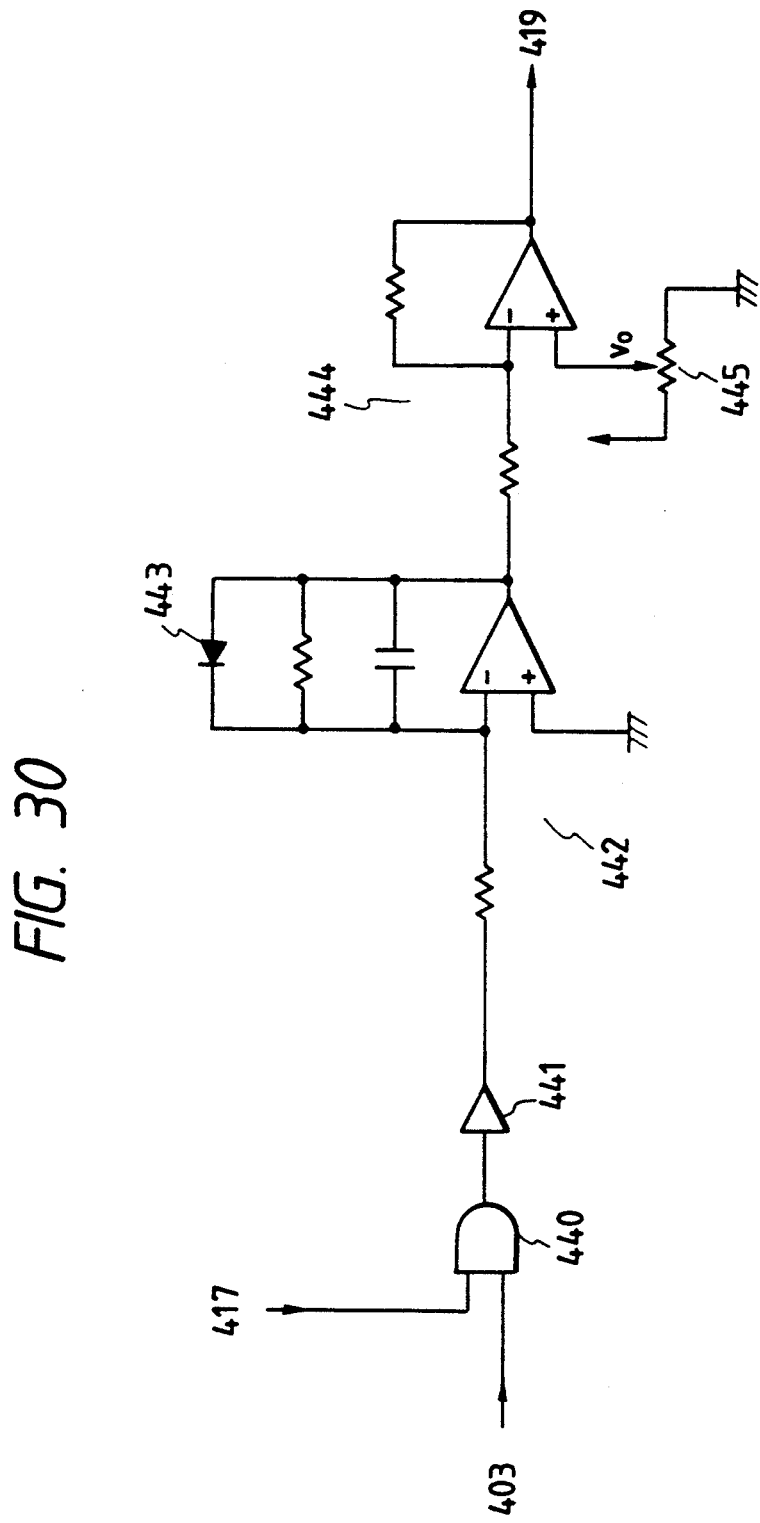
FIG. 30 is a circuit diagram of a triangular wave generator shown in FIG. 29.
Figure 31:
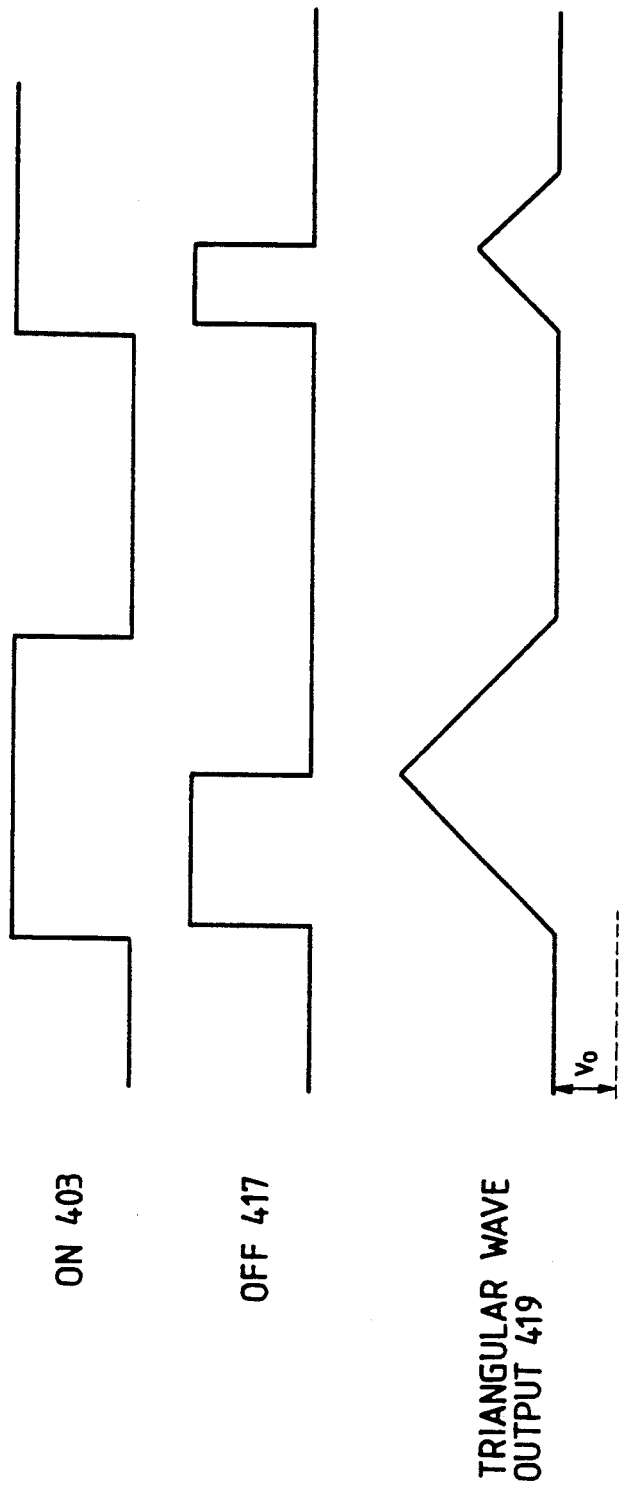
FIG. 31 is a timing chart of the circuit shown in FIG. 30.
Figure 32:
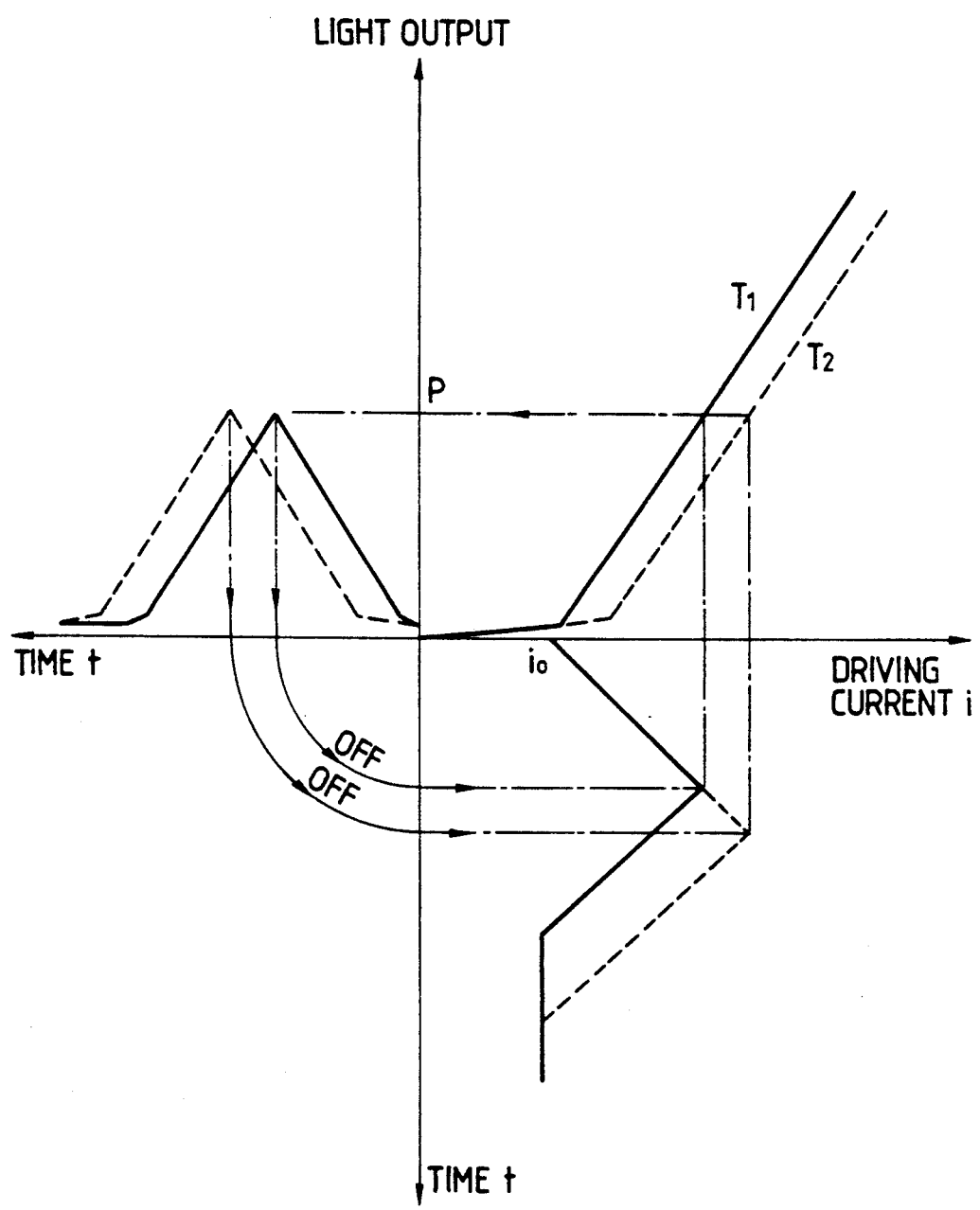
FIG. 32 is a graph for explaining the principle of an operation the circuit shown in FIG. 29.

FIG. 30 is a circuit diagram of the triangular wave generator 439 shown in FIG. 29. An ON input 403 and an OFF input 417 are input to an AND gate 440. This circuit also includes a buffer amplifier 441, an integrator 442, a diode 443 for inhibiting the integrator output from being set at a positive potential, an inverting or reversing amplifier 444, a variable resistor 445 for adding an offset, an output terminal 419 for outputting a triangular wave, and the like. As can be seen from FIG. 30, while the output from the AND gate 440 is kept at high level, charging is performed, and when it goes to low level, discharging is performed. An output from the integrator 442 is clamped by the diode 443, and is not set at a positive potential when it is discharged. FIG. 31 shows input/output timing relationship in the circuit shown in FIG. 30. An output from the integrator 443 is reversed by the inverting amplifier 444, and the reversed output is added with an offset $v_0$. The sum is then output to the terminal 419. FIG. 32 is four-quadrant graph when a light output is controlled according to a triangular wave. Quadrant I illustrates driving current-light output characteristics of a semiconductor laser. More specifically, two characteristic curves obtained when chip temperatures are $T_1$ and $T_2$ ($T_1 < T_2$) are illustrated. As slope efficiency of the semiconductor laser, one which is almost left unchanged even if a temperature varies is used. Quadrant IV shows a change in driving current over time. Quadrant II expresses a variation in light output over time as a combination of the characteristics shown in Quadrant I and the current shown in Quadrant IV.

As described in the previous embodiments, when a light output exceeds a predetermined value (P), the output from the reset-set flip-flop shown in FIG. 29 goes to low level, and the output from the triangular wave generator begins to fall. In Quadrant IV in FIG. 32, a current is linearly increased from an initial current $i_0$ to linearly increase a light output, as shown in Quadrant II. When the light output reaches P, the current is linearly decreased, thus generating a triangular light output like in Quadrant II. Broken lines in FIG. 32 represent a case of the temperature $T_2$. With the above operation, an almost congruent triangular light output can be obtained, as shown in FIG. 32, and exposure amount control which is not influenced by a variation in temperature can be performed. In this case, the initial current $i_0$ is set to be lower than a minimum current for causing the semiconductor laser to start laser oscillation. In practice, the initial current is adjusted by the offset voltage $v_0$ shown in FIG. 30.

In the above embodiment and its modification, a predetermined number of pulses are generated from the beginning of each picture element to perform pulse numbers modulation. As another modification, a predetermined number of pulses may be generated at an arbitrary position in one picture element to perform pulse numbers modulation. For example, pulses are uniformly distributed in one picture element, so that picture element shapes can be uniformed almost regardless of a picture element density.

Figure 33:
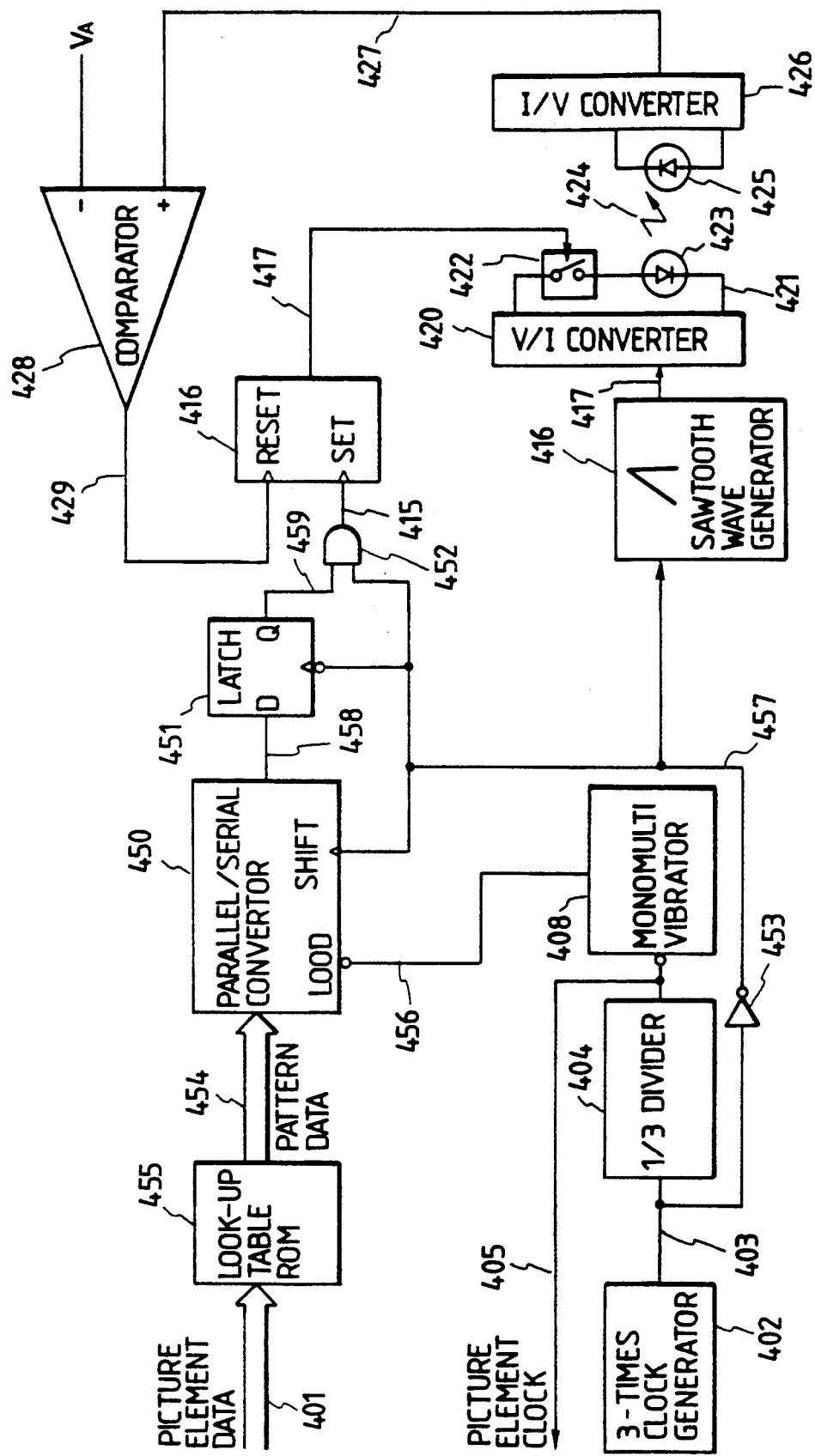
FIG. 33 is a block diagram showing another modification of the eighth embodiment.

FIG. 33 is a block diagram of another modification. In FIG. 33, picture element data 401 is input from an external device, and is a 2-bit (4-level) digital value. A clock generator 402 generates a clock 403 having a frequency three times that of a picture element clock for equally dividing one picture element into three sections. A divider 404 converts a 3-times frequency clock 403 into a ⅓-frequency clock. The divider 404 can be realized by, e.g., a counter, and its output is used as a picture element clock 405. The picture element data 401 can be obtained in synchronism with the leading edge of the picture element clock 405. A look-up table 455 converts the picture element data into pattern data so as to distribute it in a predetermined pattern as pulses in one picture element. The look-up table is realized by, e.g., a ROM. The pattern data is 3-bit data, and is denoted by 454. A parallel/serial converter 450 converts the pattern data 454 consisting of a plurality of bits into serial data 458 synchronous with the 3-times clock 403. A monostable multivibrator 408 generates a load pulse 456 for causing the parallel/serial converter 450 to load the pattern data 454 in synchronism with the picture element clock 405. An inverter 453 generates a reversed or inverted 3-times clock 457 obtained by inverting the 3-times clock. A data latch 451 latches serial data generated by the converter 450. The latch 451 latches serial data in response to the leading edge of the inverted clock, and outputs latched data 459. A set-reset flip-flop 416 is the same as that used in the above embodiments. Other portions are the same as those in the above embodiments, and a detailed description thereof will be omitted.

Figure 34:
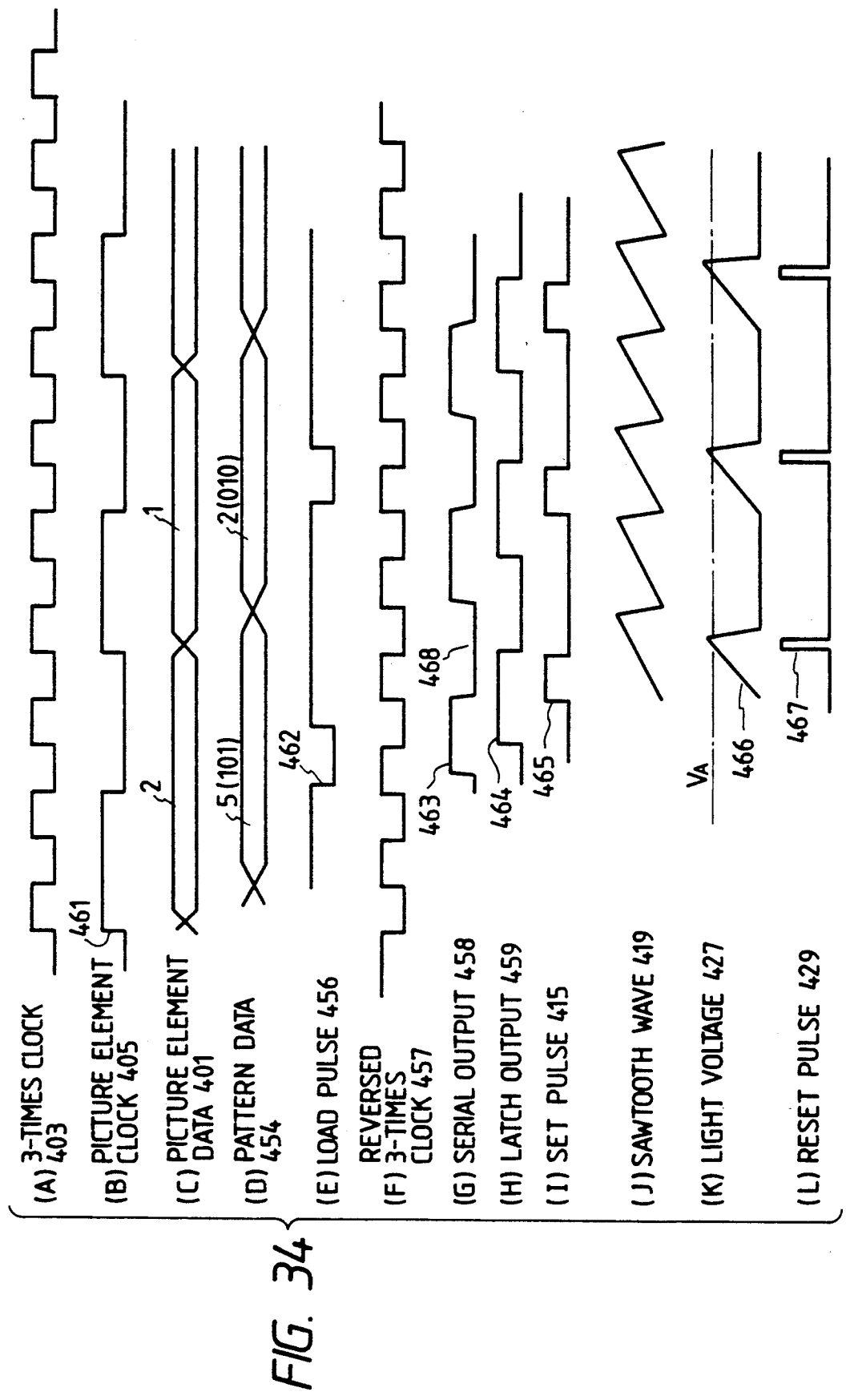
FIG. 34 is a timing chart for explaining an operation of the circuit shown in FIG. 33.

FIG. 34 is a timing chart showing an operation of FIG. 33. In FIG. 34, (A) represents the 3-times clock 403, (B) represents the picture element clock 405, (C) represents the picture element data 401, (D) represents the pattern data 454, (E) represents the load pulse 456, (F) represents the reversed or inverted 3-times clock 457, (G) represents the serial output 458, (H) represents the latched serial output 459, (I) represents the Set pulse 415, (J) represents the sawtooth wave 419, (K) represents the so-called light voltage 427 obtained by converting a light current into a voltage, and (L) represents the Reset pulse 429.

Assume that a value "2" is input as the picture element data 401 in synchronism with a leading edge 461 of the picture element clock in FIG. 34. Pattern data is expressed as a binary number, and "101" corresponds to "2".

In this modification, in order to uniformly distribute pulses in one picture element, the pattern data look-up table is set as follows:

| Input | Output Pattern Data (binary) |
|---|---|
| 0 | 000 |
| 1 | 010 |
| 2 | 101 |
| 3 | 111 |

In response to the next load pulse 462, pattern data "101" is loaded to the parallel/serial converter 450, and at the same time, first "1" data is output to the serial output as high-level data 463 in (G). The high-level data 463 is latched by the inverted 3-times clock (G) to generate latched high-level data 464. Then, a Set pulse 465 in (I) is generated, thus setting the reset-set flip-flop 416. As a result, a sawtooth current flows through the semiconductor laser. Thereafter, a sawtooth light voltage 466 in (K) is obtained, and when it exceeds $V_A$, a Reset pulse 467 is generated, thus resetting the reset-set flip-flop 416. Since the serial output of the next pattern data is at low level, no light pulse is output.

Upon repetition of the above-mentioned operations, light pulses are distributed in one picture element to perform pulse numbers modulation.

Since each pulse is driven with a sawtooth current, as described above, an exposure amount can be almost left unchanged with respect to a temperature variation. Note that the present invention is not limited to the sawtooth wave but may be applied to, e.g., a triangular wave.

The number of density levels of this method is not limited to four. Any other numbers of levels may be coped with by the same method.

3. Examination of Image Quality When the Present Invention is Applied to Laser Printer A case will be examined in more detail wherein the semiconductor laser is driven by a method in each of the above embodiments to expose and record an image on a recording medium such as a film with a laser beam.

The above-mentioned sawtooth or triangular, i.e., non-rectangular light output waveform appears in the main scanning direction of a light beam recording apparatus. In view of an ON time of a laser beam in the main scanning direction, a pulse width within one picture element is changed, and its pulse shape is not a rectangle but a sawtooth shape or triangle. In general, a laser beam defines an almost Gaussian distribution shape, and an exposure shape of one picture element in the main scanning direction is given by a convolution of a Gaussian distribution and a sawtooth shape or triangle. Therefore, an exposure shape becomes sharper than that modulated with a normal rectangular pulse width, and a resolution is apparently increased.

The major purpose of use of a light beam recording apparatus for drawing a halftone image like in the method of the present invention is to reproduce a sampled analog image (e.g., a medical image obtained by a CT scanner) onto a photosensitive member. In this case, spatial filtering for removing period components less than twice a picture element pitch ($\frac{1}{2} T_s$ or more) in a spatial period on a photosensitive member must be performed. In the case of the light beam recording apparatus, such removal can be attained by blurring of one picture element exposure shape by a laser beam and a spatial filtering effect of human eyes.

However, since a non-rectangular exposure pattern like the above-mentioned sawtooth or triangular exposure pattern has a resolution more than necessary in the main scanning direction, a period component less than twice the picture element pitch cannot be sufficiently removed. In particular, the period component of a picture element pitch as a carrier component of spatial modulation of an image tends to be conspicuous on an image. When the carrier component of spatial modulation is conspicuous, a jitter component of a picture element clock (small fluctuation of a picture element clock in each main scanning period) becomes further conspicuous.

Figure 35:
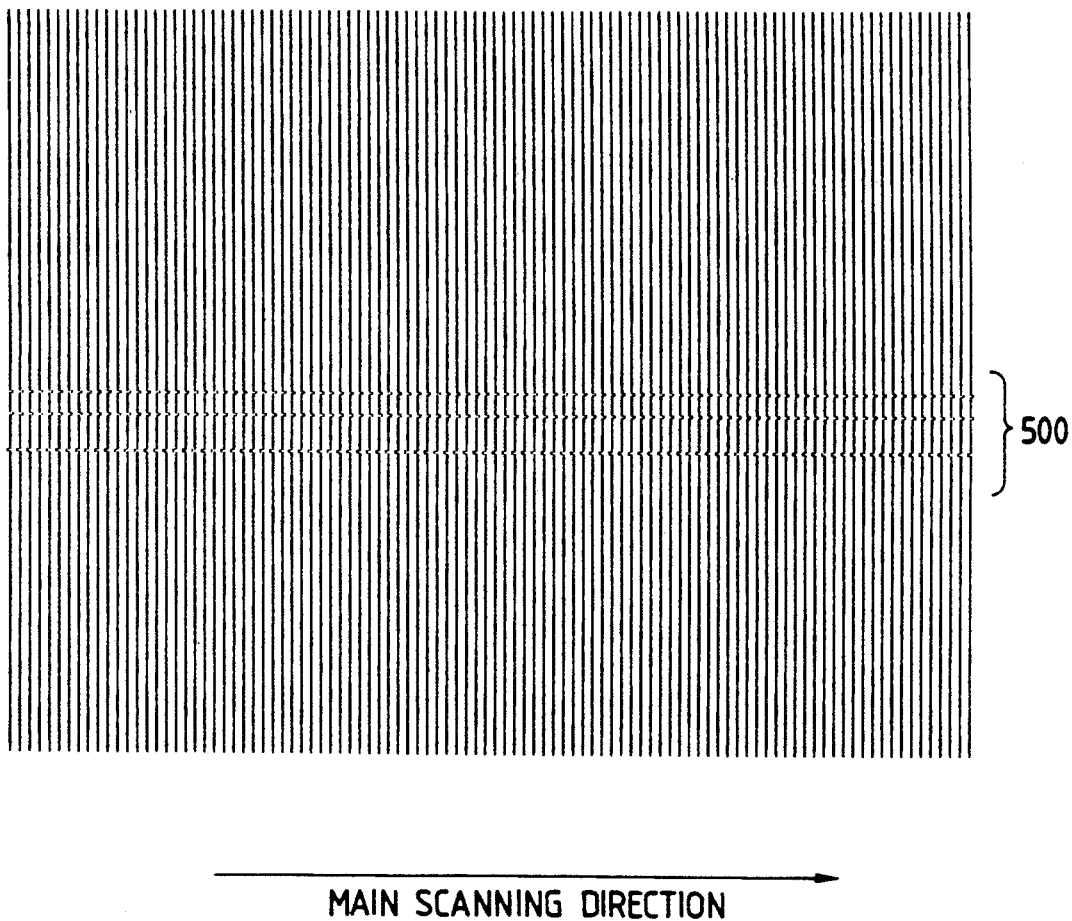
FIG. 35 is an explanatory view showing a case wherein a jitter occurs in an image.

FIG. 35 illustrates an image in which a carrier component in the main scanning direction is conspicuous. In FIG. 35, the main scanning direction is indicated by an arrow. A portion indicated by 500 in FIG. 35 includes a line whose main scanning start position is offset by $\frac{1}{2}$ a picture element. As can be recognized from FIG. 35, a line whose main scanning start position is slightly offset strongly remains as a lateral line. This is caused by a strongly conspicuous carrier component. A jitter component of a picture element clock depends on machining precision of a mirror used in main scanning and precision of laser beam position detection, and it is difficult to perfectly remove the jitter component, resulting in high cost. A jitter component of several tens of μm appears on a photosensitive material with intermediate precision. For this reason, some improvements are desired to suppress a conspicuous carrier component, and to improve image quality of a halftone image on a photosensitive material.

Thus, in the apparatus shown in FIG. 1, a spot size in the main scanning direction is increased to be larger than a picture element pitch and to suppress a carrier component, thus solving this problem. The present inventor found that particularly good results could be obtained within a range of 1.5 to 1.75 times a picture element pitch.

Since the sawtooth or triangular exposure pattern is sharp, even if the spot size in the main scanning direction is increased to be larger than the picture element pitch, reproducibility will not be impaired, and the carrier component can be satisfactorily suppressed. As a result, a clock jitter component can be prevented from appearing on an image.

Note that the spot size means a diameter ($d_1/e^2$) of a portion having a strength $1/e^2$ central strength of a spot. In the following description, the "spot size" means a spot size in the main scanning direction, and a "picture element size (pitch)" merely means a picture element size (pitch) in the main scanning direction.

Figure 38:
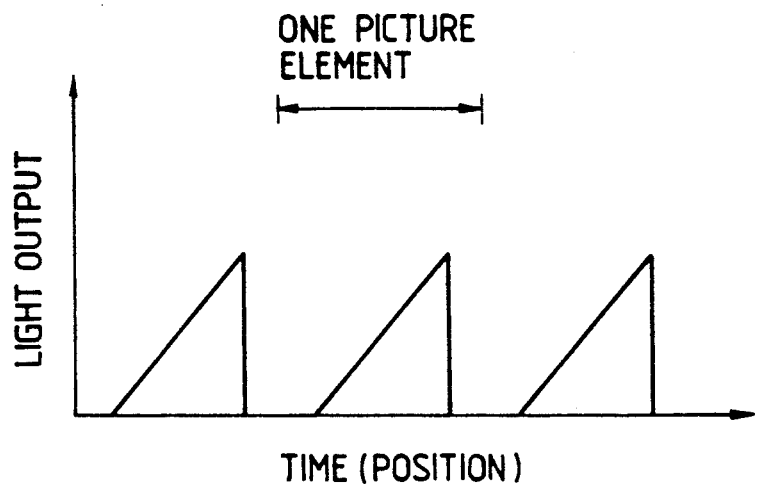
FIGS. 38 and 39 are graphs showing recording formats of a flat field image and a test chart image, respectively.

As a method of evaluating image quality of a halftone image, the above description exemplifies a method wherein a contrast at a picture element boundary in the main scanning direction is examined using an image having a uniform density, i.e., a so-called flat field image, which is recorded as shown in FIG. 38. As described above, when the spot size larger than the picture element size (in particular about 1.5 to 1.75 times) is used, a good flat field image in which a jitter component in the main scanning direction is not conspicuous can be obtained.

Figure 39:
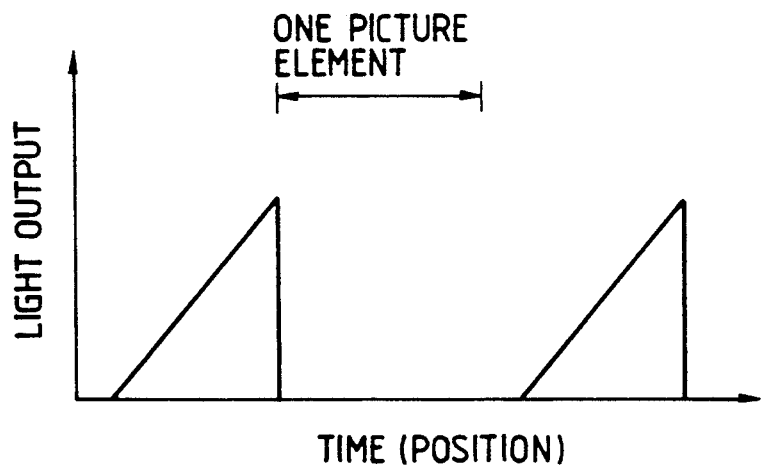

In contrast to this, as another method of evaluating image quality of a halftone image, an image in which maximum- and minimum-density patterns alternately appear in units of pixels, i.e., a so-called test chart image, as shown in FIG. 39, will be examined below. In this case, a good image having a high resolution can be determined as the test chart has a higher contrast. A contrast $C_T$ is defined by:

$$C_T = \frac{D_{TMax} - D_{TMin}}{D_{TMax} + D_{TMin}}$$

where $D_{TMax}$ is the maximum density in the test chart image, and $D_{TMin}$ is its minimum density.

Figure 36:
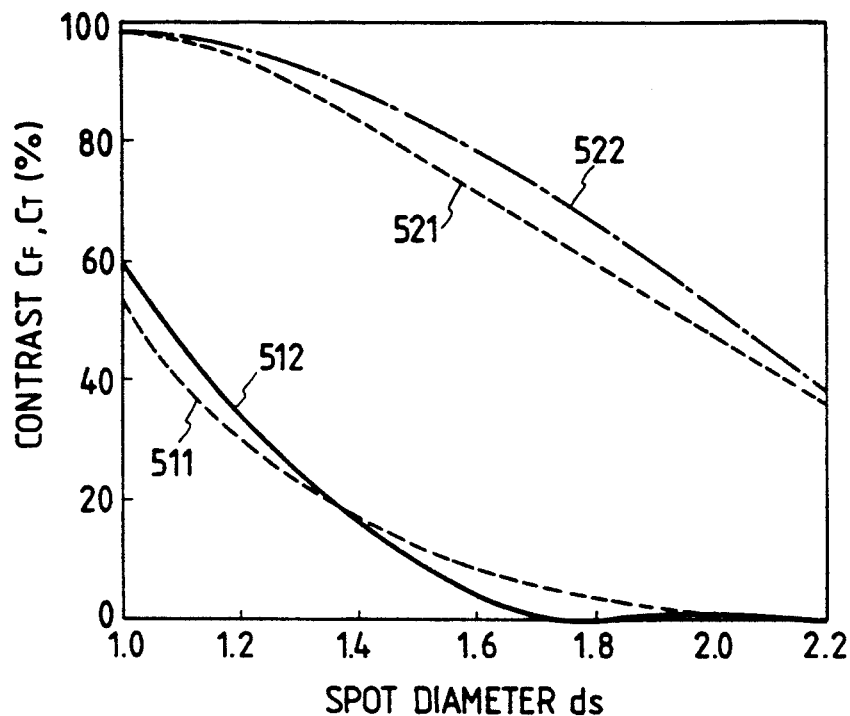
FIG. 36 is a graph showing the relationship between a spot size and a contrast.

FIG. 36 shows the relationship between a spot size $d_s$ and the contrast $C_T$ when a Gaussian beam is used as a laser spot, and a sawtooth wave is used as a light output of a semiconductor laser. This relationship is obtained by a convolution of the Gaussian beam and the sawtooth wave. In the sawtooth wave, maximum- and minimum-density picture elements alternately appear, as shown in FIG. 39. As can be apparent from FIG. 36, as the spot size $d_s$ is increased, the contrast $C_T$ is decreased. In particular, since $C_T \leq 50\%$ in a region of $d_s \geq 2.0$, a test chart image having a low resolution and poor sharpness is obtained.

As can be understood from the above description, the spot size suffers from an antinomic relationship between the flat field image and the test chart image, and it is not easy to select the spot size satisfying both the conditions.

One cause is that a laser beam is generally a Gaussian beam. The Gaussian beam can be easily obtained by a laser, and its distribution is left unchanged after the beam is converted by a lens. In addition, the Gaussian beam is effective to form a small spot. However, the Gaussian beam is not always best suitable for a spot of a scanning printer. In particular, since the Gaussian beam has a widely extended skirt portion, it tends to protrude from a picture element region, thus posing a major cause for impairing a contrast of the test chart image. In addition, in a flat field image, since a strength of an overlapping portion with a neighboring picture element is high, the overlapping portion is overemphasized, and a boundary between picture elements becomes conspicuous. As a result, the flat field image may often become an undesired image in which a jitter component and a boundary between picture elements are conspicuous.

In FIG. 1, as described above, an optical system is designed so that the spot size in the main scanning direction on the recording medium 12 is larger than the picture element pitch, and the aperture stop 3 for restricting the diameter of a laser beam oscillated from the semiconductor laser 1 is arranged along an optical path to control a strength distribution of a spot on the photosensitive member surface, thereby satisfying both the flat field image and the test chart image.

Figure 37:
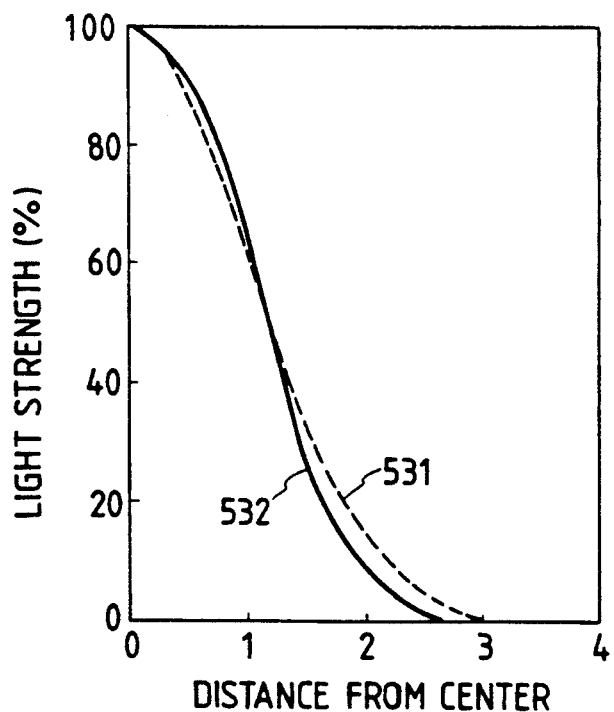
FIG. 37 is a graph showing a light strength distribution of a spot on a photosensitive member surface.

It is generally known that when a Gaussian beam is restricted by the aperture stop and then forms a spot, its distribution falls outside a Gaussian distribution. FIG. 37 shows this state. In FIG. 37, a broken curve 531 represents a Gaussian distribution, and a solid curve 532 represents a strength distribution of a spot formed by the Gaussian beam restricted by a circular aperture. In FIG. 37, the two curves are illustrated to have the same central strength and the same half-width. As can be seen from FIG. 37, the solid curve 532 has a smaller extension of a skirt portion than the curve 531, and at the same time, its head portion is extended, resulting in a steep slope portion. For this reason, when a spot formed by a Gaussian beam restricted by the aperture stop is applied to a scanning printer for driving a semiconductor laser with a sawtooth or triangular wave, a good image can be obtained.

FIG. 36 shows a state wherein a spot represented by the solid curve 532 shown in FIG. 37 is drawn by a sawtooth wave. A solid curve 512 represents a contrast $C_F$ of a flat field image, and an alternate long and short dashed curve 522 represents a contrast $C_T$ of a test chart image. As can be seen from FIG. 36, the contrast $C_F$ of the flat field image is lower than that of a broken curve 511 using a Gaussian beam in a region of $d_s \geq 1.4$. More specifically, when the same spot size is used, a good flat field image in which a jitter component in the main scanning direction and a boundary between picture elements are not conspicuous can be obtained as compared to that obtained using a Gaussian beam. The contrast $C_T$ of the test chart image is higher than a dotted curve 521 obtained by using a Gaussian beam in a region of $d_s \geq 1.0$. More specifically, when the same spot size is used, a good test chart image having a higher resolution in the main scanning direction than that using a Gaussian beam can be obtained.

In FIG. 1, the aperture stop 3 is one for cutting the laser beam emerging from the collimator lens 2 at a contour of TR=0.9. In this case, TR (cutting ratio) is defined by:

$$TR = d_{1/e^2}/d_a$$

where $d_{1/e^2}$ is the diameter of the Gaussian beam at a strength of $1/e^2$ and $d_a$ is the diameter of the aperture.

Since the laser beam emerging from the collimator lens 2 has an elliptic shape, the aperture stop also has an elliptic shape. When the Gaussian beam cut at TR=0.9 forms a spot, its strength distribution is almost as expressed by the solid curve 532 in FIG. 37. Thus, as compared to the Gaussian beam, the spot has a smaller extension of a skirt portion, a wider head portion, and a steep slope portion. For this reason, since an image is as a convolution of the strength distribution and the sawtooth wave, a good image in which a jitter component and a boundary between picture elements are not conspicuous can be obtained as a flat field image, and at the same time, a good image in which a contrast of a test chart is high and which has a high resolution can be obtained as a test chart image.

In this embodiment, the spot size $d_s$ was about 1.7, a picture element density was about 320 dpi, and a photographed silver chloride film was observed from a distance of distinct vision (25 cm).

Figure 40:
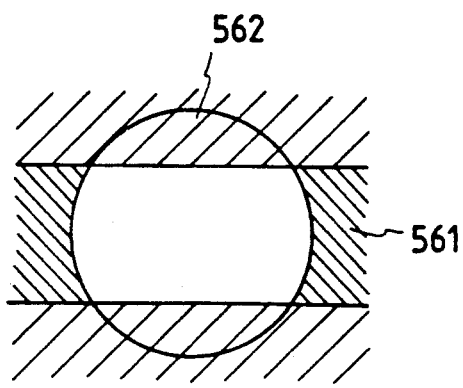
FIG. 40 shows a modification of an aperture stop.

As a modification, a combination of a circular aperture 561 and a slit 562 may be used as an aperture stop for cutting a Gaussian beam, as shown in FIG. 40. The Gaussian beam has an elliptic shape whose major axis is parallel to the slit 562, and TR is about 1.5 in the direction of major axis. TR in the direction of minor axis is about 1.5 if an interval of the slit is used for the diameter $d_a$ of the aperture. Note that the direction of major axis corresponds to the main scanning direction, and the direction of minor axis corresponds to the sub scanning direction.

Figure 41:
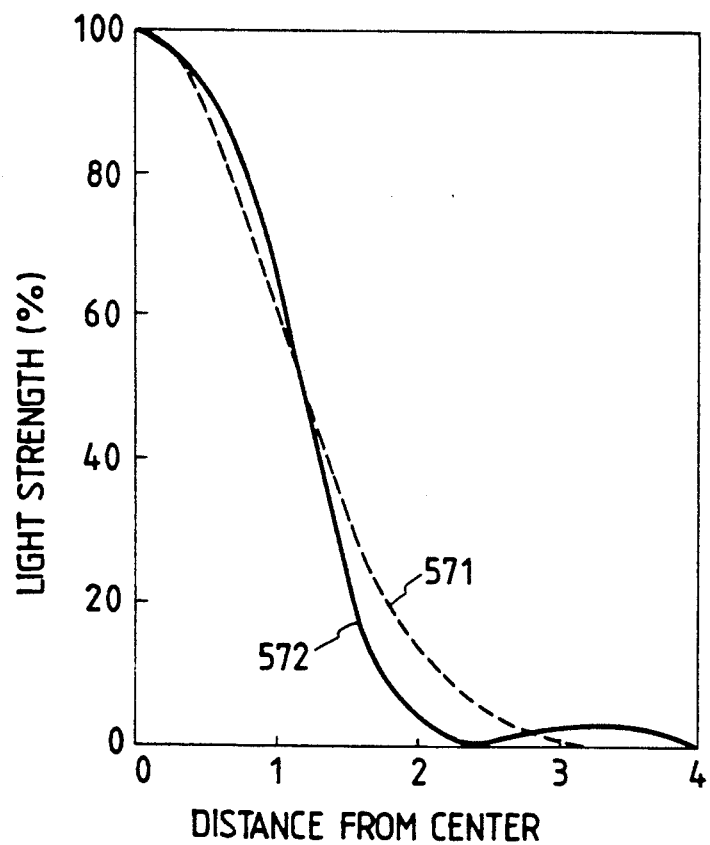
FIG. 41 is a graph showing a light strength distribution of a spot on a photosensitive member surface.

A strength distribution of a spot formed by a Gaussian beam cut at high TR largely falls outside a Gaussian distribution. FIG. 41 shows this state. A solid curve 572 represents a strength distribution of a spot formed by a Gaussian beam cut at high TR. As is apparent from FIG. 41, since the solid curve 572 has a wide head portion and a steep slope portion, this spot is suitable for that of a scanning printer. However, at a skirt portion, a side lobe is formed by cutting. When this spot is applied to a printer using a silver chloride film, the side lobe influences adjacent picture elements, and causes, e.g., a decrease in resolution. Thus, image quality is considerably adversely influenced.

As a result of examinations for various TRs, it was found that TR $\leq$ 1.6 was a limit for a silver chloride film having a maximum gamma value of about 2.5. It was demonstrated that image quality of a test chart image was impaired due to the influence of the side lobe, and a resolution was decreased for TR exceeding this limit. In contrast to this, it was also demonstrated that when TR<0.5, a strength distribution of a spot on a photosensitive member surface was almost equal to the Gaussian distribution, and there was no merit for providing an aperture stop.

In this embodiment, since TR is about 1.5, a strength distribution of a spot on a photosensitive member surface sufficiently falls outside the Gaussian distribution, and the influence of the side lobe against image quality can be ignored. Thus, a good image can be obtained.

As described above, a spot size in the main scanning direction is set to be larger than a picture element size, and a light beam is restricted using an aperture stop, so that a light strength distribution on a photosensitive member surface is approximate to an optimal shape as much as possible. Thus, good image quality of both a flat field image and a test chart image can be obtained. Note that the same effect can be obtained for any exposure waveforms in the modulation methods of the above embodiments.

What is claimed is:

1. A light beam modulation method, at least a part of the light beam being used for light exposure and at least a part of the light beam being used to provide a detection signal, said method comprising the steps of:

gradually intensifying light beam power in a predetermined sequence; and controlling the amount of the light exposure on the basis of the detection signal, said controlling step including the step of stopping the intensifying operation of the light beam power.

2. A method according to claim 1, further including a step of setting at least one setup value in association with the light output, and wherein in said intensifying step the light output is gradually increased until the light output reaches the setup value.

3. A method according to claim 2, further including a step of detecting that the light output of modulated light reaches the setup value.

4. A method according to claim 2, further comprising the step of substantially cutting off the light output when the light output reaches the setup value.

5. A method according to claim 2, further comprising the step of gradually decreasing the light output when the light output reaches the setup value.

6. A method according to claim 2, further comprising the step of maintaining the light output substantially constant when the light output reaches the setup value.

7. A method according to claim 2, further comprising the step of varying the setup value according to a desired light amount, and wherein the rate of gradual increase in light output is set to be constant regardless of the desired light amount.

8. A method according to claim 2, wherein the setup value is set to be a constant value regardless of a desired light amount, and further comprising the step of varying the rate of gradual increase in light output according to the desired light amount.

9. A method according to claim 2, further comprising the step of varying the setup value and the rate of gradual increase in light output according to a desired light amount, and wherein a light modulation time is set to be constant regardless of the desired light amount.

10. A method according to claim 1, wherein in said intensifying the light output is increased linearly or step wisely.

11. A method according to claim 1, wherein said intensifying step includes the step of supplying a driving current having a non-rectangular waveform including a waveform for causing the driving current to be gradually increased with a lapse of time, wherein the waveform is compensated so as to be the same regardless of a temperature, and wherein a driving operation is performed according to the waveform to gradually increase the light beam power with a lapse of time.

12. A method according to claim 11, wherein the constant waveform is determined on the basis of driving current versus light output characteristics at a minimum temperature in an operating temperature range.

13. A method according to claim 2, further including a step of providing a plurality of non-rectangular light outputs each increasing with a lapse of time.

14. A method according to claim 13, wherein the light outputs are constant regardless of the setup value, and wherein said method further includes a step of varying the number of light outputs according to the setup value.

15. A method according to claim 11, further including a step of detecting a driving current value at which the light output begins to be stabilized.

16. A method according to claim 1, further including a step of detecting a light output value at which the light output begins to be stabilized, and wherein said light intensifying step is executed only for a predetermined period of time after the light output value is detected.

17. A method according to claim 1, wherein said intensifying step is terminated when a value related to the detection signal becomes a predetermined relationship with a preset value.

18. A method according to claim 1, wherein said intensifying step is terminated upon expiration of a predetermined time period after a value related to the detection signal becomes a predetermined relationship with a preset value.

* * * * *

UNITED STATES PATENT AND TRADEMARK OFFICE
CERTIFICATE OF CORRECTION

PATENT NO. : 5,270,736
DATED : December 14, 1993
INVENTOR(S) : Hitoshi Inoue and Tatsuya Yamazaki It is certified that error appears in the above-identified patent and that said Letters Patent is hereby corrected as shown below:

On title page, item
    [75] Inventors: Change "Tasuya Yamazaki" to --Tatsuya Yamazaki--.

[56] References Cited FOREIGN PATENT DOCUMENTS, Change "282908 11/1978 Fed. Rep. of Germany" to --2820908 11/1978 Fed. Rep. of Germany--

Column 6, line 38, change "exposure" to --exposure amount--; and
    lines 54-55, delete "A light modulated and has similar characteristics."

Column 12, line 35, change "an" to --an inclination--;
    line 37, change "($\leq P_m$)" to --($<P_m$)--; and
    line 48, change "width $\eta_x$" to --width $\tau_x$--.

Column 16, line 36, change "graph 291," to --graph 291'--.

Column 20, line 16, change "same" to --same at the--; and
    line 33, change "if" to --$i_f$--.

UNITED STATES PATENT AND TRADEMARK OFFICE
CERTIFICATE OF CORRECTION

PATENT NO.  : 5,270,736
DATED       : December 14, 1993
INVENTOR(S) : Hitoshi Inoue and Tatsuya Yamazaki It is certified that error appears in the above-identified patent and that said Letters Patent is hereby corrected as shown below:

Column 22, line 1, change "e times" to --n times--;
line 59, change "e times" to --n times--; and
line 60, change "sections" to --n sections--.

Column 30, line 23, change "slit" to --slit 562--.

Column 31, line 12, change "lest" to --least--.

Column 32, lines 2-3, change "intensifying" to --intensifying step-- and change "step wisely" to --stepwisely--.

Signed and Sealed this

Fourteenth Day of June, 1994

Attest:

BRUCE LEHMAN

*Attesting Officer*  *Commissioner of Patents and Trademarks*